US012585043B2

(12) United States Patent
Wang et al.

(10) Patent No.: US 12,585,043 B2
(45) Date of Patent: Mar. 24, 2026

(54) SCALABLE NANOIMPRINT MANUFACTURING OF FUNCTIONAL MULTI-LAYER METASURFACE DEVICES

(71) Applicant: ARIZONA BOARD OF REGENTS ON BEHALF OF ARIZONA STATE UNIVERSITY, Scottsdale, AZ (US)

(72) Inventors: Chao Wang, Chandler, AZ (US); Yu Yao, Chandler, AZ (US); Shinhyuk Choi, Tempe, AZ (US); Jiawei Zuo, Tempe, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 145 days.

(21) Appl. No.: 18/654,918

(22) Filed: May 3, 2024

(65) Prior Publication Data

US 2024/0369738 A1     Nov. 7, 2024

Related U.S. Application Data

(60) Provisional application No. 63/500,458, filed on May 5, 2023.

(51) Int. Cl.
| | |
|---|---|
| *G02B 1/00* | (2006.01) |
| *G01J 4/02* | (2006.01) |
| *G03F 7/00* | (2006.01) |
| *G03F 9/00* | (2006.01) |
| *H10F 39/00* | (2025.01) |

(52) U.S. Cl.
CPC ................ *G02B 1/002* (2013.01); *G01J 4/02* (2013.01); *G03F 7/0002* (2013.01); *G03F 7/0035* (2013.01); *G03F 9/7042* (2013.01);

*G03F 9/7065* (2013.01); *G03F 9/7076* (2013.01); *G03F 9/7092* (2013.01); *G02B 2207/101* (2013.01); *H10F 39/806* (2025.01)

(58) Field of Classification Search
CPC ..... G01J 4/02; G02B 1/002; G02B 2207/101; G03F 7/0002; G03F 7/0035; G03F 9/7042; G03F 9/7065; G03F 9/7076; G03F 9/7092; H10F 39/806
See application file for complete search history.

(56) References Cited

U.S. PATENT DOCUMENTS

| | | | | |
|---|---|---|---|---|
| 11,978,752 B2 * | 5/2024 | Devlin | ............... | G02B 27/0944 |
| 2025/0044479 A1 * | 2/2025 | Han | ........................ | G02B 1/118 |

OTHER PUBLICATIONS

Zheng et al., All-dielectric trifunctional metasurface capable of independent amplitude and phase modulation, Laser & Photonics Reviews, 16(7), 2022, 10 pages.
Overvig et al., Dielectric metasurfaces for complete and independent control of the optical amplitude and phase, Light: Science & Applications, 8(1), 2019, 12 pages.

(Continued)

*Primary Examiner* — Kevin K Pyo
(74) *Attorney, Agent, or Firm* — MH2 Technology Law Group LLP

(57) ABSTRACT

A polarimetric metastructure is disclosed that includes a metasurface structure, one or more vertically coupled double-layer metallic gratings, and a dielectric spacer layer between the metasurface structure and the vertically coupled double-layer metallic gratings.

2 Claims, 43 Drawing Sheets

(56)    References Cited

OTHER PUBLICATIONS

Liu et al., Multifunctional metasurfaces enabled by simultaneous and independent control of phase and amplitude for orthogonal polarization states, Light: Science & Applications, 10(1), 2021, 11 pages.

Ren et al., Complex-amplitude metasurface-based orbital angular momentum holography in momentum space, Nature Nanotechnology, vol. 15, Nov. 2020, pp. 948-955.

Wu et al., Liquid crystal programmable metasurface for terahertz beam steering, Applied Physics Letters, 116, 131104, 2020, 6 pages.

Zuo et al., Chip-Integrated Metasurface Full-Stokes Polarimetric Imaging Sensor, Light:Science & Applications, 12 Article 218, 2023, 14 pages.

Chou et al., Nanoimprint lithography, Journal of Vacuum Science & Technology B Micoelectronics and Nanometer Structures Processing Measurement and Phenomena, 14(6), 1996, pp. 4129-4133.

Kim et al., Scalable manufacturing of high-index atomic layer-polymer hybrid metasurfaces for metaphotonics in the visible, Nature Materials 22, 2023, pp. 1-8.

Kim et al., Holographic metasurface gas sensors for instantaneous visual alarms, Science Advances, 7(15), 2021, 9 pages.

Takano et al., Wire-grid polarizer sheet in the terahertz region fabricated by nanoimprint technology, Optics letters, 36(14), 2011, pp. 2665-2667.

Chen et al., Enhancement of the light conversion efficiency of silicon solar cells by using nanoimprint anti-reflection layer, Solar Energy Materials & Solar Cells, 94, 2010, pp. 629-633.

Rinnerbauer et al., Nanoimprinted superlattice metallic photonic crystal as ultraselective solar absorber, Optica, 2 (8), 2015, pp. 743-746.

Lee et al., Metasurface eyepiece for augmented reality, Nature Communications, 9 Article 4562, 2018, 10 pages.

Pina-Hernandez et al., Nanoimprinted high-refractive index active photonic nanostructures based on quantum dots for visible light, Scientific Reports, 7, Article 17645, 2017, 8 pages.

Yoon et al., Single-step manufacturing of hierarchical dielectric metalens in the visible, Nature Communications, 2020. 11(1) Article 2268, 10 pages.

Joo et al., Metasurface-driven OLED displays beyond 10,000 pixels per inch, Science, 370, Oct. 23, 2020, pp. 459-463.

Dong et al., Bi-layer cross chiral structure with strong optical activity and negative refractive index, Optics Express, vol. 17 Issue 16, 2009 p. 14172-14179.

Zhu et al., Giant intrinsic chiro-optical activity in planar dielectric nanostructures, Light: Science & Applications, 7, 17158, 2018, 8 pages.

Guo, Nanoimprint lithography: methods and material requirements, Advanced Materials, 19(4), 2007, p. 495-513.

Lebib et al., Tri-layer systems for nanoimprint lithography with an improved process latitude, Microelectronic Engineering, 53, 2000, pp. 175-178.

Morton et al., Wafer-scale patterning of sub-40 nm diameter and high aspect ratio (> 50: 1) silicon pillar arrays by nanoimprint and etching, Nanotechnology, 19(34): 345301, 2008, 7 pages.

Hu et al., Fabrication of planar, layered nanoparticles using tri-layer resist templates, Nanotechnology, 22(18) 185302, 2011, 13 pages.

Groves et al., Maskless electron beam lithography: prospects, progress, and challenges, Microelectronic Engineering 61-61, 2002, pp. 285-293.

Gschrey et al., Resolution and alignment accuracy of low-temperature in situ electron beam lithography for nanophotonic device fabrication, Journal of Vacuum Science and Technology B: Nanotechnology and Microelectronics, 33(2): 021603, 2015, 6 pages.

Chen et al., Extended dual-grating alignment method for optical projection lithography, Applied Optics, vol. 49, No. 4, Feb. 2010, pp. 708-713.

Muhlberger et al., A Moire method for high accuracy alignment in nanoimprint lithography, Microelectronic Engineering, 84, 2007, pp. 925-927.

Li et al., Sub-20-nm Alignment in Nanoimprint Lithography Using Moire Fringe, Nano Letters, vol. 6, No. 11, 2006, pp. 2626-2629.

Shao et al., Digital moire fringe measurement method for alignment in imprint lithography, Optics & Laser Technology, 44, 2012, pp. 446-451.

Wang et al., Misalignment measurement with dual-frequency moire fringe in nanoimprint lithography, Optics Express, 28(5) 2020, p. 6755-6765.

Ray, Deep reactive ion etching of fused silica using a single-coated soft mask layer for bio-analytical applications, Journal of Micromechanics and Microengineering, 20, 097002, 2010, 10 pages.

Jung et al., Vapor-Phase Self-Assembled Monolayer for Improved Mole Release in Nanoimprint Lithography, Langmuir, 21, 2005, pp. 1158-1161.

Austin et al., Fabrication of 5 nm linewidth and 14 nm pitch features by nanoimprint lithography, Applied Physics Letters, 84, 2004, pp. 5299-5301.

Li et al., Demolding force dependence on mold surface modifications in UV nanoimprint lithography, Microelectronic Engineering, 236, 111430, 2021, 7 pages.

Faber et al., Impact of Oxygen Plasma Treatment on the Device Performance of Zinc Oxide Nanoparticle-Based Thin-Film Transistors, ACS Applied Materials & Interfaces, 4, 2012, pp. 1693-1696.

English et al., Improved contacts to MoS2 transistors by ultra-high vacuum metal deposition, Nano Letters, 16(6) 2016, p. 3824-3830.

Dulmaa et al., On the grain size-thickness correlation for thin films, Acta Materialia, 212, 116896, 2021, 8 pages.

Tyo et al., Target detection in optically scattering media by polarization-difference imaging, Applied Optics, vol. 35, No. 11, Apr. 10, 1996, pp. 1855-1870.

Garren et al., Full-Polarization Matched-Illumination for Target Detection and Identification, IDDD Transactions on Aerospace and Electronic Systems, vol. 38, No. 3, Jul. 2002, pp. 824-837.

Lu et al., Underwater optical image processing: a comprehensive review, 22(6), 2017, pp. 1204-1211.

Demos et al., Deep subsurface imaging in tissues using spectral and polarization filtering, Optics Express, 7(1), 2000, pp. 23-28.

Jacques et al., Imaging superficial tissues with polarized light, Lasers in surgery and medicine, 26(2), 2000, pp. 119-129.

He et al., Polarisation optics for biomedical and clinical applications: a review, Light: Science & Applications, 10:194, 2021, pp. 1-20.

Tyo et al., Review of passive imaging polarimetry for remote sensing applications, Applied optics, 45(22), 2006, pp. 5453-5469.

Duan et al., Review of polarization imaging for international military application, International Symposium on Photoelectronic Detection and Imaging 2013: Imaging Sensors and Applications, 2013, International Society for Optics and Photonics, 6 pages.

Kuhn et al., Imaging polarimetric observations of a new circumstellar disk system, The Astrophysical Journal Letters, 553(2), 2001, p. L189.

Pezzaniti et al., A division of aperture MWIR imaging polarimeter, Polarization Science and Remote Sensing II, 2005, International Society for Optics and Photonics, 12 pages.

Tu et al., Division of amplitude RGB full-Stokes camera using micro-polarizer arrays, Optics Express 33160, 25(26), 2017, pp. 33160-33175.

Vedel et al., Full Stokes polarization imaging camera, Polarization Science and Remote Sensing V, 2011, International Society for Optics and Photonics, 13 pages.

Gruev et al., CCD polarization imaging sensor with aluminum nanowire optical filters, Optics express, 18(18), 2010, pp. 19087-19094.

Wang et al., 30-nm-wide aluminum nanowire grid for ultrahigh contrast and transmittance polarizers made by UV-nanoimprint lighography, Applied Physics Letters, 89, 141105, 2006, 4 pages.

Wang et al., High-performance, large area, deep ultraviolet to infrared polarizers based on 40 nm line/78 nm space nanowire grids, Applied Physics Letters, 90, 061104, 2007, 4 pages.

(56) References Cited

OTHER PUBLICATIONS

Sony, Sony Polarsens 2022, Available from: https://www.sony-semicon.com/en/technology/industry/polarsens.html, 15 pages.

Myhre et al., Liquid crystal polymer full-stokes division of focal plane polarimeter, Optics express, 20(25),2012 pp. 27393-27409.

Hsu et al., Polarization microscope using a near infrared full-Stokes imaging polarimeter, Optics Express, 23(4), 2015, pp. 4357-4368.

Gruev et al., Dual-tier thin film polymer polarization imaging sensor, Optics Express, vol. 18 Issue 18, 2010, pp. 19292-19303.

Altaqui et al., Mantis shrimp-inspired organic photodetector for simultaneous hyperspectral and polarimetric imaging, Science Advances, vol. 7 Issue 10, 2021, 10 pages.

Tu et al., Division of focal plane red-green-blue full-Stokes imaging polarimeter, Applied Optics, 59(22), 2020, pp. G33-G40.

Intaravanne et al., Recent advances in optical metasurfaces for polarization detection and engineered polarization profiles, Nanophotonics, 9(5), 2020, pp. 1003-1014.

Rubin et al., Matrix Fourier optics enables a compact full-Stokes polarization camera, Science 365, 43, 2019, 9 pages.

Bai et al., Mid-Infrared Chip-Integrated Full-Stokes Polarimeter Array Based on Plasmonic Metasurfaces, 2022 Conference on Lasers and Electro-Optics (CLEO), IEEE, 2022, 2 pages.

Arbabi et al., Full-Stokes imaging polarimetry using dielectric metasurfaces, Acs Photonics, 2018. 5(8): p. 3132-3140.

Yang et al., Generalized Hartmann-Shack array of dielectric metalens sub-arrays for polarimetric beam profiling, Nature communications, 2018. 9(1): p. 1-7.

Wu et al., Visible Metasurfaces for On-Chip Polarimetry, ACS Photonics, 5, 2018, pp. 2568-2573.

Bai et al., Highly efficient anisotropic chiral plasmonic metamaterials for polarization conversion and detection, ACS Nano, 2021, 15(9): p. 14263-14274.

Lee et al., Ultracompact Broadband Plasmonic Polarimeter, Laser Photonics Review, 12, 1700297, 2018, 10 pages.

Mueller et al., Ultracompact metasurface in-line polarimeter, Optica, vol. 3 No. 1, pp. 42-47, 2016.

Jung et al., Polarimetry using graphene-integrated anisotropic metasurfaces, ACS Photonics, 5(11), 2018, pp. 4283-4288.

Afshinmanesh, et al., Measurement of the polarization state of light using an integrated plasmonic polarimeter, Nanophotonics, 1(2), 2012, pp. 125-129.

Li et al., Monolithic Full-Stokes Near-Infrared Polarimetry with Chiral Plasmonic Metasurface Integrated Graphene- Silicon Photodetector, ACS Nano, 14, 2020, pp. 16634-16642.

Ren et al., Full-Stokes Polarimetry for Visible Light Enabled by an All-Dielectric Metasurface, Advanced Photonics Research, Feb. 20, 2022, 8 pages.

Shah et al., An All-Dielectric Metasurface Polarimeter, ACS Photonics, 9(10), 2022, pp. 3245-3252.

Basiri et al., Nature-inspired chiral metasurfaces for circular polarization detection and full-Stokes polarimetric measurements, Light: Science and Applications, 8(1), 2019, pp. 1-11.

Andreou et al., Polarization imaging: principles and integrated polarimeters, IEEE Sensors Journal, 2(6), 2002, pp. 566-576.

Tokuda et al., Polarisation-analysing CMOS photosensor with monolithically embedded wire grid polariser, Electronics Letters, 45(4), 2009, pp. 228-230.

Zhao et al., Thin photo-patterned micropolarizer array for CMOS image sensors, IEEE Photonics Technology Letters, 21(12), 2009, pp. 805-807.

Gruev et al., Fabrication of a dual-tier thin film micropolarization array, Optics Express, 15(8), 2007, pp. 4994-5007.

Thorlabs, PAX1000VIS/M—Polarimeter, Available from: https://www.thorlabs.com/thorproduct.cfm?partnumber=PAX1000VIS/M, 2 pages, 2025.

Fan et al., Analysis of guided resonances in photonic crystal slabs, Physical Review B, vol. 65, 235112, 8 pages, 2002.

Wang et al., Guided-mode resonances in planar dielectric-layer diffraction gratings, J. Opt. Soc. Am. A, vol. 7, No. 8, Aug. 1990, pp. 1470-1474.

Wang et al., Theory and applications of guided-mode resonance filters, Applied Optics, vol. 32, No. 14, May 10, 1993, pp. 2606-2613.

Berry et al., Measurement of the Stokes parameters of light, Applied Optics, 16(12), 1977, pp. 3200-3205.

Ren et al., Sensor Modeling and Calibration Method Based on Extinction Ratio Error for Camera-Based Polarization Navigation Sensor, Sensors, 20(13), 2020, p. 3779.

Azzam, Instrument matrix of the four-detector photopolarimeter: physical meaning of its rows and cols. and constraints on its elements, Journal of the Optical Society of America A, 7(1), 1990, p. 87-91.

Xiong et al., Planar liquid crystal polarization optics for augmented reality and virtual reality: from fundamentals to applications, eLight, 1:3, 2021, 20 pages.

* cited by examiner

FIG. 1C                    FIG. 1D

Tri-layer deposition

Thermal NIL

SEE FIG. 2A-2

SEE FIG. 2A-3

Tri-layer RIE

SEE FIG. 2A-4

Cr liftoff

SiO₂ and a-Si etching

Si metasurface

Cleaning

UV resist deposition & UV-NIL

Al deposition

See FIG. 2C-5

Al

UV resist

Nanostructures

MESA

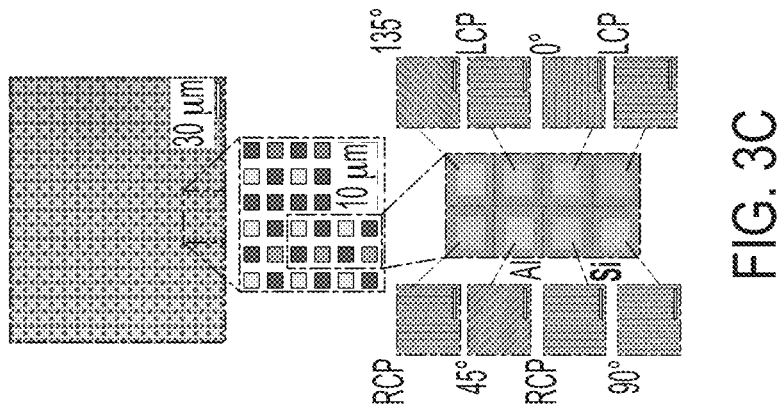
FIG. 3C
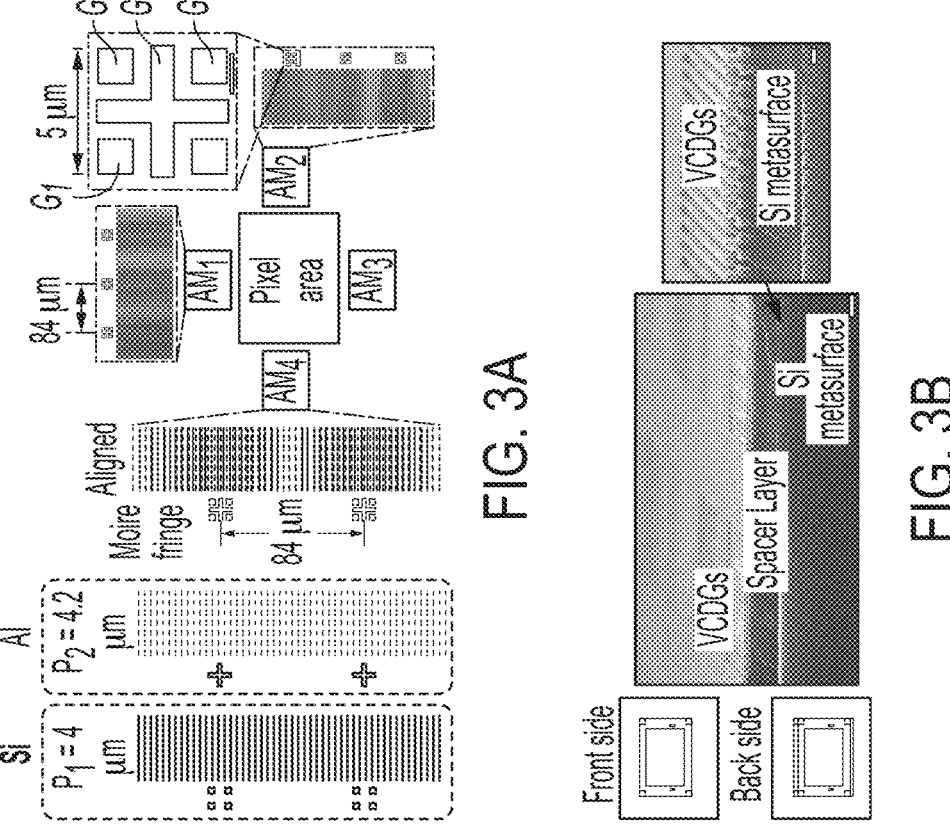
FIG. 3A
FIG. 3B

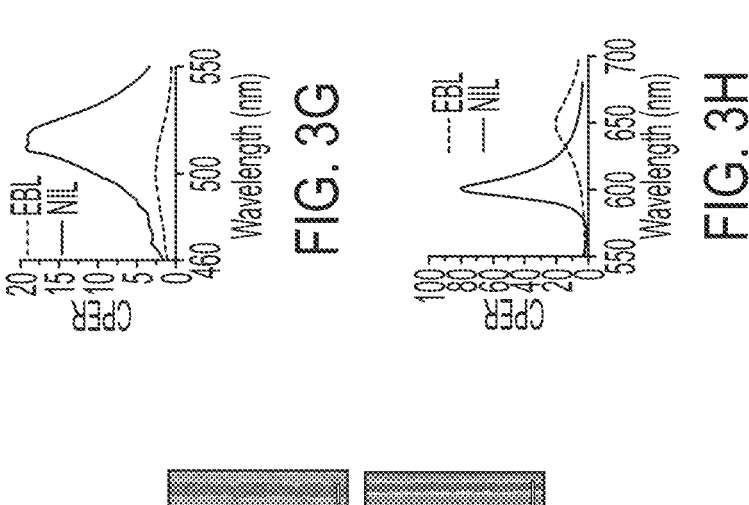
FIG. 3G
FIG. 3H
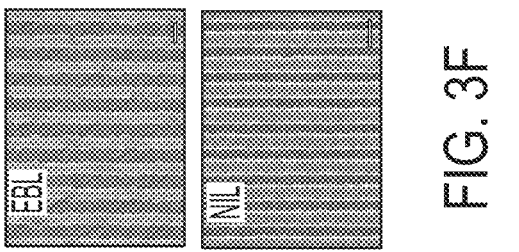
FIG. 3F
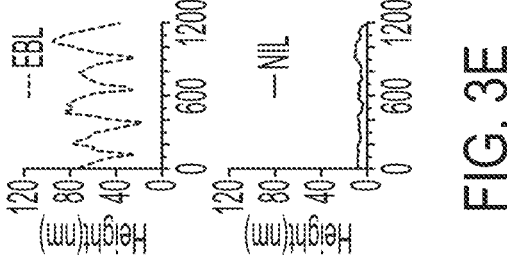
FIG. 3E
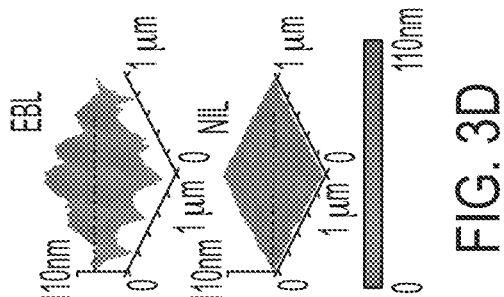
FIG. 3D

FIG. 4D

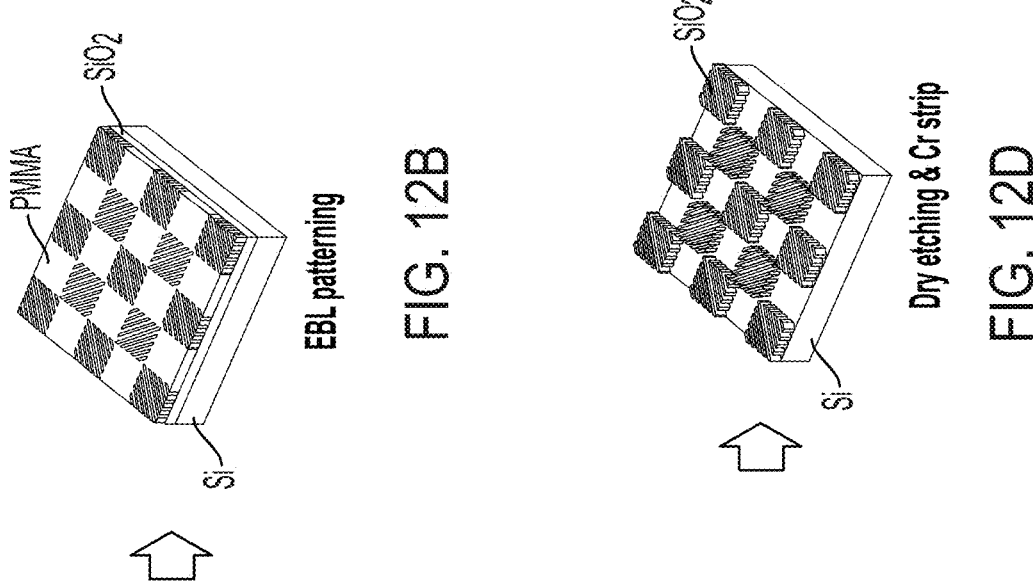
FIG. 12A
Cleaning
FIG. 12B
EBL patterning
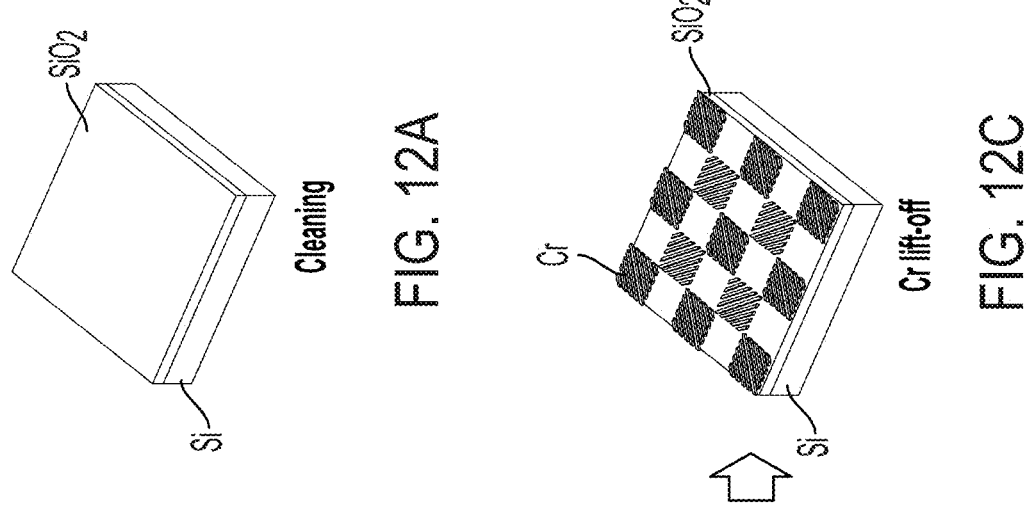
FIG. 12C
Cr lift-off
FIG. 12D
Dry etching & Cr strip Cleaning EBL patterning Lift-off, dry-etching MESA dry-etching S2 Error S1 Error S3 Error S2 Error S1 Error S3 Error DOCP Error AOP Error(°)

DOCP Error

AOP Error(°)

DOLP Error

SCALABLE NANOIMPRINT MANUFACTURING OF FUNCTIONAL MULTI-LAYER METASURFACE DEVICES

CROSS-REFERENCE TO RELATED APPLICATIONS

This application claims benefit to U.S. Provisional Patent Application No. 63/500,458 filed on May 5, 2023, the contents of which are hereby incorporated by reference in its entirety.

GOVERNMENT SUPPORT

This invention was made with government support under grant no. DE-EE0008999 awarded by the U.S. Department of Energy, grant nos. 1947753, 1809997, 1847324, and 1838443 awarded by the National Science Foundation. The government has certain rights in the invention.

FIELD

The application relates to scalable nanoimprint manufacturing of functional multi-layer metasurface devices.

BACKGROUND

Optical metasurfaces, consisting of subwavelength-scale meta-atom arrays, hold great promise of overcoming fundamental limitations of conventional optics. Due to their structural complexity, metasurfaces usually require high-resolution yet slow and expensive fabrication processes such as electron beam lithography. Their scalable nanomanufacturing remains a challenge that limits technology transfer and commercialization. Nanoimprint lithography (NIL) has been utilized in single-layer, standalone metasurface fabrication, but demonstrations of double- and multi-layered metasurfaces with precise layer-to-layer overlay remains elusive.

Metasurfaces are capable of manipulating fundamental electromagnetic responses, i.e., phase, amplitude, spectral response, and polarization, at subwavelength scale. They have shown great potential in addressing fundamental limitations of conventional bulky optical systems and realizing ultracompact optical devices and systems for many applications, such as holography, imaging, spectroscopy, beam shaping and steering, etc. Despite significant progress in metasurface design and proof-of-concept laboratory demonstrations, scalable and cost-effective nanomanufacturing with good uniformity and reproducibility remains one of the major challenges that slows down commercialization of metasurface devices. Conventional prototyping nanofabrication methods, such as electron-beam lithography (EBL) or focused-ion beam (FIB), reply on pixel-by-pixel writing for precise nanopatterning but are not suitable for scalable manufacturing due to long writing time, high cost and reproducibility problems over large scale. High-resolution semiconductor optical lithography technologies (such as deep-UV or extreme-UV lithography) are ideal for high-throughput production, but very expensive and complex to operate for prototyping demonstrations. In comparison, nanoimprint lithography (NIL) is suitable for both prototyping demonstration and large-scale production of nanostructures as small as to sub-ten nanometer scale given its unique optical diffraction-free, parallel patterning capabilities. Previously, NIL has been employed successfully in a wide range of optical applications, such as polarizers, anti-reflection coatings, solar absorbers, image or color displays, etc., and demonstrated successful for geometrically simple, standalone, single-layer metasurface structures as well as stacked double-layer structures without stringent demand of precise alignment. Yet the organization of multi-layer dielectric, metallic or hybrid metasurface structures into functional devices and systems requires not only high-throughput nanopatterning, but also precise alignment and high quality control in vertical stacking, which therefore requires completely different integration strategy.

SUMMARY

According to examples of the present disclosure, an on-chip metasurface polarimetric imaging device is disclosed where the photonic structures and the NIL processes are designed and created using two separate NIL molds over a patterning area of >20 mm² with designed Moiré alignment markers by electron-beam writing, and further subsequently fabricate silicon and aluminum metasurface structures over two levels. The silicon and aluminum metasurfaces are fabricated both by using NIL as a nanolithography and 3D pattern-transfer technology, respectively, achieving nanometer-scale linewidth uniformity, sub-200 nm overlay accuracy, and high optical polarization selection while minimizing fabrication complexity and surface roughness. This NIL-based, multi-layered nanomanufacturing approach is applicable to scalable production of large-area structures for ultra-compact optic, electronic, and fluidic devices.

According to examples of the present disclosure, a polarimetric metastructure is disclosed that comprises a formation of metasurface structure, a formation of vertically coupled double-layer metallic gratings (VCDG), and a dielectric spacer layer between the metasurface and the double-layer gratings. The geometry of the polarimetric metastructure is anisotropic subwavelength gratings with material of an optical index of larger than 1 in the wavelength of interest. The gratings can have a period in the range of 50 nm to 400 nm. The material can be a semiconductor. For example, the material can be silicon (Si), a dielectric, or a metal. The VCDG can comprise a layer of subwavelength gratings made of transparent dielectric material, a first thin metallic layer on top of the gratings, and a second thin metallic layer within the trenches next to the gratings. The subwavelength gratings can have a period (p) in the range of 50 nm to 400 nm. The subwavelength gratings can have a height (h) in the range of 50 nm to 300 nm. In the first and second metallic layers, the metal thickness (t) is the same for both layers. In the metal thickness, the thickness (t) is in the range of 10 nm to 200 nm. The first and second layer metallic layers can be disconnected and separated by a small gap (g). The gap (g) can be in the range of 5 nm to 80 nm. The dielectric can be silicon dioxide (SiO₂). For example, in the grating material, the dielectric can be silicon nitride or a polymer. The polymer can be crosslinked with light illumination or heat radiation. The polymer can be silicon rich and can have an optical refractive index in the range of 1.4 to 1.7. For example, in the metallic material, the metal can be aluminum (Al), silver (Ag), or gold (Au). For example, in the dielectric spacer, the material can be silicon oxide, silicon nitride, or a polymer. The polymer can be crosslinked with light illumination or heat radiation. The polymer can be silicon rich and can have an optical refractive index in the range of 1.4 to 1.7. For example, in the dielectric spacer, its thickness (d) can be in the range of 100 nm to 1000 nm. For example, the polarimetric metastructure can be designed for red-green-blue (RGB) polarimetric imaging having an operation wavelength range in the visible wavelength. The operation wavelength range of the metastructure can be from about 400 nm to about 700 nm.

In accordance with examples of the present disclosure, a polarimetric metastructure imaging sensor is disclosed that is formed by integrating the polarimetric metastructures onto a visible imaging sensor. The imaging sensor provides full-Stokes polarization state analysis of light and polarimetric imaging of objectives. The integration of the metastructures to the visible imaging sensor can be achieved by bonding via a layer of glue. The glue can be a polymer that is crosslinked when exposed to light or heat radiation. The polarimetric imaging sensor provides single-shot full-Stokes imaging, broad-band operation, and full angle of view up to 40°.

In accordance with examples of the present disclosure, a synergistical design and manufacturing method of the disclosed polarimetric metastructures is disclosed that comprises a first nanoimprint lithography (NIL) step and relevant fabrication steps to produce metasurface structures, theoretical and experimental determination of the structural parameters of the VCDGs, including the grating period (p), grating height (h), metal thickness (t) and gap (g) for the targeted polarimetric performance, theoretical and experimental determination of the dielectric spacer thickness (d), performing a second NIL to create a scaffold of VCDG gratings on top of fabricated metasurface structures, depositing metals on the VCDG resist polymer with designed thickness (t). In the manufacturing method, a resist layer is deposited onto a top layer of a substrate, a mold with grating morphology is applied on at least a portion of the resist layer, a pressure is applied on the mold, heat or light radiation is applied while the mold is held onto the resist layer. In the manufacturing method, thin film deposition, metal etching mask deposition, and etching are involved to produce the nanograting structures of designed dimensions. The mold can be made of a material that is nanostructured into gratings of the designed grating period (p) and grating height (h). The mold material can be made in transparent material and UV light can be used as the radiation source during processing for the resist crosslinking. The mold material can be fused silica. The resist layer thickness can be designed such that the final resist after NIL has a thickness of d and the resist layer functions as the disclosed dielectric spacer. The resist polymer after NIL can have the desired grating period (p) and grating height (h). The resist surface can be planarized during NIL processing so that the grating scaffold in the NIL resist has a smooth morphology in both lateral and vertical directions. The metal can be deposited on top of the grating and the trenches next to the gratings to produce two layers of metal gratings with a gap (g) in between. The metal can be deposited in a vacuum system, wherein evaporation can be used for vacuum deposition. The metal deposition rate can be controlled from 0.1 nm per minute to 100 nm per minute. Marks can be designed in both NIL steps for precise alignment with an alignment error in the range of 5 nm to 500 nm. In the alignment process, two sets of gratings of slightly different periods ($P_1$ and $P_2$) can be designed in the metasurface and VCDG structures, and during the second NIL process the substrate and mold can be brought into a close vicinity between them (less than 10 μm), and dark and bright periodic images are formed under white light illumination due to interference of two sets of gratings, which called Moiré fringe. The period of Moiré fringe ($P_{fringe}$) is calculated as $P_{fringe}=P_1 \cdot P_2/(P_1-P_2)$ and the alignment error (Δ) is calculated by the Moiré fringe alignment offset(s) as $\Delta=s \cdot (P_2/P_{fringe})$, thus resulting in nanometer-scaled alignment accuracy given $P_{fringe}/P_2$ is much bigger than 1. The area of the metasurface and the VCDGs are from millimeter scale to less than 1 meter in both of the lateral dimensions.

BRIEF DESCRIPTION OF THE FIGURES

FIG. 1A, FIG. 1B, FIG. 1C, FIG. 1D, FIG. 1E, and FIG. 1F show example designs of scalable NIL manufacturing for multi-layer metasurface polarization filter arrays (MPFAs) according to examples of the present disclosure. FIG. 1A shows an illustration of integrating the broadband MPFAs onto a CMOS sensor. FIG. 1B shows an illustration of the arrangement of each metasurface polarization filter arrays (pixels) within super-pixels (rectangular boxes). FIG. 1C shows a schematic illustration of VCDGs to pass light polarized along x axis but block light polarized along y axis. FIG. 1D shows a schematic of multi-layered CP filter transmitting LCP but blocking RCP incoming light. FIG. 1D shows a co-design to produce the VCDGs on Si metasurface structures based on NIL. FIG. 1E shows a schematics showing the EBL (top, following orange arrows) and NIL (bottom, following green arrows) based fabrication processes for MPFAs.

FIG. 2A-1, FIG. 2A-2, FIG. 2A-3, FIG. 2A-4 shows a fabrication process of Si metasurface via thermal NIL on a tri-layered resist structure, including PMMA (bottom), SiO$_2$ (middle, evaporated) and thermoplastic NIL resist (top). The top-left insert optical image shows the Si metasurface NIL mold made in a Si wafer. FIG. 2B shows fabricated Si metasurface structures on fused silica where the left image shows an optical image of a fabricated Si metasurface chip (scale bar: 5 mm), the middle image shows top-view SEM images of unit pixel arrays, the right image shows side-view SEM image of Si gratings (scale bar: 300 nm). FIG. 2C-1, FIG. 2C-2, FIG. 2C-3, FIG. 2C-4, FIG. 2C-5 show an illustration of fabrication process of VCDGs by UV-NIL followed by Al evaporation, where the top-left insert optical image shows the VCDG mold made in fused silica. FIG. 2D shows fabricated VCDG grating structures, where the left figure shows an optical image of VCDG gratings on a silicon sample for structural inspection (scale bar: 5 mm), the middle figure shows a top-view SEM images of unit pixel arrays, and the right figure shows a cross-sectional view of fabricated VCDGs after Al deposition (scale bar: 300 nm) with the key geometrical dimensions highlighted (g: gaps between the two sets of gratings; t: Al thickness; w: grating width).

FIG. 3A, FIG. 3B, FIG. 3C, FIG. 3D, FIG. 3E, FIG. 3F, FIG. 3G, and FIG. 3H show NIL integration of multi-layer MPFA chips according to examples of the present disclosure. FIG. 3A shows moiré fringe-based alignment technique to achieve nano-scale overlay accuracy. FIG. 3B shows integrated multi-layer metasurface chip, where the left figure shows optical images of the diced chip (top: VCDGs-side up; bottom: α-Si side up. Scale bar: 1 mm), the middle and right figure shows representative cross-sectional SEM image of integrated multi-layer metasurface structures (scale bar: 1 μm for middle image, and 200 nm for right image). FIG. 3C shows microscopic images of fabricated MPFAs, where the top and middle figures show optical images (scale bar: 30 μm for the top and 10 μm for the middle), and the bottom figure shows representative SEM images of a super-pixel comprising eight individual pixels (scale bar: 1 μm). FIG. 3D shows AFM images of a non-patterned area from MPFA chip fabricated by EBL (top) and NIL (bottom) to show the surface roughness. FIG. 3E shows surface roughness profiles extracted from the AFM images in FIG. 3D. FIG. 3F shows SEM images of Al grating nanostructures from EBL (top) and NIL (bottom) fabricated MPFAs. FIG. 3G and FIG. 3H show a comparison of CPER of LCP filters fabricated by NIL (black) and EBL (red): at 460-550 nm in FIG. 3G and at 550-680 nm in FIG. 3H.

FIG. 4A, FIG. 4B, FIG. 4C, and FIG. 4D show multicolor full-Stokes polarization state detection using metasurface polarimetric imaging sensor according to examples of the present disclosure. FIG. 4A shows a schematic of integrating MPFAs onto CMOS imaging sensor. CMOS circuit board was mounted onto a 3D rotation stage and leveled, then the MPFA chip was aligned and bonded onto the board on a UV mask aligner. FIG. 4B shows an optical image of the integrated Meta-PolarIm. FIG. 4C shows error analysis of multi-color, full-Stokes parameter detection for eight polarization states (A to H). FIG. 4D shows distributions of multi-color AOP, DOCP and DOLP detection errors of all metasurface pixels to analyze polarization states A and H.

FIG. 5A and FIG. 5B shows transmission, color filtered, $S_0$, AOP, DOLP, DOCP, and DOP images of a plastic fork in FIG. 5A and a pair of 3D glasses in FIG. 5B. FIG. 5C shows reflection, color filtered, $S_0$, AOP, DOLP, DOCP, and DOP images of a green june beetle.

FIG. 7A shows schematic of Si nanogratings. FIG. 7B shows blue/red CP filter design: calculated phase difference (left Y-axis, black line) and transmission of $E_U$ and $E_V$ (right Y-axis, line for $E_V$ and line for $E_U$). FIG. 7C shows green CP filter design: phase difference (left Y-axis, black line) and transmission amplitude of $E_U$ and $E_V$ (right Y-axis, line for $E_V$ and line for $E_U$).

FIG. 8A shows red and blue color design. FIG. 8B shows green color design.

FIG. 9A shows a schematic to show the definition of Si grating width, here $w_{si}$ is defined as the bottom width of trapezoidal shaped Si grating. FIG. 9B shows simulated CPER dependence on Si grating width for red color and blue color CP polarization filter. FIG. 9C shows simulated CPER dependence on Si grating width for green color CP polarization filter. FIG. 9D and FIG. 9E show plots of CPER verses wavelength.

FIG. 10A shows a cross-sectional schematic of the VCDG structures. FIG. 10B shows exemplary simulation of optical transmission and LPER of VCDGs. FIG. 10C and FIG. 10D show simulated transmission at 650 nm and 500 nm wavelengths at different grating height g and Al thickness. FIG. 10E and FIG. 10F show simulated transmission at 650 nm and 500 nm wavelengths at different grating height g and Al thickness.

FIG. 11A shows a schematic to show the definition of spacer layer thickness, here d is defined as the distance from the top of Si grating to the bottom of VCDGs. FIG. 11B shows simulated CPER dependence on spacer layer thickness for red color & blue color CP polarization filter. FIG. 11C shows simulated CPER dependence on spacer layer thickness for green color CP polarization filter. FIG. 11D and FIG. 11E show plots of CPER versus wavelength.

FIG. 12A, FIG. 12B, FIG. 12C, and FIG. 12D show Si metasurface mold fabrication process by EBL according to examples of the present disclosure. FIG. 12A shows a Si wafer with $SiO_2$ film is cleaned by solvents and RCA1. Then PMMA is spin-coated and a Cr layer was deposited on the PMMA as discharging layer for the EBL by thermal evaporator. FIG. 12B shows EBL is carried out, and then the Cr discharging layer was stripped and the metasurface patterns were developed. FIG. 12C shows a layer of Cr was evaporated and lifted off, creating a mask for subsequent RIE. FIG. 12D shows the $SiO_2$ film was etched by RIE, and then Cr mask was stripped.

FIG. 13A shows a fused silica wafer is cleaned by solvents and RCA1. Then PMMA is spin-coated, and a Cr layer was deposited on the PMMA as discharging layer for EBL. FIG. 13B shows EBL is carried out, and then the Cr discharging layer was stripped and the metasurface patterns were developed. FIG. 13C shows a layer of Cr was evaporated and lifted off, creating a mask for subsequent RIE. FIG. 13D shows the $SiO_2$ film was etched by RIE, and then Cr mask was stripped.

FIG. 16A shows schematic of fabricated Si metasurfaces, showing a large height difference in patterned (QWP) and non-patterned (blank) areas. FIG. 16B shows an optical image of fabricated Si metasurface arrays.

FIG. 17A shows $SiO_2$ is sputtered-coated on Si metasurface. FIG. 17B shows coating polyvinylpyrrolidone (PVP) followed by planarization via thermal NIL with a flat Si mold. FIG. 17C shows evaporation of a SiO2 mid-layer, spin-coating UV resist, and tri-layer UV-NIL on the PVP-coated Si metasurface. FIG. 17D shows plasma RIE to etch the residual layer in UV resist, mid-layer SiO2, and PVP bottom layer. FIG. 17E shows Cr evaporation, liftoff, and RIE into the SiO$_2$ layer; FIG. 17F shows Cr removal and Al evaporation.

FIG. 18A shows schematic showing the VCDG Al gratings with rounded edges and reduced gaps. FIG. 18B and FIG. 18C show SEM images showing NIL-fabricated VCDG gratings before and after Al deposition. FIG. 18D shows simulated VCDG efficiency and LPER with key structural parameters as: VCDG period of $P_{Al}$=210 nm, Al thickness $t_{Al}$=80 nm, vertical gap g2=30 nm, VCDG grating width $W_{Al}$=105 nm. FIG. 18E shows plots of experimentally measured transmission efficiency and LPER with respect to different Al thicknesses. 80 nm Al indicated the highest LPER (solid line).

FIG. 27A shows a transmission mode and FIG. 27B shows reflection mode.

DETAILED DESCRIPTION

Introduction

According to examples of the present disclosure, a scalable NIL integration approach towards manufacturing of metasurfaces over multiple layers is disclosed, creating subwavelength-thick, functional, metasurface polarization filter arrays (MPFAs) as a proof-of-concept demonstration. Here NIL was carried out in two steps to produce two sets of nanostructures in dielectric (silicon) and metallic (aluminum) materials with precise dimensional control (<4 nm in linewidth standard deviation) separated by a dielectric (SiO$_2$) spacer layer. Uniquely, NIL was used as a lithographical technique to faithfully pattern nanostructures in silicon metasurface, and then explored as a transfer-printing method to replicate the three-dimensional geometries of the NIL mold into the imprint resist, which directly functioned as a scaffold for the aluminum metasurface. For precise alignment of the silicon and aluminum metasurfaces, Moiré alignment markers were placed onto both of the NIL molds along with the designed functional nanostructures, which in this work were organized into micrometer-sized arrays and contained dense nanogratings, to achieve a high alignment accuracy (inter-layer translational alignment error ~200 nm, rotational error<0.017 degrees) between the silicon and aluminum metasurfaces. These vertically integrated microarrays, i.e. MPFAs, functioned as polarimetric imaging pixels, comprising broadband linear polarization (LP) filters, i.e. grating polarizers in the aluminum metasurface, and selectively patterned circular polarization (CP) filters across visible wavelength bands (500±20 nm, 550±20 nm, and 600±20 nm) from overlaid multi-layer nanostructures. Finally, the metasurface chips were bonded onto complementary metal-oxide semiconductor (CMOS) imaging sensors, thus enabling broadband polarimetric imaging and full-Stokes parameter analysis across the different colors at a high accuracy (<5%). Using MPFAs as an example, we showed that the NIL-fabricated devices presented a much smoother surface (4 nm roughness) and gratings compared to EBL-MPFAs (~16 nm), attributed to the in-situ planarization capability of NIL, and the NIL-MPFAs produced much enhanced extinction ratio (ER, ~10 times and ~4 times better at blue and red color wavelengths) than EBL ones. This significant improvement in optical performance was attributed to our co-designed and greatly simplified manufacturing strategy that minimized fabrication complexity, reduced structure damages, and suppressed optical scattering loss. This successful multilayer NIL-metasurface integration approach can be adapted to the fabrication of many other metasurface structures towards high-throughput scalable manufacturing of various metasurface devices, which have broad applications in both efficient prototyping and large-scale production of ultra-compact chip-integrated optic, optoelectronic, electronic, and fluidic devices and systems.

Scalable Manufacturing Design and Process

Figure 1A:
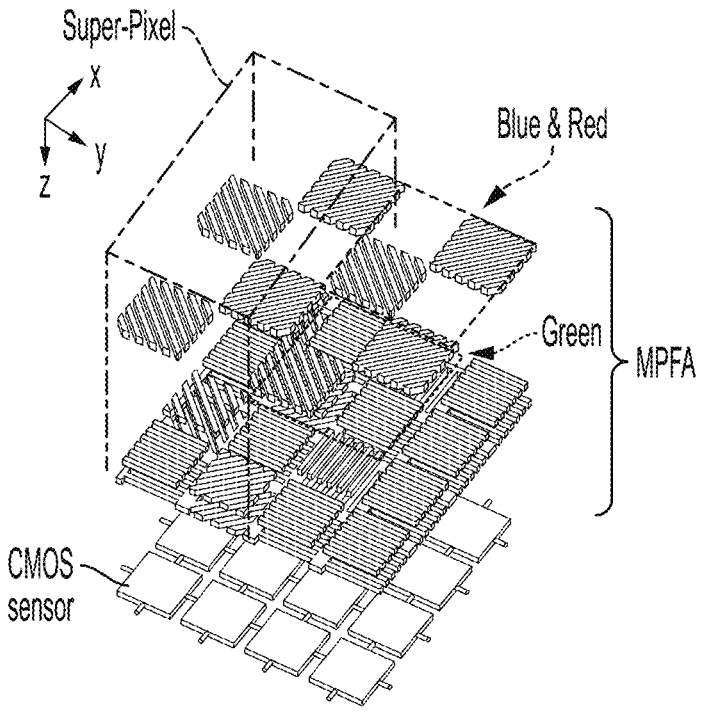
Figure 1B:
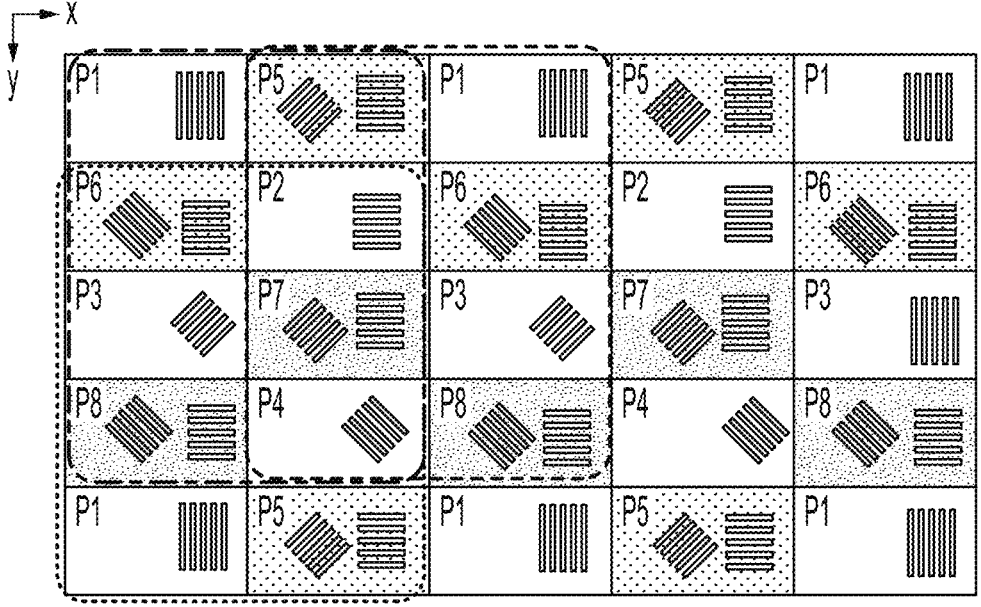
Figures 1, 2, 2A, 3, 4:
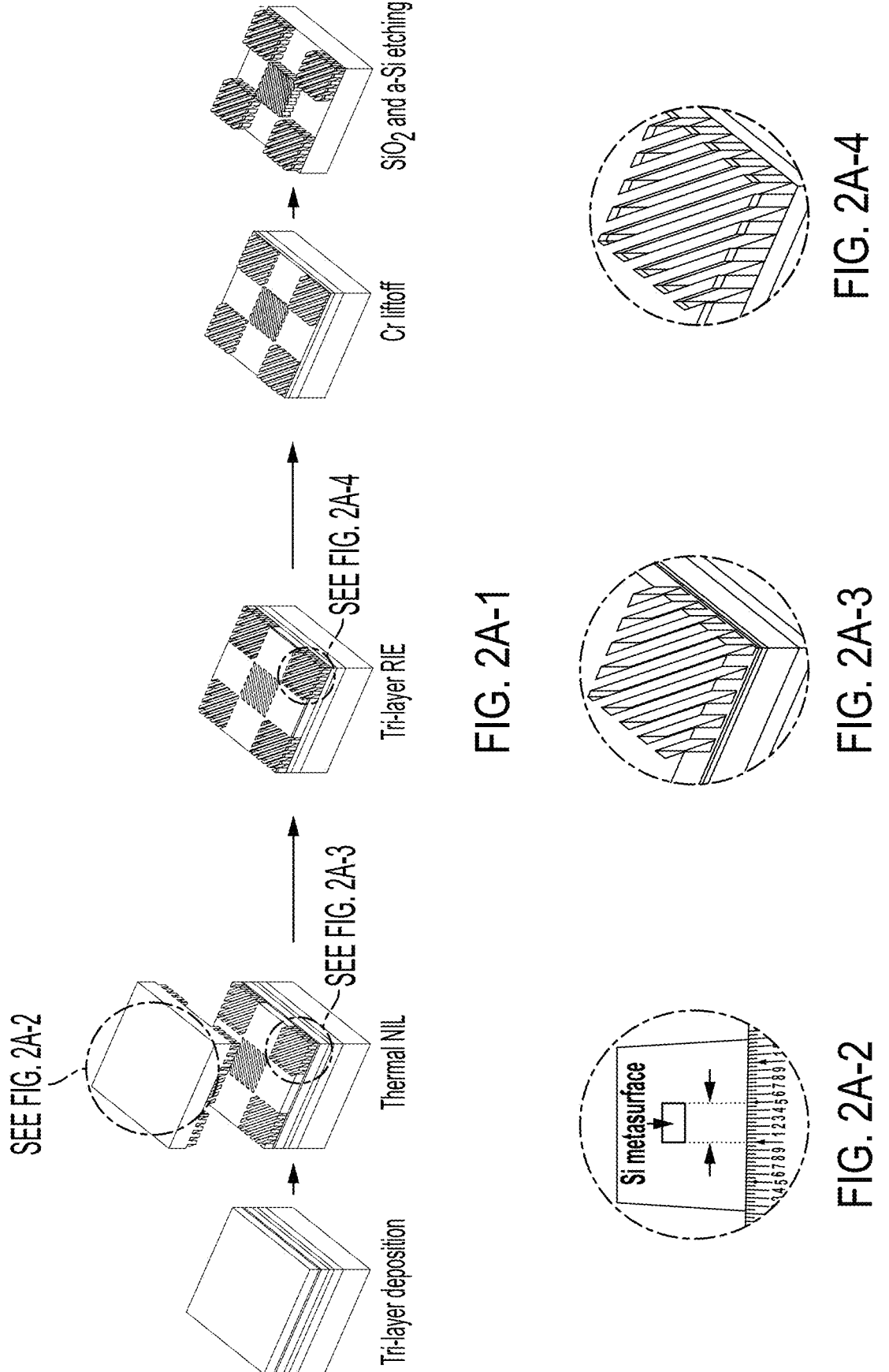
FIG. 2A-1, FIG. 2A-2, FIG. 2A-3, FIG. 2A-4, FIG. 2B, FIG. 2C-1, FIG. 2C-2, FIG. 2C-3, FIG. 2C-4, FIG. 2C-5, and FIG. 2D show example schematics and fabrication results of Si and VCDG metasurface structures according to examples of the present disclosure.

A synergistic approach to co-design the multi-layered optical metasurfaces and their scalable NIL manufacturing process is disclosed. Our exemplary polarimetric imaging system was a multilayered metasurface polarization filter arrays (MPFAs) integrated onto a CMOS imaging sensor (FIG. 1A). The MPFAs comprises over 43,000 superpixels, each having four LP filter pixels and four CP filter pixels (FIG. 1B) to ensure accurate full-Stokes polarization measurement. The LP filters were based on vertically coupled double-layer gratings (VCDGs) with high LP extinction ratio (LPER) over a broad wavelength range (FIG. 1C). The CP filters were based on multi-layered chiral metasurface structures, comprising a Si metasurface acting as quarter wave plate (QWP) (FIG. 7A, FIG. 7B, FIG. 7C), a dielectric (SiO$_2$) spacing layer, and VCDGs as LP filters (FIG. 1D). Overall, the MPFAs were formed by two levels of vertically aligned, functional structures, i.e., the Si metasurface and the VCDG (FIG. 1A and FIG. 1B). In the Si metasurface level, each superpixel had 4 blank pixels (no nanopatterns, pixels 1 to 4, FIG. 1B and 4 pixels made of Si nanostructures (pixels 5 to 8). In the VCDG level, the grating polarizers were present in all 8 pixels, oriented along 0°, 45°, 90° or 135° in the 4 LP filters and all along 90° in the 4 CP filters (FIG. 1B). To achieve a broadband coverage in visible (450 to ~700 nm), two sets of CP filters (VCDGs overlaid to Si metasurface) were designed, one for green-wavelength operation (520 to 620 nm, pixels 7 and 8, FIG. 1B), and the other (pixels 5 and 6) for both blue (450 to 520 nm) and red wavelengths (600 to 670 nm) (designs parameters and simulation results in Table 1, FIG. 8A and FIG. 8B). This design enabled a single-shot, full-Stokes polarimetric analysis and imaging over a broad bandwidth in visible wavelengths. Further, the LP and CP filter pixels are all shared by neighbor superpixels in the MFPA layout, thus maximizing the amount of effective superpixels for optimal imaging resolution. Here the MPFAs were fabricated on a transparent silica substrate and then integrated onto a commercial CMOS imaging sensor via polymer-assisted wafer bonding. The process can be readily modified to directly integrate the metasurface onto CMOS chips for wafer-scale production.

Previously, an EBL-based process (FIG. 1F top, indicated by orange arrows) was developed by us to fabricate the MPFAs; however, the fabrication was quite complex and expensive, requiring extensive EBL writing time, repeated film deposition, lift-off and etching. Furthermore, the silicon oxide ($SiO_2$) spacer on top of the silicon (Si) metasurface displayed a rough surface, which resulted in uneven Al grating surfaces in the VCDGs and limited device LPER and CPER. Motivated by these challenges, we here propose and demonstrate a fundamentally different NIL technology towards scalable multi-layer device integration. Specifically, NIL (FIG. 1F bottom, indicated by green arrows) was used first as a high-throughput, high-resolution lithographic technology to pattern Si metasurface gratings by thermal imprinting (followed by metal liftoff and etching), and then used as a three-dimensional transfer-printing process to produce the VCDG grating scaffold with the NIL mold geometries preserved in UV-NIL resists, which also acted as a $SiO_2$-comparable spacer layer. Moiré patterns were created on both of the two NIL molds to achieve a high overlay accuracy over the patterned areas. Very uniquely, the UV-NIL not only effectively transfer-printed 3D grating structures as the VCDG scaffold, but also eliminated multiple manufacturing steps and planarized the resist. Therefore, this innovated NIL integration strategy simultaneously reduced processing complexity, improved performance, and enabled scalable device production.

In this work, because the metasurface design requires complex patterning of dense and small structures in silicon and aluminum (period as small as 180 nm and linewidth as small as 70 nm, see Table 1) with different geometries, orientations and dimensions to act as QWPs and polarizers, respectively in the vertically stacked MPFAs, EBL writing was chosen to create the NIL molds for its design flexibility and high resolution. A low EBL writing current (and therefore a long writing time) was needed for accurate control of structural geometry but in practice limited the demonstrated patterning to ~20 mm² even after a 16-hour writing. This area size was designed to fit a CMOS imager sensor for on-chip polarimetric imaging demonstration. Noticeably, NIL is many times faster than EBL once a mold is available (Table 5), and its high throughput advantage can be further manifested when scaling to even bigger areas if the molds can be made from more advanced lithography tool, such as deep-UV or extreme-UV lithography (Table 6). Nevertheless, the use of the MPFAs as an example allows us to establish this new manufacturing approach and quantitatively evaluate the device performance by comparing NIL with EBL based integration processes.

Figure 1E:
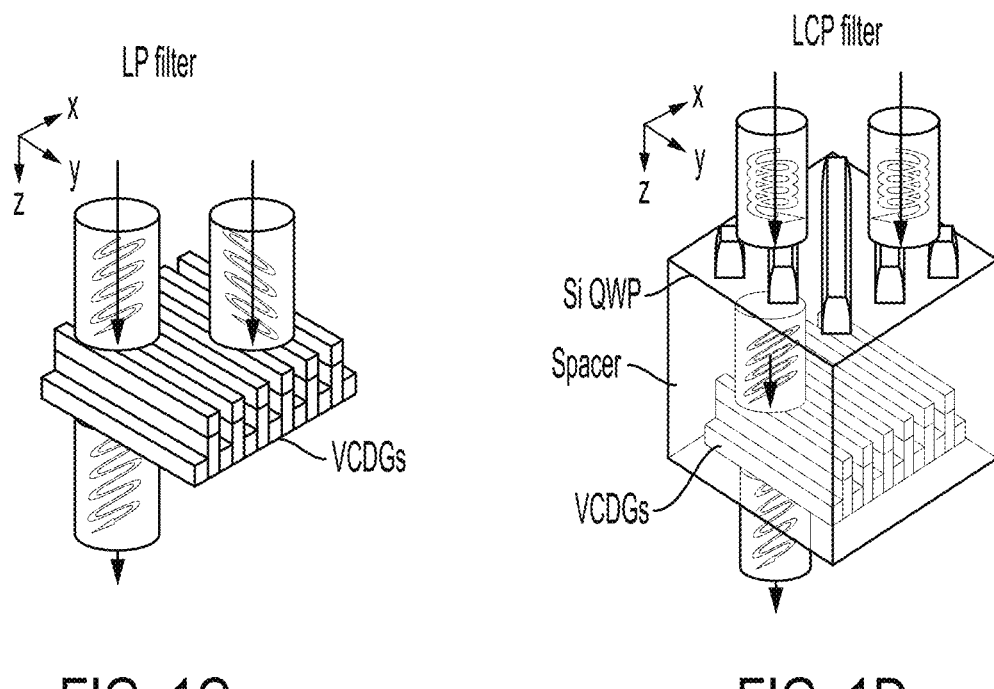
Figure 1E:
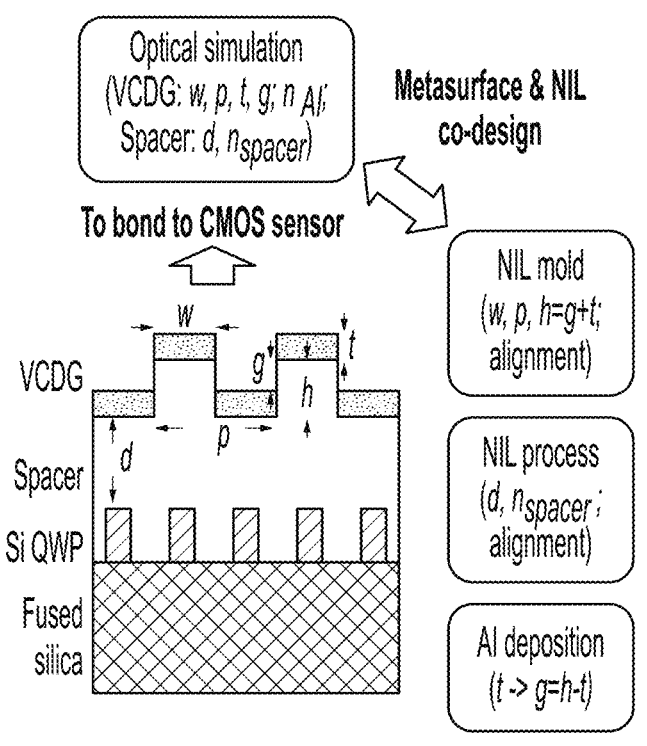
Figure 8A:
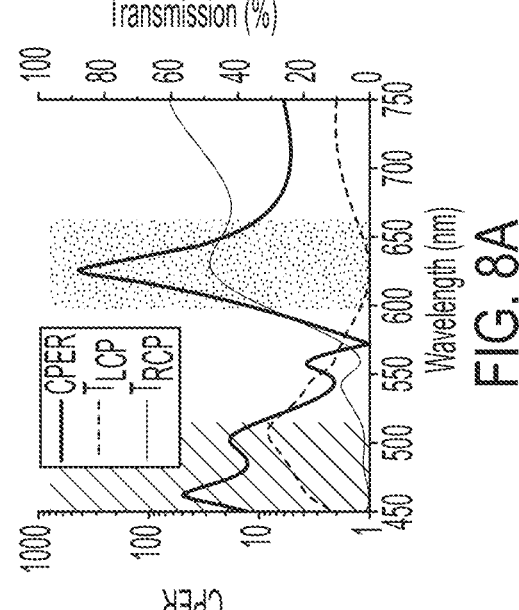
FIG. 8A and FIG. 8B show FDTD-simulated transmission and CP extinction ratio (CPER) of broadband a-Si metasurface designed for CP detection according to examples of the present disclosure.
Figure 8B:
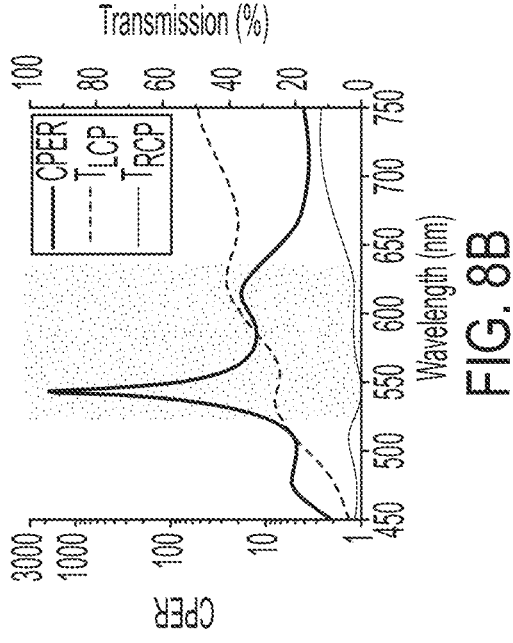

To optimize the manufacturing throughput and device performance, several design parameters were identified that are closely relevant to NIL processes and performance of Si QWP and the VCDGs (FIG. 1E, Table 1). At the Si QWP metasurface level, dense gratings of 180 nm or 297 nm in period and linewidths of 70 or 100 nm are needed for CP polarization filters of green or blue/red operational wavelengths (FIG. 8A and FIG. 8B). Optical simulation results (FIG. 9A, FIG. 9B, FIG. 9C, FIG. 9D, FIG. 9E) indicate that small variations of the Si grating linewidth only slightly modulate the optimal CPER values and the peak wavelengths, showing a high design tolerance. At the VCDG level, the grating period (p), controlled by the NIL mold structure design, and width (w), determined by UV-NIL and subsequent processing conditions, both have strong influence on the LPER and optical transmission. The duty cycle (w/p) was designed at 50% with a tolerance of ±20% to obtain a high LPER of over 1000 in visible (FIG. 10A, FIG. 10B, FIG. 10C, FIG. 10D, FIG. 10E, FIG. 10F). The vertical gaps between the Aluminum (Al) double gratings (g) was practically determined by the designed mold height and experimentally optimized Al thicknesses to maximize the LPER. Further, the spacing between the VCDGs and the Si nanostructures (d) also strongly affects wavelength ranges to achieve the best MPFA performance (FIG. 11A, FIG. 11B, FIG. 11C, FIG. 11D, FIG. 11E), as it affects the phase accumulation of electromagnetic waves travelling between the two layers upon reflection.

Silicon Metasurface Fabrication

The silicon metasurface-based, microscale QWP array was fabricated by thermal-NIL for its simplicity, using a NIL mold fabricated on a thermal $SiO_2$-coated silicon wafer (FIG. 2A-1, FIG. 2A-2, FIG. 2A-3, FIG. 2A-4). We first made the NIL mold by EBL patterning, chromium (Cr) hard mask deposition and liftoff, reactive ion etching (RIE) of $SiO_2$, and Cr stripping (Methods section and FIG. 12A, FIG. 12B, FIG. 12C, FIG. 12D). Then the Si metasurface was fabricated from α-Si thin film deposited by chemical-vapor deposited (CVD) using a tri-layer pattern-transfer scheme. Here thermal NIL was performed on a film stack made of a bottom polymethyl methacrylate (PMMA) layer, a mid-layer evaporated $SiO_2$ film, and a top-layer thermoplastic NIL resist. The polymers (PMMA and NIL resist) and $SiO_2$ layers in the film stack were selectively etched by a series of RIE with oxygen plasma or $CHF_3$ plasma, respectively, to transfer the NIL-patterned grating features. Lastly Cr deposition, Cr mask liftoff, and RIE of $SiO_2$/Si films were performed to complete the fabrication of Si metasurface layer. Compared to a single-layer resist, the tri-layer film stack could effectively produce high-aspect-ratio nanostructures with improved patterning uniformity over a large area by reducing dimensional distortion and improving the success in Cr liftoff, thus favorable for subsequent high-fidelity pattern transfer to the underneath Si metasurface gratings. Additionally, the grating linewidth could be adjusted within a range of about 30 nm by modulating the etching time of the top thermoplastic NIL resist, offering additional flexibility in controlling structure dimensions. The linewidths of Si metasurface gratings were inspected by scanning electron microscopy (SEM) at five different locations of the sample (① to ⑤, 10 spots each area, FIG. 2B). The standard deviations were calculated as $$SDs = \sqrt{\frac{1}{5}\sum_{i=1}^{5}(w_i - \mu)^2},$$

where $\mu$ is the average linewidth at each locations, and found less than 4 nm for all the array designs (Table 2), thus confirming good uniformity of the NIL process for large-scale nanomanufacturing of Si metasurface.

NIL 3D Scaffolding for Metallic Grating Metasurface (VCDG)

Figure 1F:
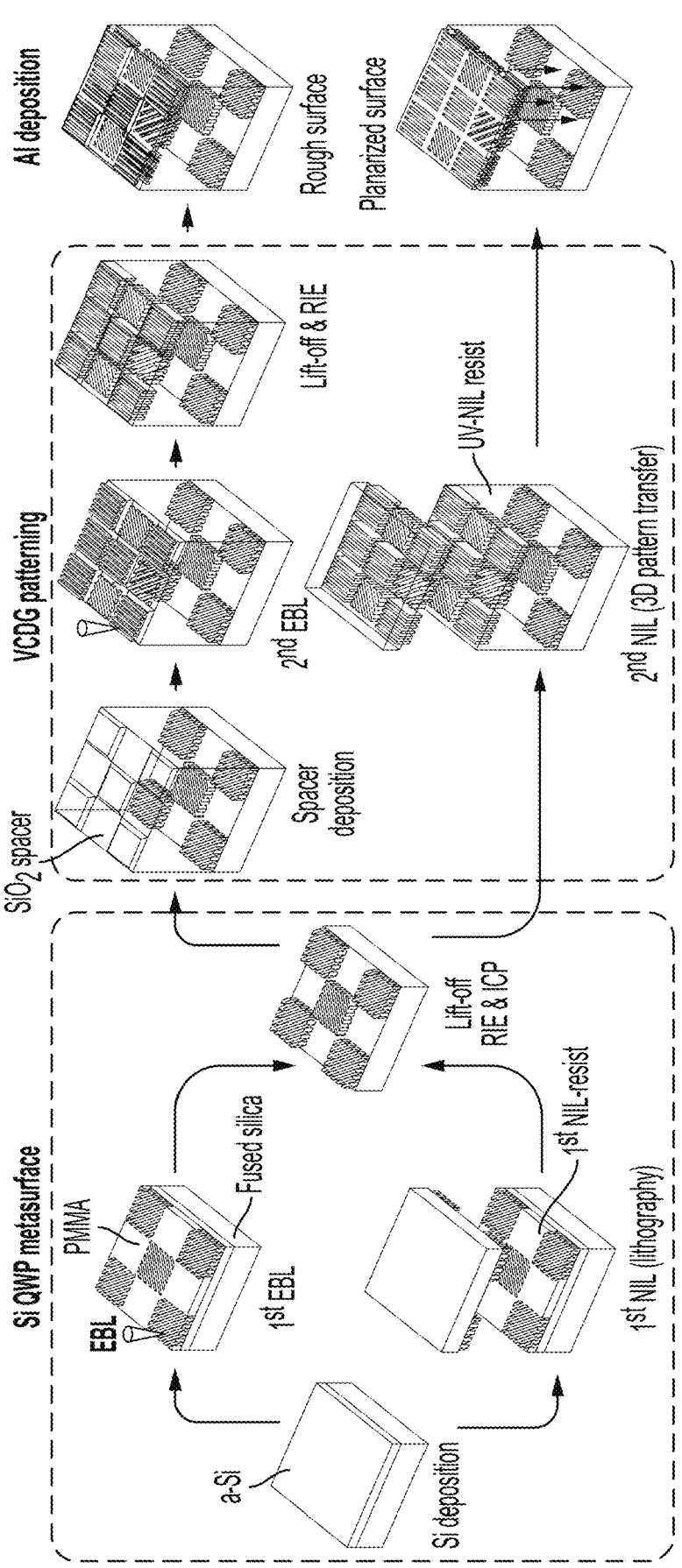

The VCDG linear polarizer arrays were fabricated using UV-NIL with a NIL mold fabricated on a transparent fused silica wafer (FIG. 2C-1, FIG. 2C-2, FIG. 2C-3, FIG. 2C-4, FIG. 2C-5) for precise vertical stacking and overlay onto Si metasurface. The VCDG mold fabrication process was similar to that for the Si metasurface NIL mold, with more details in Methods section. Briefly, the nanostructured mold was intentionally patterned on an etched mesa (FIG. 13A, FIG. 13B, FIG. 13C, FIG. 13D) to further improve the NIL pressure, which was beneficial to high imprinting quality. To examine the VCDG NIL process, we coated a Si wafer with an acrylate-based, UV-curable resist and performed UV-NIL on the sample. The NIL transferred the nanograting patterns into the UV resist (optical index very close to $SiO_2$, FIG. 14) that was more resistant to oxygen plasma damage or heating in metal deposition than organic polymers. Without need of any additional etching or liftoff, the UV NIL resist served perfectly as a rigid, transparent VCDG scaffold, and preserved precisely both the lateral and vertical dimensions of the grating structures from the NIL mold. Subsequently, VCDGs fabrication was completed by a simple Al deposition (thickness t) to produce desired vertical gaps (g=h−t) (FIG. 1E). Essentially, this single NIL-based pattern transfer-printing step replaced multiple manufacturing steps otherwise needed for EBL fabrication (FIG. 1F), including $SiO_2$ spacer deposition, EBL writing, plasma descum, Cr deposition, liftoff, $SiO_2$ dry etching, and Cr removal, therefore greatly improving the throughput and minimizes feature distortion. The linewidth SDs of VCDGs were measured less than 2 nm (Table 2) from SEM images taken at five randomly selected locations across the chips (FIG. 2D). The linewidth of angled gratings (116 nm for 45° and 135°, respectively) was found slightly different from vertical and horizontal gratings (109 nm for 90° and 0°, respectively). This difference was mainly attributed to manufacturing variations in the VCDG mold during EBL-based pattern generation and writing process, but was still within the acceptable range for VCDG grating polarizers (FIG. 10A, FIG. 10B, FIG. 10C, FIG. 10D, FIG. 10E, FIG. 10F). Further, the Al film deposition conditions were optimized to minimize the roughness (FIG. 15A and FIG. 15B), experimentally analyzed the impact of Al thickness (t) on the optical performance of VCDGs (FIG. 16A, FIG. 16B, FIG. 16C, FIG. 16D, FIG. 16E, FIG. 16F, FIG. 16G, FIG. 16H, FIG. 16I, and FIG. 16J) for optimal LPER, and chose here to have t=80 nm.

Vertical Alignment and Integration

NIL-based multi-layer metasurface fabrication usually faces two major challenges: 1) precise alignment between the different layers, and 2) the adverse impacts of existing surface topography on the subsequent NIL fabrication.

To achieve submicron optical alignment for vertical stacking of the VCDG and Si metasurface micro-filter arrays, we designed and fabricated interference-based Moiré patterns (FIG. 3A) on both NIL molds for Si metasurfaces and VCDGs. Here, two sets of gratings with slightly different periods acted as Moiré marks to produce interference patterns with a period $P_{fringe}$, calculated as $P_{fringe}=P_1 \cdot P_2/(P_2-P_1)$. Therefore, the theoretical misalignment between the two metasurfaces ($\Delta=G_i-G_j$) could be made much smaller than the visualized Moiré fringe offset (s) as $\Delta=s(P_2-P_1)/$ $P_1 \ll s$ when $P_2 \sim P_1$, thus resulting in nanometer-scaled alignment accuracy. When in good alignment, Moiré fringe minima were clearly positioned next to our designed small square and cross marks on the two metasurface layers that served as alignment indicators in each of the alignment mark groups (e.g., $AM_1$ and $AM_2$, FIG. 3A). Because the thick NIL resist spacer layer blocks electron beam signals but allows optical visualization, we chose optical microscopy to measure the gaps between the square and cross marks in both x- and y-directions, and determined the translational alignment errors ($\Delta_1$, $\Delta_2$, $\Delta_3$, and $\Delta_4$ for the four alignment mark sets) from the size differences of these gaps G, e.g. $\Delta=|G_1-G_2|/2|$. The measured alignment errors were found below 200 nm in both x- and y-directions within the mm-scaled structure (Table 3), much smaller than our MPFA design requirement of ~1.6 µm, which was needed to overlay the 4.65×4.65 µm² VCDG arrays (FIG. 3C bottom, grey squares) to 7.75×7.75 µm² Si metasurface arrays (FIG. 3C bottom, squares). The Moiré marks can be designed to achieve much higher overlay accuracy by engineering the optical scanning, stage, and control systems, e.g., sub-10 nm overlay is routinely achieved on ASML scanners using fundamentally similar interferometric marks for larger-scale production. Nevertheless, the Moiré alignment method allows future integration of metasurface structures with reduced pixel sizes, e.g. to submicron with our demonstrated NIL capability or even smaller on more advanced systems, thus further improving the imaging sensor pixel density.

On the other hand, the surface topography resulting from the selectively fabricated Si metasurface (FIG. 16A and FIG. 16B) strongly affects subsequent VCDG fabrication. Applying NIL on the Si metasurface as a conventional lithography tool would face a few serious challenges. First, as a contact-based lithographic technology, NIL process typically prefers a flat substrate for high-resolution, low-defect pattern replication, because existing nanostructures (e.g. ~160 nm tall gratings in selectively patterned areas here) could disrupt the resist flow, trap air bubbles and create defects. Further, using a much thicker NIL resist layer, for instance about twice the height of the Si gratings, although can mitigate the defect problem during imprinting, creates non-uniform and substantial residual layers in some areas, e.g. the empty pixels without nanostructures. This in turn leads to, a much longer residual layer etching during pattern transfer, and can cause structural distortion, dimensional expansion, and/or defects. In fact, we attempted to replace EBL with NIL to lithographically pattern the VCDGs on $SiO_2$ spacer-coated Si metasurfaces for Cr liftoff and $SiO_2$ etching (FIG. 17A, FIG. 17B, FIG. 17C, FIG. 17D, FIG. 17E, FIG. 17F, FIG. 17G, FIG. 17H, FIG. 17I, and FIG. 17J), similar to the EBL fabrication scheme (FIG. 1F). Clearly, even though we use a pre-NIL polymer planarization process to help minimize NIL defects and designed a tri-layer UV resist stack to improve yield of pattern transfer, the Cr patterns after liftoff suffered serious linewidth distortion, polymer residue contamination, and poor line roughness. To circumvent these problems, UV-NIL was instead employed as a 3D transfer-printing technology to produce uniform nanostructures in the resist as a VCDG scaffold, which readily functioned as a template to complete VCDG fabrication through an Al evaporation and simultaneously acted as a $SiO_2$-like dielectric spacer layer between the Si and VCDG metasurfaces. Therefore, this method eliminated complex, structure-damaging fabrication steps (such as etching, liftoff, etc.) to best preserve the printed nanostructure geometries. Compared to EBL-fabricated chips that displayed a wobbling surface (up to ~80 nm modulation across ~100 nm distance, and root mean square roughness ~15.6 nm, from a 1 $\mu m^2$ flattened area without gratings, FIG. 3D and FIG. 3E top), UV-NIL effectively planarized the substrate surface to have a much reduced roughness (~1.2 nm, extracted, FIG. 3D and FIG. 3E bottom). Accordingly, the VCDGs overlaid on Si meta-surface had a very small grating linewidth SDs of <4 nm from SEM imaging (Table 7), comparable to that of VCDG structures fabricated on a flat substrate (~2 nm, Table 2). Clearly the in-situ planarization, which was attributed to the effective resist filling owing to the low viscosity of UV resist layer, allowed us to faithfully produce nanograting scaffold from the NIL mold. This success demonstrated the feasibility of precise NIL nanopatterning over selectively patterned, significant protruding topography from underlying metasurfaces, which poses serious challenges in high-yield NIL fabrication.

Optical spectroscopic measurements were also performed of the integrated multi-layer metasurfaces and compared the performance of EBL- and NIL-fabricated MPFA samples (FIG. 3G and FIG. 3H). Notably, the maximum CPER of the NIL-fabricated MPFAs was ~10 times and ~4 times better at blue and red color wavelength ranges (~20 and 80, respectively) than that of EBL-fabricated device (~2 and ~20). The improved CPER was attributed to greatly enhanced LPER of the VCDGs over a broad visible wavelength range fabricated by NIL than that by EBL (FIG. 18A, FIG. 18B, FIG. 18C, FIG. 18D, and FIG. 18E), which was attributed to smoother VCDG grating lines and smaller optical losses. It was observed the peak wavelength of the max CPER was blue-shifted for the NIL-fabricated device, due to its thicker spacer layer (520 nm) than that of EBL device (400 nm), consistent with simulation results (FIG. 9A, FIG. 9B, FIG. 9C, FIG. 9D, and FIG. 9E). The transmission efficiencies from the NIL device were much lower than the designed value, attributed to the fact that VCDG mold had rounded trench edges after timed-RIE in amorphous silica, which subsequently produced rounded shoulders in the VCDG scaffold and resulted in overhangs on the top Al gratings. Such structural modulation could therefore lower the transmission intensity (FIG. 18A, FIG. 18B, FIG. 18C, FIG. 18D, and FIG. 18E). The optical transmission proved sufficient in this work for polarimetric imaging and accurate Stokes parameter analysis, but can be improved in the future by optimizing the NIL mold fabrication process to improve the straightness of VCDG gratings and minimize the structure rounding at the grating foot.

Imaging Sensor Integration and Characterization

Figure 4C:
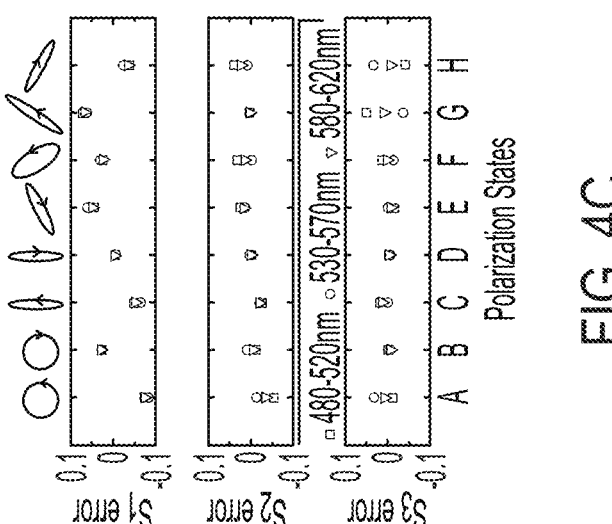
Figure 4B:
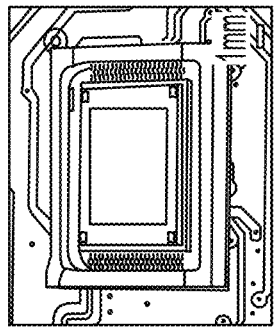
Figure 4B:
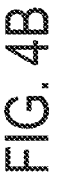
Figure 4A:
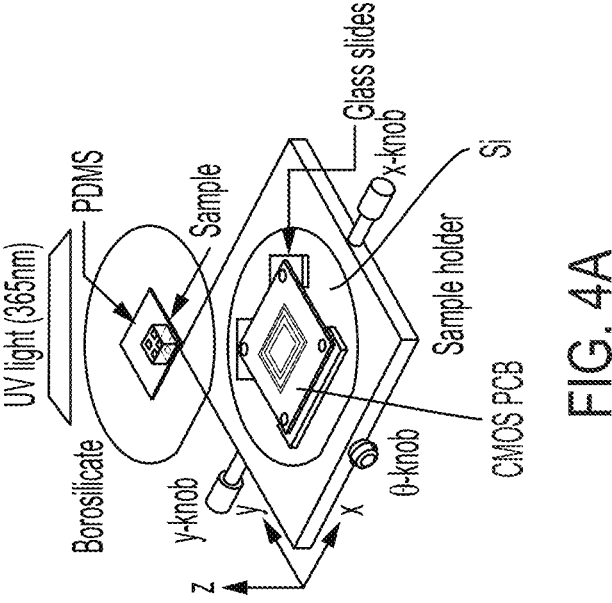
Figure 4D:
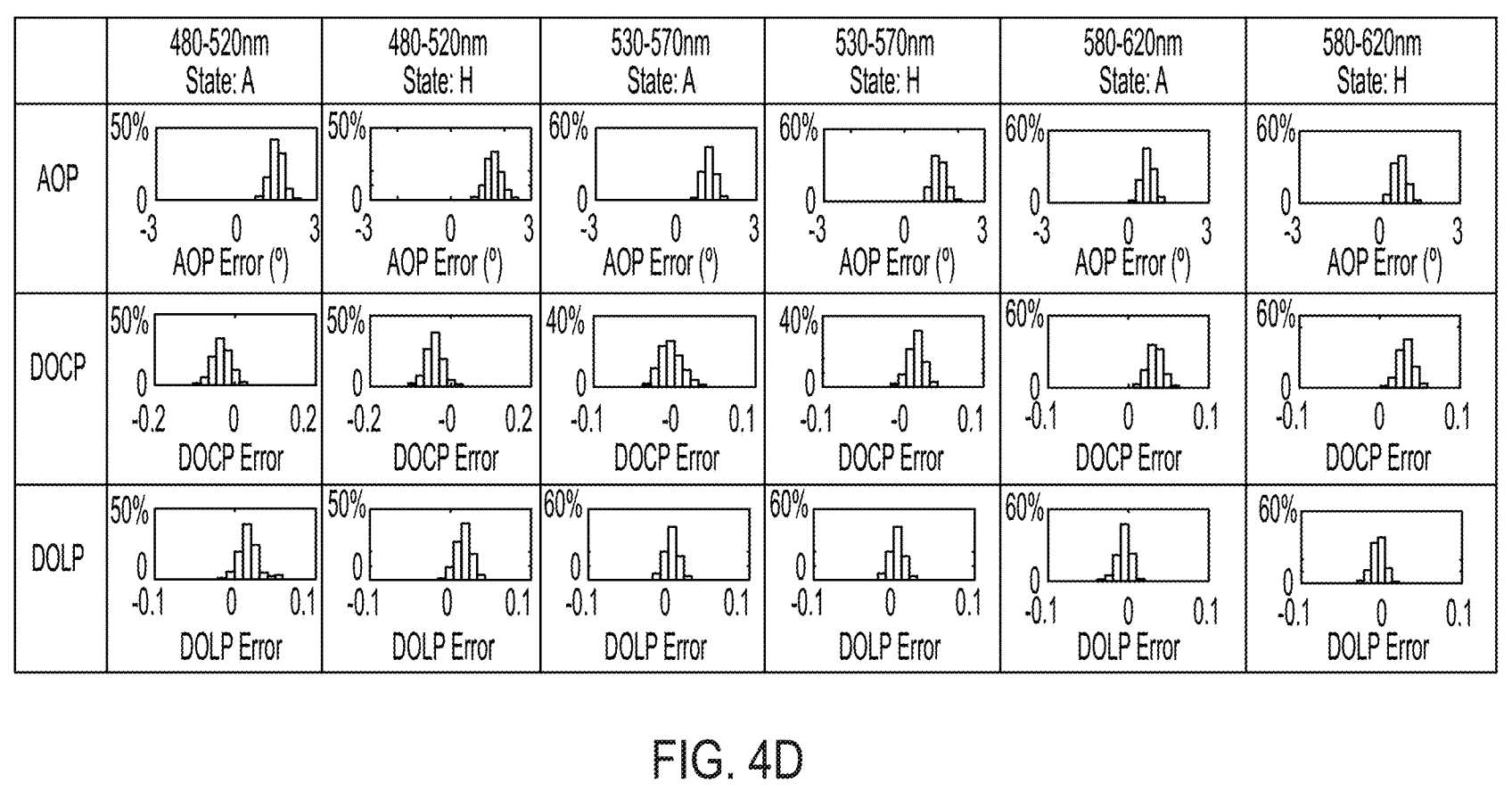
Figure 20:
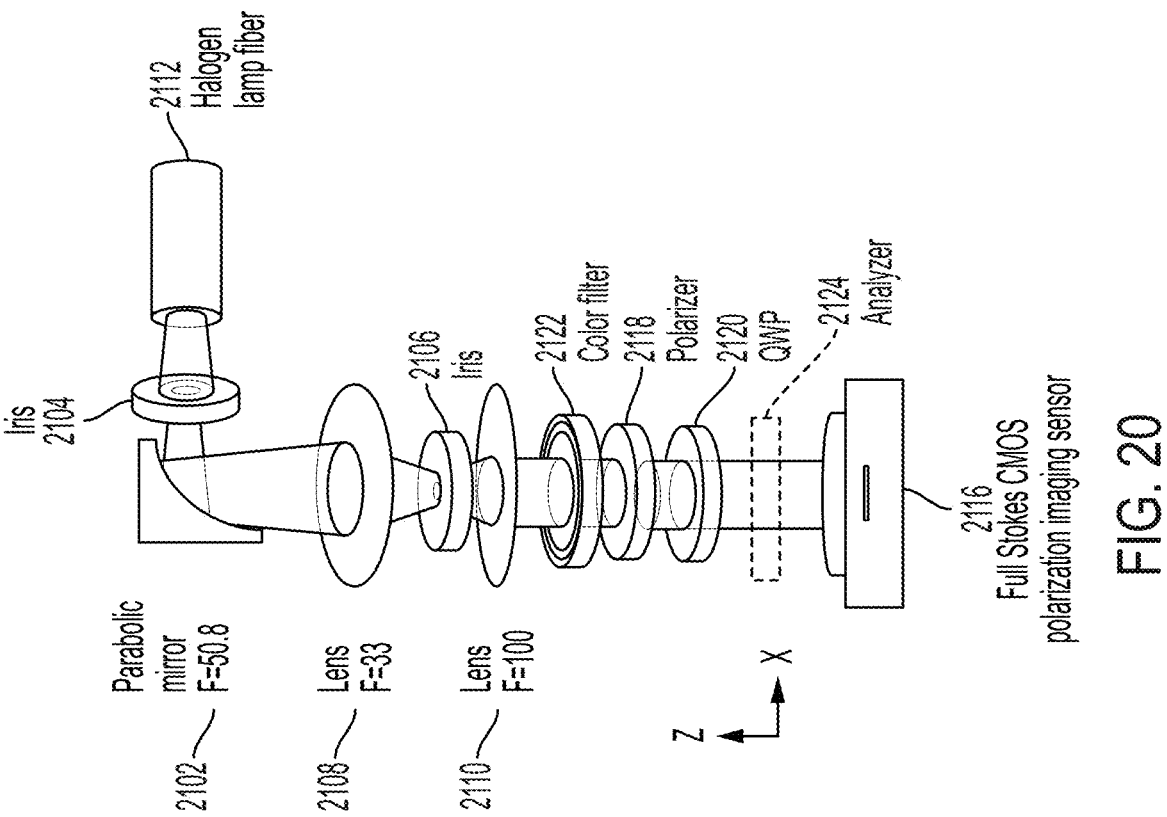
FIG. 20 shows a schematic of full Stokes polarization detection system according to examples of the present disclosure.
Figure 20:
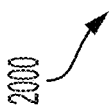

The integrated multi-layer MPFAs were diced (7.2 mm×5.6 mm), optically aligned to the edges of a commercial CMOS sensor (IMX477) on mask aligner, and bonded with UV-curable polymer (FIG. 4A and FIG. 4B, details below). This translational alignment error was on the micrometer scale and the rotational error was about 0.02°, constrained by the lack of more accurate alignment marks (e.g. Moiré patterns) on the CMOS imaging sensors. To further minimize this alignment errors, the layouts of CMOS imaging sensor and the metasurfaces may be co-designed with interferometric Moiré patterns, similar to what we demonstrated for high-accuracy alignment of multi-layer metasurface structures in the previous section. The bonded metasurface polarimetric imaging sensor (or Meta-PolarIm) was characterized to determine its instrument matrix A at different wavelength bands, i.e., blue (480-520 nm), green (530-570 nm), and red (580-620 nm), respectively (method section with details to obtain the instrument matrix A). Thus, the Stokes parameters of any unknown input polarization state S can be obtained using $S=A^{-1}I$, where I represents the intensity vector obtained by all 8 pixels in each super pixel of Meta-PolarIm. Eight polarization states (Tables 8 to 10) were measured with Meta-PolarIm (FIG. 4C) to evaluate the polarization detection accuracy using a customized measurement setup (FIG. 20). The measurement error $\Delta S_i^j$ ($i=1$, 2, 3 for the Stokes parameters; $j=1$, 2 . . . 8 for the polarization states) was calculated by subtracting the measurement data from the reference values obtained from theoretical calculation (methods section). The mean absolute error (MAE) for $S_1$, $S_2$, $S_3$ were found less than 5% for all three wavelength bands (Tables 8-10, Table 4, and FIG. 23A, FIG. 23B, FIG. 23C, FIG. 24A, FIG. 24B, FIG. 24C, and FIG. 25A, FIG. 25B, FIG. 25C). A statistical analysis was also performed for the errors of all pixels in the imaging sensor, including measurement errors for angle of polarization (AOP=½ arctan $S_2/S_1$), degree of circular polarization (DOCP=$S_3/S_0$) and degree of linear polarization (DOLP= $\sqrt{S_1^2+S_2^2}/S_0$) for the eight polarization states over the three wavelength bands (FIG. S18, FIG. S19, and FIG. S20). The results suggested that 90% of the polarimetric imaging pixels have reasonably small measurement errors for DOLP (<3%), AOP (<1.8°) and DOCP (<2% for green and red, <6% for blue) (FIG. 4D). Our results confirmed that this new NIL-based nanomanufacturing strategy is suitable for producing functional multi-layer metasurface devices with reasonably high performance and uniformity across centimeter scale.

Polarization Imaging Application

Figures 5A, 5B, 5C:
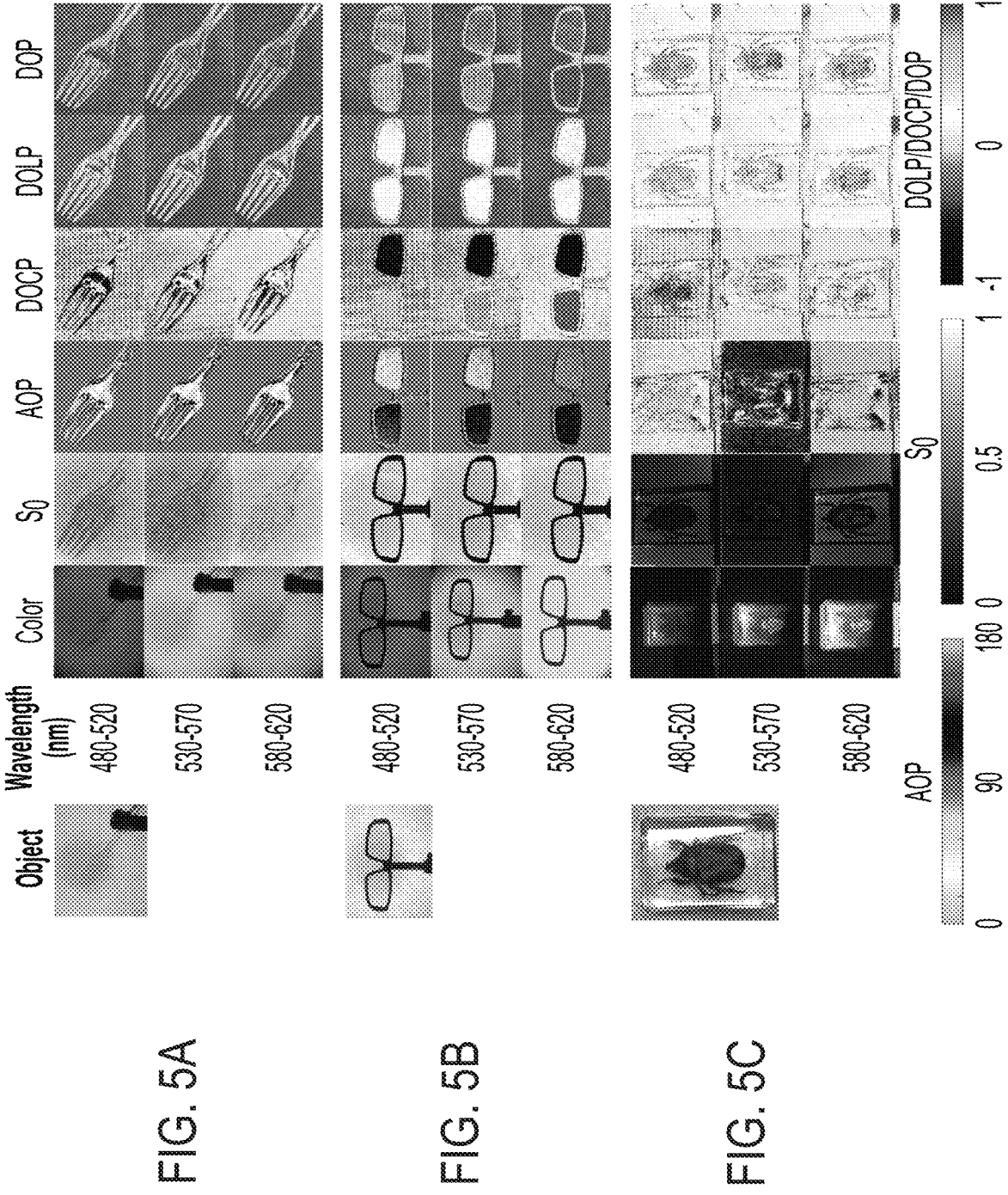
FIG. 5A, FIG. 5B, and FIG. 5C show multi-color full-Stokes polarimetric images of exemplary objects according to examples of the present disclosure.

The chip-integrated full stokes polarimetric imaging sensors have a broad range of applications. As proof-of-concept demonstrations, here we show the imaging results of several objects, including a plastic fork, a pair of 3D glasses, and a beetle (FIG. 5A, FIG. 5B, and FIG. 5C, measurement setup illustrated in FIG. 27A and FIG. 27B) to prove its functionality. The polarimetric images of the plastic fork (FIG. 5A) and 3D glasses (FIG. 5B) were obtained in transmission mode with ~90° LP as the input light. These objects exhibited poor contrasts from the background in signal intensity (S0) in all color bands; however, the AOP and DOCP images showed distinct contrasts. This was attributed to spatially varying optical birefringence (from local stress) in the plastic fork and the designed polarization response from the glasses. In addition, their DOCP images in the blue and red channels produced visually different polarization signals, indicating a wavelength-dependent polarization response. We also took images of a green June beetle sealed in resin in reflection mode (FIG. 5C). The beetle elytra regions also presented a signature of wavelength dependence in DOCP images, showing right-handed CP signal (DOCP>0) in green channel, left-handed (DOCP<0) in blue channel, but only low-contrast signals in red channel. The above imaging results demonstrated the unique advantage of our metasurface-integrated Meta-Polarim to enhance imaging contrast by incorporating full-Stokes polarimetric signals in multi-wavelength channels, which is otherwise not available by conventional imaging sensors.

FIG. 1A, FIG. 1B, FIG. 1C, FIG. 1D, FIG. 1E, and FIG. 1F show example designs of scalable NIL manufacturing for multi-layer metasurface polarization filter arrays (MPFAs) according to examples of the present disclosure. FIG. 1A shows an illustration of integrating the broadband MPFAs onto a CMOS sensor. The MPFAs comprises a Si metasurface level as quarter waveplate (QWP) and a VCDG level as linear polarizers. Here two CP designs targeting green and blue/red spectra (indicated by arrows) are incorporated for the Si metasurface structures. FIG. 1B shows an illustration of the arrangement of each metasurface polarization filter arrays (pixels) within super-pixels (rectangular boxes). Here P1-P4 have only VCDGs transmitting 0°, 90°, 45°, 135° LP light, respectively. P5-P8 are chiral metasurfaces constructed by Si QWP and VCDGs in each pixel that transmit RCP, LCP in red and blue color range (P5 and P6, shaded) and green color range (P7 and P8). FIG. 1C shows a schematic illustration of VCDGs to pass light polarized along x axis but block light polarized along y axis. FIG. 1D shows a schematic of multi-layered CP filter transmitting LCP but blocking RCP incoming light. FIG. 1D shows a co-design to produce the VCDGs on Si metasurface structures based on NIL. The schematic shows the multi-layered CP filter transmitting LCP but blocking RCP incoming light. A co-design concept to produce the VCDGs on Si metasurface structures based on NIL. Here the structural geometries and processing conditions are designed for optical performance. FIG. 1E shows a schematics showing the EBL (top, following orange arrows) and NIL (bottom, following green arrows) based fabrication processes for MPFAs. Here a $1^{st}$ thermal NIL replaces EBL for the fabrication of Si metasurface, and a $2^{nd}$ UV-NIL creates a nanostructured scaffold to be converted into VCDGs after Al evaporation.

Figure 2B:
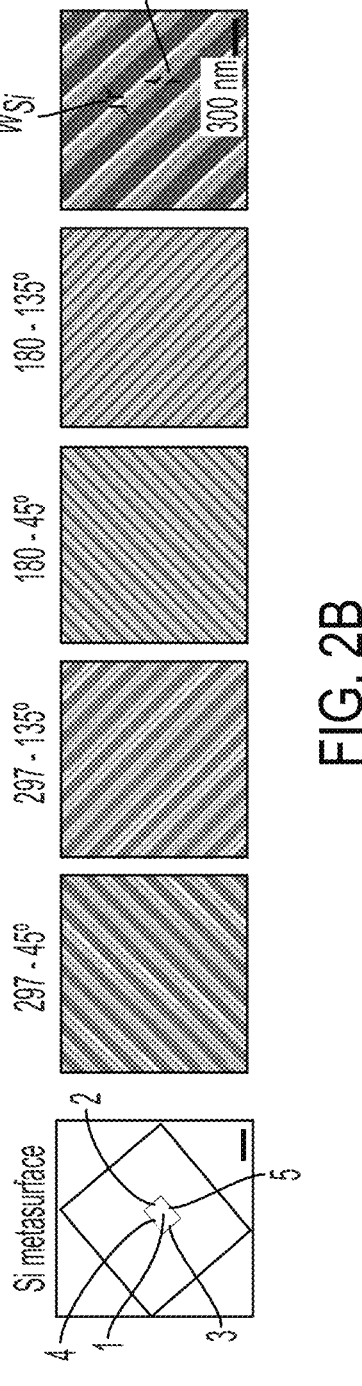
Figures 1, 2, 2C, 3, 4, 5:
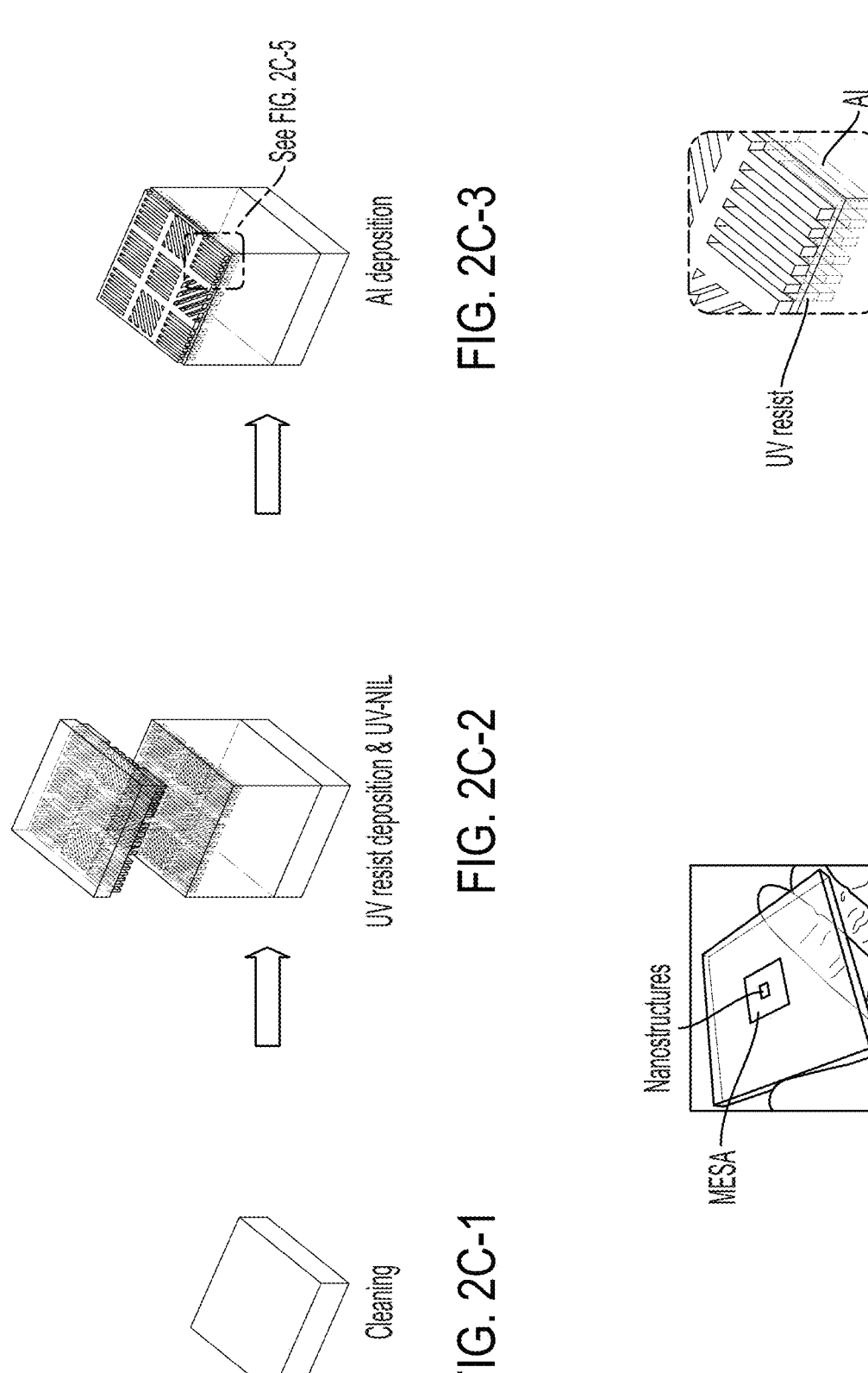
Figure 2D:
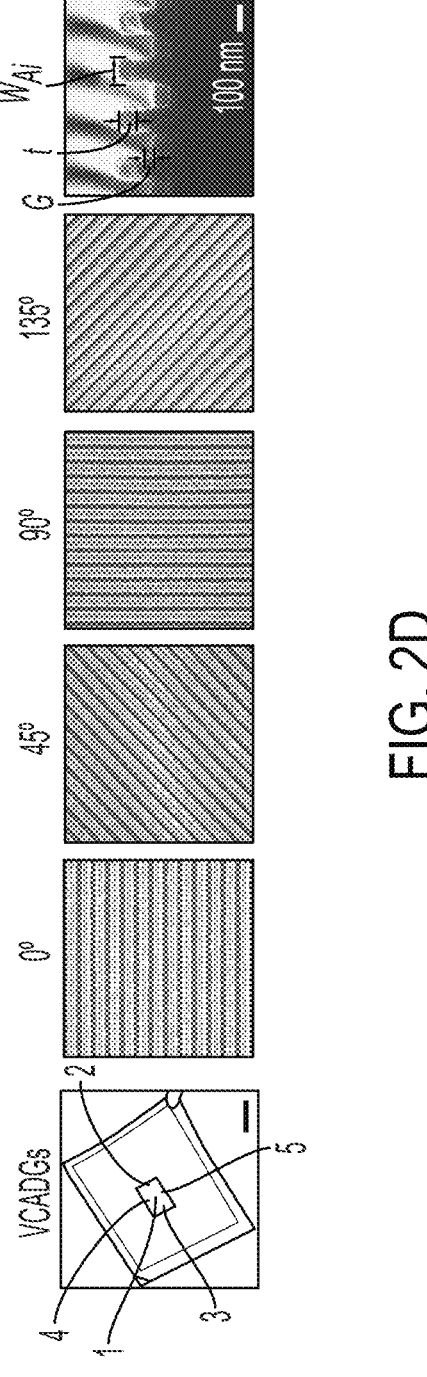

FIG. 2A-1, FIG. 2A-2, FIG. 2A-3, FIG. 2A-4, FIG. 2B, FIG. 2C-1, FIG. 2C-2, FIG. 2C-3, FIG. 2C-4, FIG. 2C-5, and FIG. 2D show example schematics and fabrication results of Si and VCDG metasurface structures according to examples of the present disclosure. FIG. 2A-1, FIG. 2A-2, FIG. 2A-3, FIG. 2A-4 show a fabrication process of Si metasurface via thermal NIL on a tri-layered resist structure, including PMMA (bottom), $SiO_2$ (middle, evaporated) and thermoplastic NIL resist (top). The top-left insert optical image shows the Si metasurface NIL mold made in a Si wafer. FIG. 2B shows fabricated Si metasurface structures on fused silica where the left image shows an optical image of a fabricated Si metasurface chip (scale bar: 5 mm), the middle image shows top-view SEM images of unit pixel arrays, the right image shows side-view SEM image of Si gratings (scale bar: 300 nm). FIG. 2C-1, FIG. 2C-2, FIG. 2C-3, FIG. 2C-4, FIG. 2C-5 show an illustration of fabrication process of VCDGs by UV-NIL followed by Al evaporation, where the top-left insert optical image shows the VCDG mold made in fused silica. FIG. 2D shows fabricated VCDG grating structures, where the left figure shows an optical image of VCDG gratings on a silicon sample for structural inspection (scale bar: 5 mm), the middle figure shows a top-view SEM images of unit pixel arrays, and the right figure shows a cross-sectional view of fabricated VCDGs after Al deposition (scale bar: 300 nm) with the key geometrical dimensions highlighted (g: gaps between the two sets of gratings; t: Al thickness; w: grating width). In FIG. 2B and FIG. 2D, five areas are randomly chosen from the chips to examine the fabrication uniformity: ① Center, ② Right, ③ Left, ④ Top, and ⑤ Bottom. The measured structural dimensions are given in Table 6.

FIG. 3A, FIG. 3B, FIG. 3C, FIG. 3D, FIG. 3E, FIG. 3F, FIG. 3G, and FIG. 3H show NIL integration of multi-layer MPFA chips according to examples of the present disclosure. FIG. 3A shows moiré fringe-based alignment technique to achieve nano-scale overlay accuracy. Optical images of the top and right alignment marks (AM1 and AM2) showed clear interference patterns aligned to designed cross-square marks. The images of cross-square marks were used for alignment accuracy analysis (scale bar: 5 μm). FIG. 3B shows integrated multi-layer metasurface chip, where the left figure shows optical images of the diced chip (top: VCDGs-side up; bottom: α-Si side up. Scale bar: 1 mm), the middle and right figure shows representative cross-sectional SEM image of integrated multi-layer metasurface structures (scale bar: 1 μm for middle image, and 200 nm for right image). FIG. 3C shows microscopic images of fabricated MPFAs, where the top and middle figures show optical images (scale bar: 30 μm for the top and 10 μm for the middle), and the bottom figure shows representative SEM images of a super-pixel comprising eight individual pixels (scale bar: 1 μm). The Si and Al metasurface pixels are indicated by shades overlaid to the SEM images. FIG. 3D shows AFM images of a non-patterned area from MPFA chip fabricated by EBL (top) and NIL (bottom) to show the surface roughness. FIG. 3E shows surface roughness profiles extracted from the AFM images in FIG. 3D. FIG. 3F shows SEM images of Al grating nanostructures from EBL (top) and NIL (bottom) fabricated MPFAs. FIG. 3G and FIG. 3H show a comparison of CPER of LCP filters fabricated by NIL (black) and EBL (red): at 460-550 nm in FIG. 3G and at 550-680 nm in FIG. 3H.

FIG. 4A, FIG. 4B, FIG. 4C, and FIG. 4D show multi-color full-Stokes polarization state detection using metasurface polarimetric imaging sensor according to examples of the present disclosure. FIG. 4A shows a schematic of integrating MPFAs onto CMOS imaging sensor. CMOS circuit board was mounted onto a 3D rotation stage and leveled, then the MPFA chip was aligned and bonded onto the board on a UV mask aligner. FIG. 4B shows an optical image of the integrated Meta-PolarIm. FIG. 4C shows error analysis of multi-color, full-Stokes parameter detection for eight polarization states (A to H). FIG. 4D shows distributions of multi-color AOP, DOCP and DOLP detection errors of all metasurface pixels to analyze polarization states A and H. Here the X-axes represent the errors and Y axes represent the corresponding percentage of pixels.

FIG. 5A, FIG. 5B, and FIG. 5C show multi-color full-Stokes polarimetric images of exemplary objects according to examples of the present disclosure. FIG. 5A and FIG. 5B shows transmission, color filtered, $S_0$, AOP, DOLP, DOCP, and DOP images of a plastic fork in FIG. 5A and a pair of 3D glasses in FIG. 5B. The images were taken with the LP input as background. FIG. 5C shows reflection, color filtered, $S_0$, AOP, DOLP, DOCP, and DOP images of a green june beetle. All the images were taken with LP input light source and non-polarized white paper as background. Color channels were obtained by applying bandpass filters, i.e. 480-520 nm for blue, 530-570 nm for green, and 580-620 nm for red.

TABLE 1

| Designed structural geometries of metasurface filters | | | | | | | |
| --- | --- | --- | --- | --- | --- | --- | --- |
| Filter Function | Working wavelength | Metasurface structure | Period | Grating Width | Duty cycle | Thickness / vertical gap | Spacer layer thickness |
| CP filter for red and blue | Red: 600-670 nm; Blue: 450-520 nm | Si grating VCDG | 297 nm 210 nm | 100 nm 105 nm | 33.6% 50% | 130 nm 80 nm Al; 30 nm vertical gap | 520 nm |

TABLE 1-continued

| Filter Function | Working wavelength | Metasurface structure | Period | Grating Width | Duty cycle | Thickness / vertical gap | Spacer layer thickness |
|---|---|---|---|---|---|---|---|
| | | Designed structural geometries of metasurface filters | | | | | |
| CP filter for green | 520-620 nm | Si grating VCDG | 180 nm 180 nm | 70 nm 90 nm | 38.9% 50% | 130 nm 80 nm Al; 30 nm vertical gap | 520 nm |
| Broadband LP filter | 450-700 nm | VCDG | 210 nm | 105 nm | 50% | 80 nm Al, 30 nm vertical gap | NA |

TABLE 2

Metasurface grating linewidths of NIL-fabricated Si metasurface and VCDGs.

| | Si metasurface: $W_{si}$ | | | | VCDGs: $W_{Al}$ | | | |
|---|---|---|---|---|---|---|---|---|
| | $P_{297,\ 45°}$ | $P_{297,\ 135°}$ | $P_{180,\ 45°}$ | $P_{180,\ 135°}$ | $P_{210,\ 0°}$ | $P_{210,\_90°}$ | $P_{210,\_45°}$ | $P_{210,\_135°}$ |
| ① Center | 111.2 | 112.9 | 91.9 | 91.7 | 116.1 | 115.8 | 109.2 | 109.5 |
| ② Right | 113.4 | 113.7 | 91.9 | 89.6 | 116.2 | 115.9 | 109.1 | 109.3 |
| ③ Left | 113.0 | 113.2 | 92.2 | 90.9 | 116.1 | 115.9 | 109.2 | 109.1 |
| ④ Top | 116.3 | 109.2 | 91.6 | 88.8 | 116.6 | 116.1 | 109.2 | 108.6 |
| ⑤ Bottom | 114.9 | 119.1 | 95.5 | 95.1 | 116.6 | 116.3 | 110.0 | 108.9 |
| Average | 113.8 ± 2.6 | 113.6 ± 3.8 | 92.6 ± 2.1 | 91.1 ± 2.7 | 116.3 ± 1.3 | 116.0 ± 1.3 | 109.4 ± 1.4 | 109.1 ± 1.7 |

TABLE 3

Optically measured cross-square mark gaps and alignment errors. (Unit: μm)

| | x-direction | | | y-direction | | |
|---|---|---|---|---|---|---|
| | $G_1$ | $G_2$ | Error $\Delta_x$ | $G_3$ | $G_4$ | Error $\Delta_y$ |
| $AM_1$ | 1.69 | 1.79 | 0.05 | 1.59 | 1.89 | 0.15 |
| $AM_2$ | 1.64 | 1.84 | 0.10 | 1.64 | 1.85 | 0.10 |
| $AM_3$ | 1.82 | 1.64 | 0.09 | 1.82 | 1.65 | 0.09 |
| $AM_4$ | 1.86 | 1.62 | 0.12 | 1.93 | 1.55 | 0.19 |

TABLE 4

Measurement errors and standard deviations of Stokes parameters and polarization states from eight polarized light input.

| Color: Wavelengths (nm) | $S_1$ | $S_2$ | $S_3$ | DOLP | DOCP | AOP |
|---|---|---|---|---|---|---|
| Blue: 480-520 | 4.13% | 2.39% | 1.93% | 2.45% | 1.93% | 1.25° |
| Green: 530-570 | 4.15% | 1.4% | 0.72% | 2.37% | 0.72% | 1.20° |
| Red: 580-620 | 4.45% | 0.89% | 1.59% | 2.27% | 1.59% | 1.28° |

Conclusions

In summary, we propose and demonstrate a scalable manufacturing strategy of multilayer metasurfaces by synergistically co-designing multi-level NIL processes and metasurface structures. Uniquely, for the first time to our best knowledge, the nanometer-scale lithographic resolution and high-fidelity 3D pattern transfer capabilities of NIL were both explored to design and fabricate multi-layer dielectric and metallic hybrid nanostructures in a single device. In particular, NIL was used as a lithography tool to create a first-layer Si metasurface, and then utilized as a transfer printing technique that preserves both the lateral and vertical geometries of the mold in the NIL resist as a 3D scaffold, which was converted into second-layer VCDG metasurface through a simple Al evaporation without defect-prone etch-ing or liftoff steps. We demonstrated successful fabrication of dense nanostructures (period ~200 nm and critical dimension <100 nm) in micro-sized arrays (4.65×4.65 μm² for VCDG and 7.75×7.75 μm² for Si metasurface) over ~0.2 cm² area with uniform and accurate dimension control (linewidth standard deviation less than 4 nm) and high interlayer alignment accuracy (translational error ~200 nm, rotation error <0.017 degrees). Compared to EBL, the NIL processes were not only much simpler and faster, but also greatly reduced the surface roughness (from ~16 nm to ~1 nm) and improved the CP extinction ratios by ~10 and ~4 times at blue and red color wavelength ranges. The NIL-fabricated MPFAs were bonded to a CMOS imager to create a metasurface polarimetric imaging sensor, i.e. Meta-PolarIm, for compact, single-shot, broadband polarimetric imaging in visible wavelengths, demonstrating a high polarization state measurement accuracy (<5%). These demonstrations proved this new, NIL-based, and simple fabrication method can outperform EBL in manufacturing throughput, cost and device performance. This multilayer NIL-metasurface co-design approach can be adapted to the fabrication of many other metasurface structures, enabling on-chip integration of metasurface devices and their optic, electronic, optoelectronic, or other systems. By speeding up the prototyping process and enabling low-cost, large-scale production of such devices and systems, our design and manufacturing strategy can support future commercialization and broad deployment of metasurface devices in profound applications that are key to next-generation commercial electronics, national security and sustainability.

Experimental Section/Methods

Materials

Poly(benzyl methacrylate) (≥99.0%), Propylene glycol monomethyl ether acetate (≥99.5%), Pentaerythritol tetra acrylate, Isobutyl methacrylate (≥97.0%), Anisole (≥99.7%), and trichloro (1H,1H,2H,2H-perfluorooctyl) silane, Octadecyl acrylate (≥97.0%), and 1H,1H,2H,2H-perfluoro-1-decanol (97%) were purchased from Sigma-Aldrich. BYK-310 and BYK-3570 were purchased from BYK Additives and Instruments. Omnirad 1173 and Omnirad TPO were purchased from IGM Resins. (Acryloxypropyl) methyl siloxane homopolymer was purchased from Gelest. PMMA (950K A2 and 495K A3) was purchased from MicroChem. AMOPRIME was purchased from AMO GmbH. CN-292, SR-9003-B, and CN-975 were purchased from Satomer. AZ-1505 positive photoresist was purchased from MicroChemicals. Gel-box AD-22AS-00 was purchased from Gel-Pak. All chemicals used as received without further purification.

Resist Preparation for NIL & CMOS Bonding Processes

The thermal NIL resist was prepared by diluting thermoplastic polymer (poly-benzyl methacrylate, or PBMA) in Propylene glycol monomethyl ether acetate (PMA) as solvent, with a small amount of surface additive (BYK-310) added for lowering surface tension. The UV-NIL resist was prepared by mixing (Acryloxypropyl) methyl siloxane homopolymer with cross-linker (Pentaerythritol tetraacylated) photo initiators (Omnirad 1173 and Omnirad TPO) and surface additive (BYK-3570) in Isobutyl methacrylate (IBMA). For the CMOS bonding process, another UV-curable polymer was prepared by mixing fast-reacting, low-viscosity, acrylate oligomers (e.g. SR-9003-B and CN-292), a surface additive (1H,1H,2H,2H-Perfluoro-1-decanol BYK-3570), and photo initiators (Omnirad 1173 and Omnirad TPO) into IBMA solvent. All the solutions were stirred overnight at room temperature and filtered before use.

Mold Fabrication for Si Metasurface & VCDGs by EBL

The Si metasurface mold was fabricated by EBL (FIG. 12A, FIG. 12B, FIG. 12C, and FIG. 12D). A polymethyl methacrylate (PMMA) bi-layer was spin-coated (PS-80, Headway Research Inc.) on a cleaned silicon (Si) substrate (1 mm thick, with 80 nm thermal $SiO_2$) and post-baked 5 min at 180° C. Then a 10 nm Cr layer was deposited on the PMMA as a discharging layer for EBL by thermal evaporator (Denton Bench Top Turbo, Denton Vacuum, LLC) at a deposition rate of 0.2 Å $s^{-1}$. Then EBL was carried out (ELS-7000, Elionix) with an acceleration voltage of 100 kV, a beam current of 1 nA, a field size of 300 μm with a minimum step size of 5 nm, and an exposure dose of 1200 μC $cm^{-2}$. After EBL, the Cr discharging layer was stripped and the patterns were developed in a 1:3 ratio (v/v) of methyl isobutyl ketone (MIBK)/isopropyl alcohol (IPA) solution for 2 minutes, rinsed in IPA, and dried with nitrogen. Then, a 10 nm Cr layer was deposited by using thermal evaporator followed by an oxygen plasma descum (Tergeo plasma cleaner, 20 W, 10 sccm, 40 s) process. The sample was immersed in remover PG solution for 15 minutes at 80° C. for the lift-off process, rinsed with IPA and then DI water, and dried. The $SiO_2$ layer was etched by reactive-ion-etcher (RIE) (Plasma Therm 790, $CHF_3$=40 sccm, $O_2$=3 sccm, 40 mTorr, 250 W) using Cr as a hard mask. Finally, the Cr hard mask was stripped by Cr etchant.

To fabricate NIL mold for the VCDGs, a thick fused silica wafer (6 mm) was chosen as the substrate (Supplementary Figure S7) to minimize mold bending during NIL. Then fused silica dicing, sample cleaning, EBL writing, development, Cr evaporation, and lift off were carried following the same process mentioned above to produce the nanostructured Cr hard masks. The EBL exposure doses were adjusted for designed structural dimensions. The Cr mask was used to etch 150 nm deep into fused silica by RIE using the same recipe as aforementioned. Differently, a mesa structure (roughly 1.5 $cm^2$, height=2 μm) was intentionally fabricated in an additional RIE process to better accumulate pressure in the nanopatterned region. The mesa structure provided more uniformly imprinted structures using our imprinter. Both Si and fused silica molds were solvent and RCA-1 cleaned, and they were treated using trichloro(1H,1H,2H,2H-perfluorooctyl) silane in the vacuum oven for 30 min at 100° C. to form the self-assembled monolayers (SAMs) on the surface, which acted as an anti-sticking layer during the NIL process.

Fabrication of Si Metasurface in a Tri-Layer Scheme

First, 130 nm α-Si was deposited on the pre-cleaned fused silica sample using plasma-enhanced CVD (PECVD) (Oxford Plasmalab 100, $SiH_4$=480 sccm, 1200 mTorr, 15 W, 350° C.), followed by 60 nm $SiO_2$ deposition using the same tool ($SiH_4$=170 sccm, $N_2O$=710 sccm, 1000 mTorr, 20 W, 350° C.) without breaking chamber vacuum. After the substrate preparation, a tri-layer structure was employed for the thermal NIL process. Namely, a PMMA layer (950 k A2, thickness of 90 nm) was spin-coated and post-baked 5 min at 200° C., followed by evaporation of ~15 nm $SiO_2$ mid-layer (Kurt J. Lesker) at a deposition rate of 0.5 Å $s^{-1}$, and then spin-coating of thermal NIL resist and post-baking (5 min at 180° C.). The thermal NIL was carried out using a nanoimprinter (THU400, Zhenjiang Lehua Electronic Technology Co. Ltd.) at a nominal temperature reading of 55° C. and pressure of 750 KPa for 15 min in vacuum. Then the residual layer was RIE etched by oxygen plasma ($O_2$=10 sccm, 10 mTorr, 100 W), where $SiO_2$ mid-layer acted as the etch-stop layer to enable sufficient over etching time for uniform removal of the residual layer. The nanopatterns in the resist were transferred to $SiO_2$ mid-layer by another RIE etching ($CHF_3$=25 sccm, $O_2$=1 sccm, 10 mTorr, 100 W), and the PMMA bottom layer was RIE etched by oxygen plasma ($O_2$=10 sccm, 10 mTorr, 30 W). The high etching selectivity between $SiO_2$ and PMMA is beneficial for reliable patterning in a relatively thick PMMA layer, and helps form a mushroom-like structure in the $SiO_2$/PMMA stack to minimize accumulation of metal on the sidewall of PMMA, which facilitated high-yield lift-off process and minimized feature distortion. The fabricated sample was immersed in remover PG solution for 15 minutes at 80° C. for lift-off, and later rinsed with IPA and DI water, followed by 10 nm Cr layer deposition by thermal evaporation. The 60 nm $SiO_2$ hard mask layer was etched by RIE ($CHF_3$=40 sccm, $O_2$=3 sccm, 40 mTorr, 250 W) using Cr as a hard mask, and Cr was stripped by chromium etchant. Finally, the 130 nm α-Si film was etched using inductively coupled plasma (ICP) RIE (PlasmaTherm Apex ICP, $Cl_2$=100 sccm, Ar=5 sccm, 10 mTorr, 250 W) using $SiO_2$ as a hard mask to complete Si metasurface fabrication. The $SiO_2$ hard mask layer was left without intentional removal, but its thickness was taken into account of the whole spacer layer thickness calculation.

Fabrication of VCDGs Using UV-NIL

The VCDGs were fabricated in a significantly simpler fabrication process. First, adhesion promoter (AMOPRIME) was spin-coated on pre-cleaned fused silica chips (some with Si metasurface for device integration and some others without Si metasurface used as process monitors) and post-baked 10 min at 115° C. on a hot plate. The prepared UV-NIL resist was spin-coated on the substrate, followed by UV-NIL using the fabricated fused silica VCDG mold on mask aligner (MJB4, Suss MicroTec). Three different fringes were visualized on the mask aligner TV monitor for the case of alignment. Once alignment was verified, 1.5 s UV exposure was used to cross-link the resist, which turned to be a polymer similar to $SiO_x$ in optical index after curing (UV-NIR spectroscopic ellipsometry, J. A. Woollam, M-2000) (Supplementary Figure S8). The UV resist had a low viscosity to easily fill, desired for high-fidelity pattern transfer at relatively low pressure. After UV-NIL, the printed resist scaffold was treated using a mild oxygen plasma process ($O_2$=10 sccm, 10 mTorr, 30 W) to activate the hydroxyl groups on the surface. A layer of Cr (2 nm) was evaporated followed by Al deposition at 2.5 Å $s^{-1}$ to form the VCDG gratings. A high vacuum level (1 to $3\times10^{-7}$ Torr) was useful to obtaining smoother surface morphology of VCDG (supplementary Figure S9) by decreasing residual gases in the chamber and reducing contaminants. Finally, a 200 nm $SiO_2$ layer was deposited as an encapsulation layer to avoid further oxidation of the Al surface by using a radio-frequency (RF) sputtering system (Kurt J. Lesker) at a deposition rate of 0.5 Å $s^{-1}$.

Vertical Alignment and Integration of VCDGs on Si Metasurface

Here two sets of gratings with slightly different periods (e.g. $P_1$ of 4 µm on the substrate and from Si metasurface mold, and $P_2$ of 4.2 µm on the VCDG mold) acted as the Moiré marks. The two gratings would produce periodic stripes under illumination, with the period $P_{fringe}$ calculated as $P_{fringe}$=$P_1 \cdot P_2/(P_2-P_1)$=84 µm, when the substrate and mold were brought close to each other, e.g. with a small gap less than 10 µm. To minimize the alignment error, four groups of alignment markers ($AM_1$, $AM_2$, $AM_3$, and $AM_4$, respectively) were placed next to the NIL-patterned area, in another word separated by 7.2 mm horizontally and 5.6 mm vertically from each other. Noticeably, our process differ from previously studies that required metal deposition, because the large optical index difference from α-Si metasurface (n=3.58 at 632 nm) to the substrate $SiO_2$ (n=1.49 at 632 nm) provided distinguishable contrast and eliminated the needs of metallic coating.

CMOS Bonding Process

The integrated multilayer metasurface chip was diced and bonded onto the customized CMOS sensor as follows. Here AZ-1505 photoresist (PR) was spin-coated on both sides of the fabricated sample and post-baked 1 min at 90° C. as a protection layer during chip dicing, then the sample was diced into 7.2 mm×5.6 mm rectangular shape using a dicing saw (DAD320, DISCO Corporation). Afterwards, the sample was immersed in acetone to remove PR, rinsed in IPA, and dried with nitrogen blow. A thin PDMS film of ~1 mm was detached from a commercially available Gel-box and attached to a 4-inch borosilicate wafer as an intermediate host layer for the diced chip. A customized CMOS sensor was brought together with a printed circuit board (PCB), and mounted onto a customized support by Kapton tape, formed by stacked glass slides taped on a 4-inch Si wafer, to maintain the surface evenness considering that the backside of PCB had protruding electrical components. Then the UV-curable polymer was spin-coated on the CMOS imager, and the CMOS PCB was loaded into the mask aligner (MJB4, Suss MicroTec). After precise alignment the CMOS PCB was moved up in the z-direction and made contact with the metasurface chip, initiating polymer flow. Then the polymer was cross-linked under UV exposure (365 nm, 350 W) for 10 min to ensure appropriate bonding strength.

Structural and Material Characterization

The linewidth dimension and surface morphology of the α-Si metasurface and the Al VCDGs were inspected by scanning electron microscopy (SEM, Hitachi S-4700 FESEM) with an acceleration voltage of 15 keV and current of 10 µA. A thin layer of Au/Pd was sputtered (Cressington sputter coater 108) on the α-Si metasurface sample to enhance imaging resolution prior to SEM measurements. Optical properties (refractive index n, extinction coefficient k) of deposited α-Si and $SiO_2$ and cured UV resist films were measured by UV-NIR spectroscopic ellipsometry (J. A. Woollam, M-2000). Olympus BX53 fluorescent microscope coupled Horiba iHR320 imaging spectrometer was utilized to record all the optical images of fabricated samples for the calculation of alignment accuracy. It is noted that the electron microscopy would not be able to effectively detect the α-Si metasurface buried deep under the thick spacer layer (~500 nm) after the UV NIL effectively planarized the surface topography. To standardize alignment measurement, the optical images were converted to 8-bit black and white images and processed by setting a color threshold. The transmittance spectra were measured by the same tool, then LPER and CPER were calculated.

Metasurface Design and Simulation

The finite-difference time-domain (FDTD) simulations were carried out to calculate transmission efficiency and LPER and CPER of the metal-dielectric hybrid chiral metasurface. All the simulations were conducted with empirically measured optical indexes of each material. Periodic boundary conditions and perfectly matched layers were used within a unit cell along the in-plain direction. The plane wave was applied along the grating width and length direction to calculate LPER and efficiency and super-positioned two orthogonally linearly polarized plane waves were used to represent RCP/LCP light input. In initial simulations, ideal VCDG gratings without edge rounding were considered (FIG. 7A, FIG. 7B, and FIG. 7C, FIG. 8A and FIG. 8B, FIG. 9A, FIG. 9B, FIG. 9C, FIG. 9D, and FIG. 9E, FIG. 10A, FIG. 10B, FIG. 10C, FIG. 10D, FIG. 10E, and FIG. 10F, FIG. 11A, FIG. 11B, FIG. 11C, FIG. 11D, and FIG. 11E). Later, the non-ideal structural rounding effect and non-straight α-Si grating sidewalls (assumed 6° off surface normal) were considered in the simulations, based on experimental characterizations. The mesh sizes were set as 5 nm for higher accuracy.

Reference Polarization State Value Calculation

Stokes parameters of 16 reference polarization states input were theoretically calculated based on the linear retardance, transmission efficiency, bandwidth of the color filters, the angle of linear polarizer, and super achromatic quarter-wave plate. Firstly, transmission efficiency and linear retardance dispersion data of SAQWP05M-700 (Thorlabs) was obtained from Thorlabs website. Stokes parameter of light transmitted through the linear polarizer with angle of $\theta_1$ and quarter waveplate with fast axis along angle $\theta_2$ can be modelled using the Mueller matrix of a linear diatenuator and a linear retarder:

$$M_{LP} = \frac{1}{2} \times \tag{1}$$

$$\begin{bmatrix} q+r & (q-r)\cos2\theta_1 & (q-r)\sin2\theta_1 & 0 \\ (q-r)\cos2\theta_1 & (q+r)\cos^2 2\theta_1 + \sqrt{qr}\sin^2 2\theta_1 & (q+r-2\sqrt{qr})\sin2\theta_1\cos2\theta_1 & 0 \\ (q-r)\sin2\theta_1 & (q+r-2\sqrt{qr})\sin2\theta_1\cos2\theta_1 & (q+r)\sin^2 2\theta_1 + \sqrt{qr}\cos^2 2\theta_1 & 0 \\ 0 & 0 & 0 & 2\sqrt{qr} \end{bmatrix}$$

Here, $\theta_1$ represents the transmission axis of the linear polarizer, q and r represents the maximum and minimum transmission efficiency of linear polarizer, as extracted from data provided by Thorlabs website. LPER can be expressed as LPER=q/r.

$$M_{retarder} = \tag{2}$$

$$\begin{bmatrix} 1 & 0 & 0 & 0 \\ 0 & \cos^2 2\theta_2 + \sin^2 2\theta_2 \cos\delta & \sin 2\theta_2 \cos 2\theta_2 (1-\cos\delta) & -\sin 2\theta_2 \sin\delta \\ 0 & \sin 2\theta_2 \cos 2\theta_2 (1-\cos\delta) & \sin^2 2\theta_2 + \cos^2 2\theta_2 \cos\delta & \cos 2\theta_2 \sin\delta \\ 0 & \sin 2\theta_2 \sin\delta & -\cos 2\theta_2 \sin\delta & \cos\delta \end{bmatrix}$$

Here, $\theta_2$ represents the angle fast axis of the retarder, $\delta$ represent retardance, as extracted from data provided by Thorlabs website.

$$S_{in}^{\lambda} = M_{retarder} \cdot M_{LP} \cdot \begin{bmatrix} 1 \\ 0 \\ 0 \\ 0 \end{bmatrix} \tag{3}$$

It is noteworthy that both $\delta$ and fast axis angle $\theta_2$ are wavelength dependent. Final Stokes parameters were averaged after we obtained $S_{in}$ at each wavelength accounting for wavelength dependency of $\delta$ and $\theta_2$ using the equation:

$$S_{in} = \frac{\sum_{i=1}^{n} S_{in,i}^{\lambda}}{n} \tag{4}$$

Device Instrument Matrix Calibration Process at Red, Green, Blue Colors

For an arbitrary input polarization state $S_\lambda$ with input wavelength of $\lambda$ (nm), the captured intensity of a super-pixel as a vector I can be written as the equation below:

$$I = \begin{bmatrix} s_0^{0G\_out} \\ s_0^{90G\_out} \\ s_0^{135G\_out} \\ s_0^{45G\_out} \\ s_0^{LCP\_RB} \\ s_0^{RCP\_RB} \\ s_0^{LCP\_G} \\ s_0^{RCP\_G} \end{bmatrix} = \begin{bmatrix} m_{11}^{0G} & m_{12}^{0G} & m_{13}^{0G} & m_{14}^{0G} \\ m_{11}^{90G} & m_{12}^{90G} & m_{13}^{90G} & m_{14}^{90G} \\ m_{11}^{135G} & m_{12}^{135G} & m_{13}^{135G} & m_{14}^{135G} \\ m_{11}^{45G} & m_{12}^{45G} & m_{13}^{45G} & m_{14}^{45G} \\ m_{11}^{LCP\_RB} & m_{12}^{LCP\_RB} & m_{13}^{LCP\_RB} & m_{14}^{LCP\_RB} \\ m_{11}^{RCP\_RB} & m_{12}^{RCP\_RB} & m_{13}^{RCP\_RB} & m_{14}^{RCP\_RB} \\ m_{11}^{LCP\_G} & m_{12}^{LCP\_G} & m_{13}^{LCP\_G} & m_{14}^{LCP\_G} \\ m_{11}^{RCP\_G} & m_{12}^{RCP\_G} & m_{13}^{RCP\_G} & m_{14}^{RCP\_G} \end{bmatrix} \times \tag{5}$$

$$\begin{bmatrix} S_0 \\ S_1 \\ S_2 \\ S_3 \end{bmatrix} = A_\lambda \times S_\lambda$$

where matrix $A_\lambda$ is wavelength dependent instrument matrix of the metasurface filter array. $S_\lambda$ can be inversely calculated by solving the equation 5:

$$S_\lambda = A_\lambda^{-1} \times I \tag{6}$$

To obtain $A_\lambda$ at red, green, and blue color ranges, we used three color filters (FBH450-40, FBH550-40, FBH600-40) with bandwidths of 40 nm to select targeted wavelength range respectively. For each color, 10 pre-known polarization states $S_{\lambda,4\times10}$ was measured by the device respectively to form an intensity matrix $I_{cam,6\times10}$, the instrument matrix $A_\lambda$ can then be obtained using the equation:

$$A_\lambda = I_{cam,6\times10} \times S_{\lambda,4\times10}^{T-1} \tag{7}$$

Here, the rank of $$S_{\lambda,4\times10}^T$$

should be 4 to make sure $S_{\lambda,4\times10}^T$ is invertible.

Stokes Parameter Analysis

A moving window spatial scanning discussed (FIG. 1B) was first applied during the calibration process to increase the imaging resolution of the polarimetric imaging sensor to 671 by 509 pixels (or polarization filters). The measurement result $$S_i^j$$

was then averaged out from all of pixels:

$$S_i^j = \frac{\sum_{m=1,n=1}^{o,p} S_{i_{m,n}}^j / S_{0_{m,n}}^j}{o \times p},$$

i=1, 2, 3, j=1, 2 . . . 8, n=671, p=509, where $$S_{i_{m,n}}^j / S_{0_{m,n}}^j$$

denotes the normalized Stokes parameters measured by one pixel. FIG. 4C shows the measurement error $$\Delta S_i^j$$

at normal incidence under multi-color input, where $$\Delta S_i^j$$

is defined as:

$$\Delta S_i^j = S_i^j - S_{R_i}^j \, (i = 1, 2, 3, j = 1, 2 \ldots 8), \text{ and } S_{R_i}^j$$

denotes reference values of input Stokes parameters.

Scalable Nanoimprint Manufacturing of Functional Multi-Layer Metasurface Devices

Figures 6A, 6B, 6C:
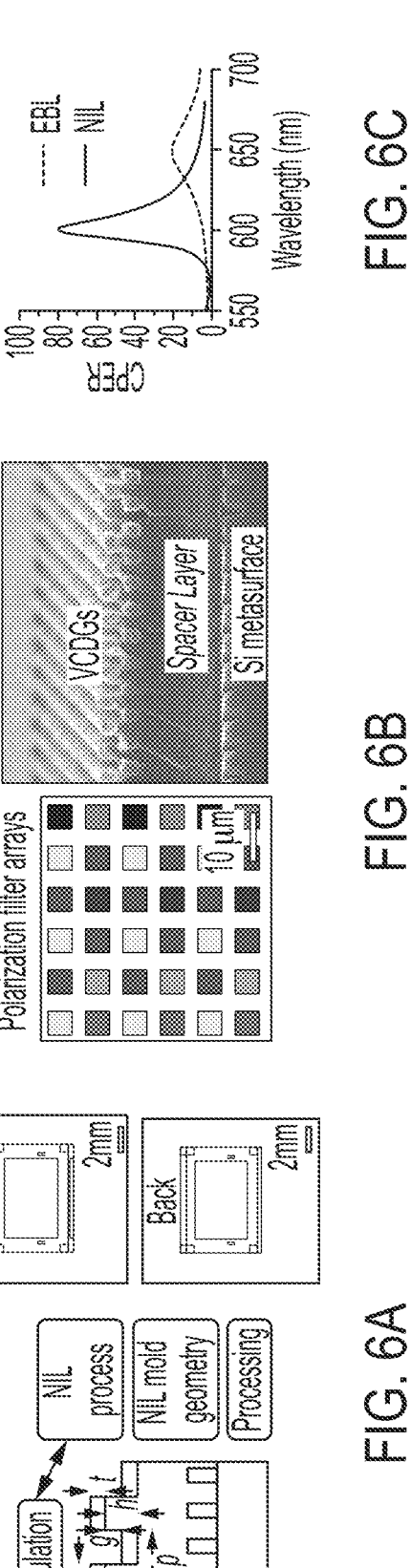
FIG. 6A, FIG. 6B, FIG. 6C show a multi-layer metasurface and NIL co-design, polarization arrays, and a plot of CPER versus wavelength according to examples of the present disclosure.

FIG. 6A, FIG. 6B, FIG. 6C show a multi-layer metasurface and NIL co-design, polarization arrays, and a plot of CPER versus wavelength according to examples of the present disclosure.

Figure 7A:
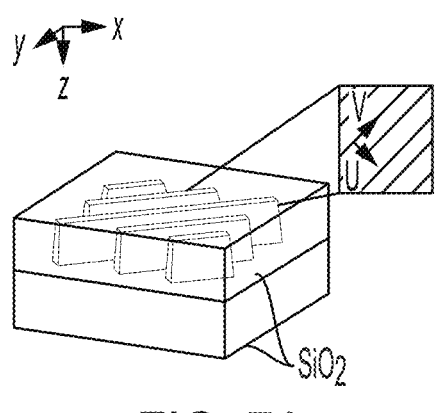
FIG. 7A, FIG. 7B, and FIG. 7C show FDTD-simulation showing the optical response of the Si nanograting metasurface according to examples of the present disclosure.
Figure 7B:
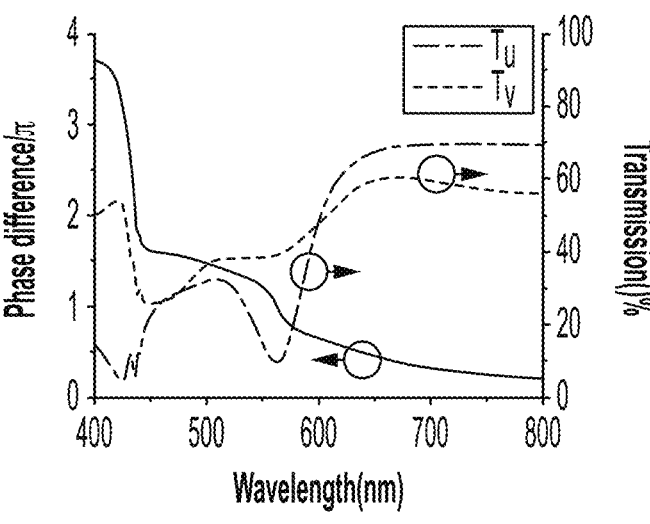
Figure 7C:
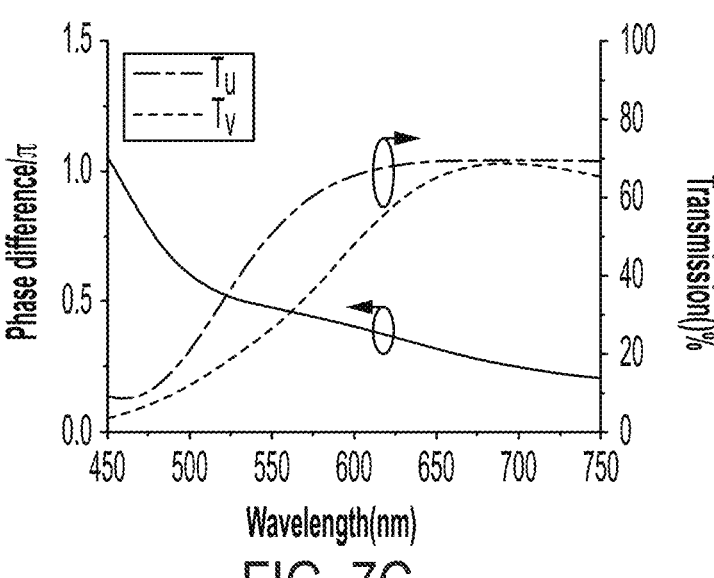

Scalable Nanoimprint Manufacturing of Functional Multi-Layer Metasurface Devices Design of Broadband VCDG and Chiral Metasurface Structures FIG. 7A, FIG. 7B, and FIG. 7C show FDTD-simulation showing the optical response of the Si nanograting metasurface according to examples of the present disclosure. FIG. 7A shows schematic of Si nanogratings. Here the incident light is along z direction. U and V directions are in the X-Y plane but pointing perpendicular to and parallel to the Si gratings. FIG. 7B shows blue/red CP filter design: calculated phase difference (left Y-axis, black line) and transmission of $E_U$ and $E_V$ (right Y-axis, line for $E_V$ and line for $E_U$). FIG. 7C shows green CP filter design: phase difference (left Y-axis, black line) and transmission amplitude of $E_U$ and $E_V$ (right Y-axis, line for $E_V$ and line for $E_U$). The Si gratings have a period of 297 nm and width of 100 nm. (c) Green CP filter design: phase difference (left Y-axis, black line) and transmission amplitude of $E_U$ and $E_V$ (right Y-axis, line for $E_V$ and line for $E_U$). The Si gratings have a period of 180 nm and width of 70 nm.

FIG. 8A and FIG. 8B show FDTD-simulated transmission and CP extinction ratio (CPER) of broadband a-Si metasurface designed for CP detection according to examples of the present disclosure. FIG. 8A shows red and blue color design. The period, width, and thickness of the a-Si gratings are 297 nm, 100 nm, and 130 nm, respectively. The spacer layer thickness is 520 nm, and the period, duty cycle, and vertical nanogap of bottom layer VCDG are 210 nm, 50%, and 30 nm respectively. FIG. 8B shows green color design. The period, width, and thickness of the a-Si gratings are 180 nm, 70 nm, and 130 nm, respectively. The spacer layer thickness is 520 nm, and the period, duty cycle, and vertical gap of bottom layer VCDG are 180 nm, 50%, and 30 nm, respectively. Curves: transmission for RCP and LCP incoming light. Black curve: CPER of the two CP lights.

Figures 9A, 9B, 9C, 9D, 9E:
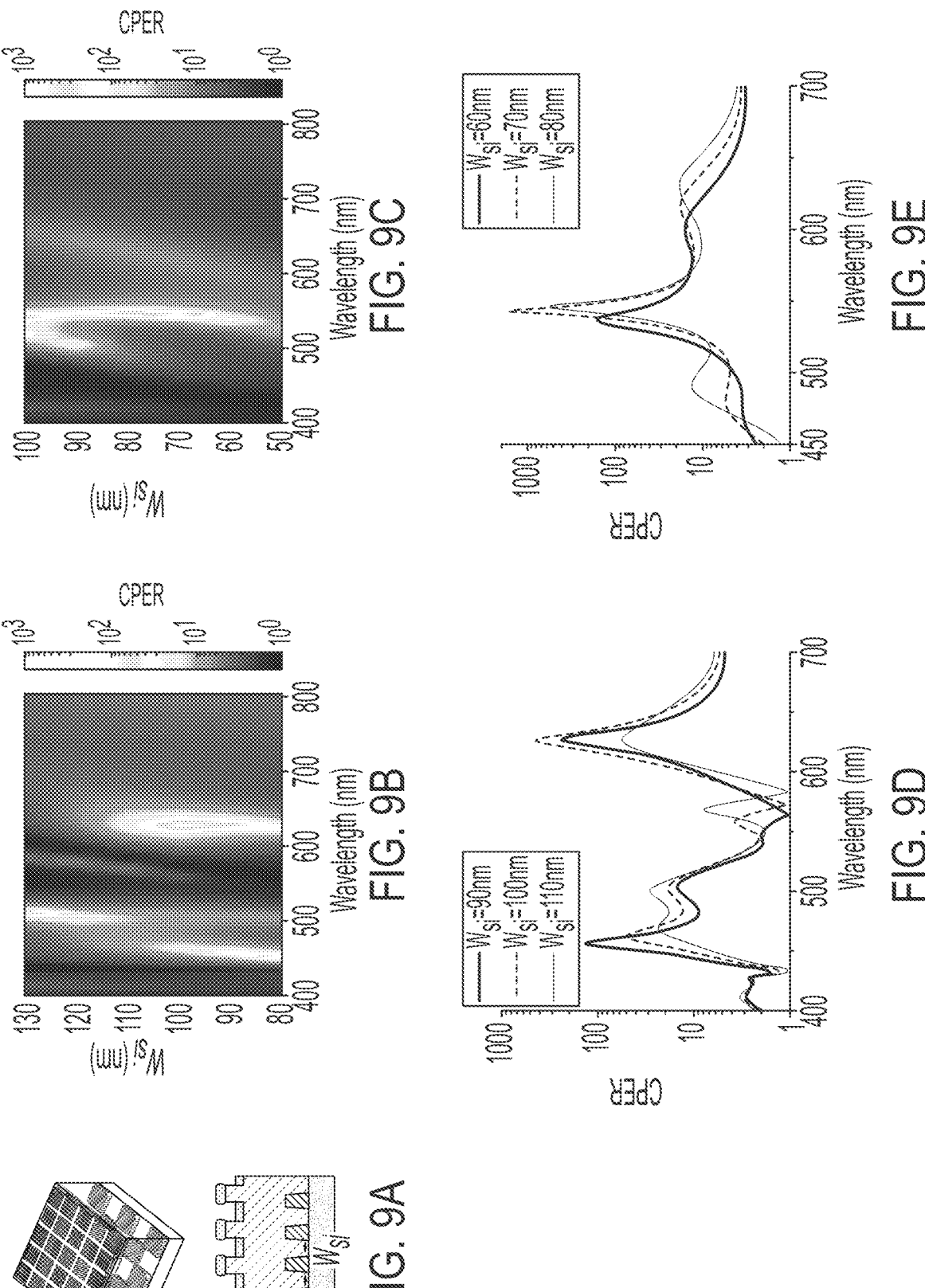
FIG. 9A, FIG. 9B, FIG. 9C, FIG. 9D, and FIG. 9E show FDTD-calculated CPER of CP polarization filter with different Si grating widths ($w_{si}$) according to examples of the present disclosure.

FIG. 9A, FIG. 9B, FIG. 9C, FIG. 9D, and FIG. 9E show FDTD-calculated CPER of CP polarization filter with different Si grating widths ($w_{si}$) according to examples of the present disclosure. FIG. 9A shows a schematic to show the definition of Si grating width, here $w_{si}$ is defined as the bottom width of trapezoidal shaped Si grating. FIG. 9B shows simulated CPER dependence on Si grating width for red color and blue color CP polarization filter. Grating period: 297 nm. FIG. 9C shows simulated CPER dependence on Si grating width for green color CP polarization filter. Grating period: 180 nm. FIG. 9D and FIG. 9E show plots of CPER verses wavelength.

Figures 11A, 11B, 11C, 11D, 11E:
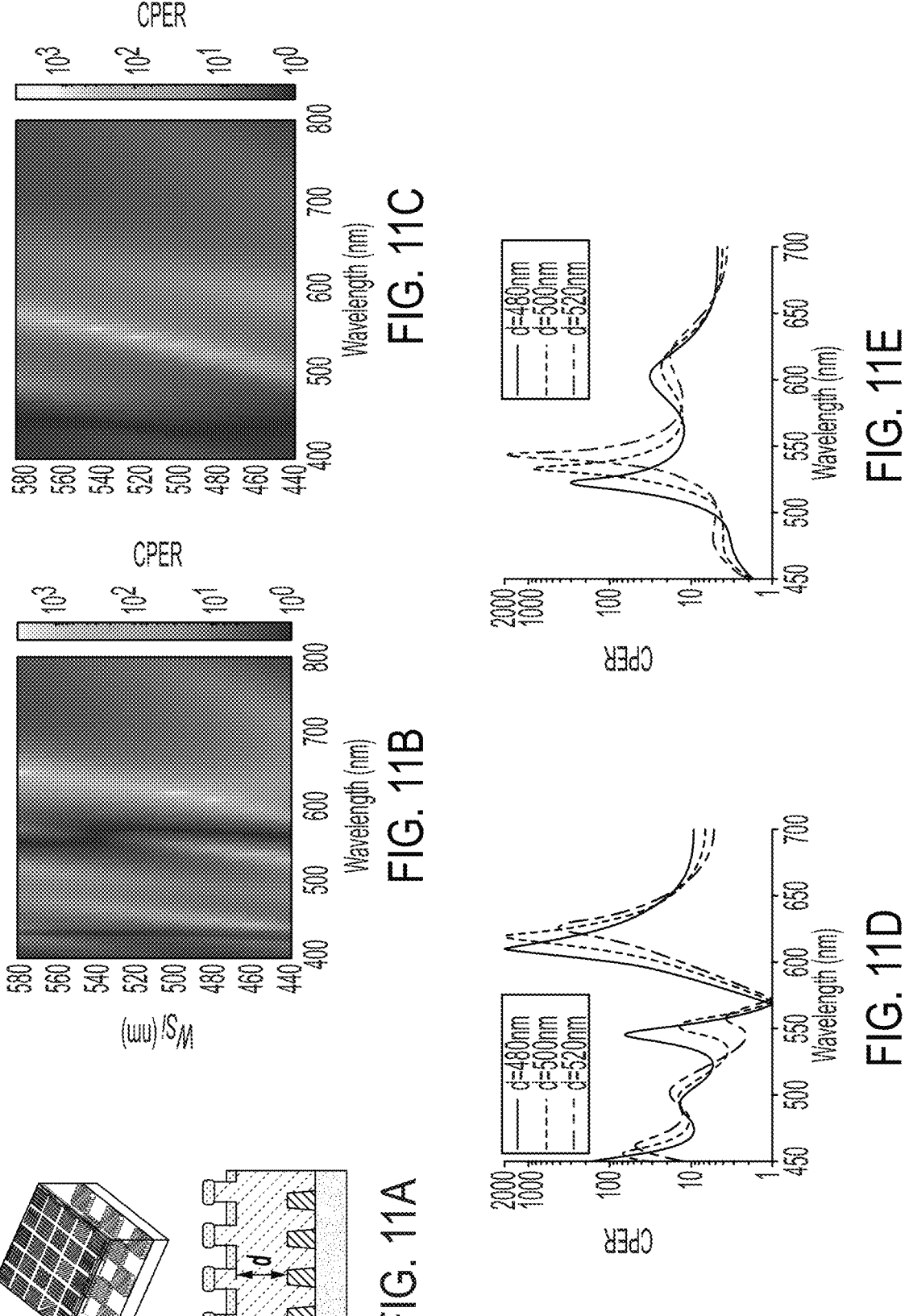
FIG. 11A, FIG. 11B, FIG. 11C, FIG. 11D, and FIG. 11E show FDTD-calculated CPER of CP polarization filter with different spacer layer thickness (d) according to examples of the present disclosure.

The design tolerance can be evaluated by assuming small structural dimensional variations from fabrication, e.g., 10 nm linewidth increase or decrease. For example, as shown in FIG. 11B, a change in the linewidth from 100 nm to 90 nm or 110 nm, would change the bandwidth (defined by CPER>10) of CP filter from 64 nm to 51 nm and 63 nm, while the operation wavelength remains unchanged at 626 nm. Similarly, as shown in FIG. 11C, a change in the linewidth from 70 nm to 60 nm or 80 nm for the green design would change the bandwidth of CP filter from 119 nm to 104 nm and 129 nm and shift the operation wavelength from 542 nm to 536 nm and 546 nm, respectively.

Figures 10A, 10B, 10C:
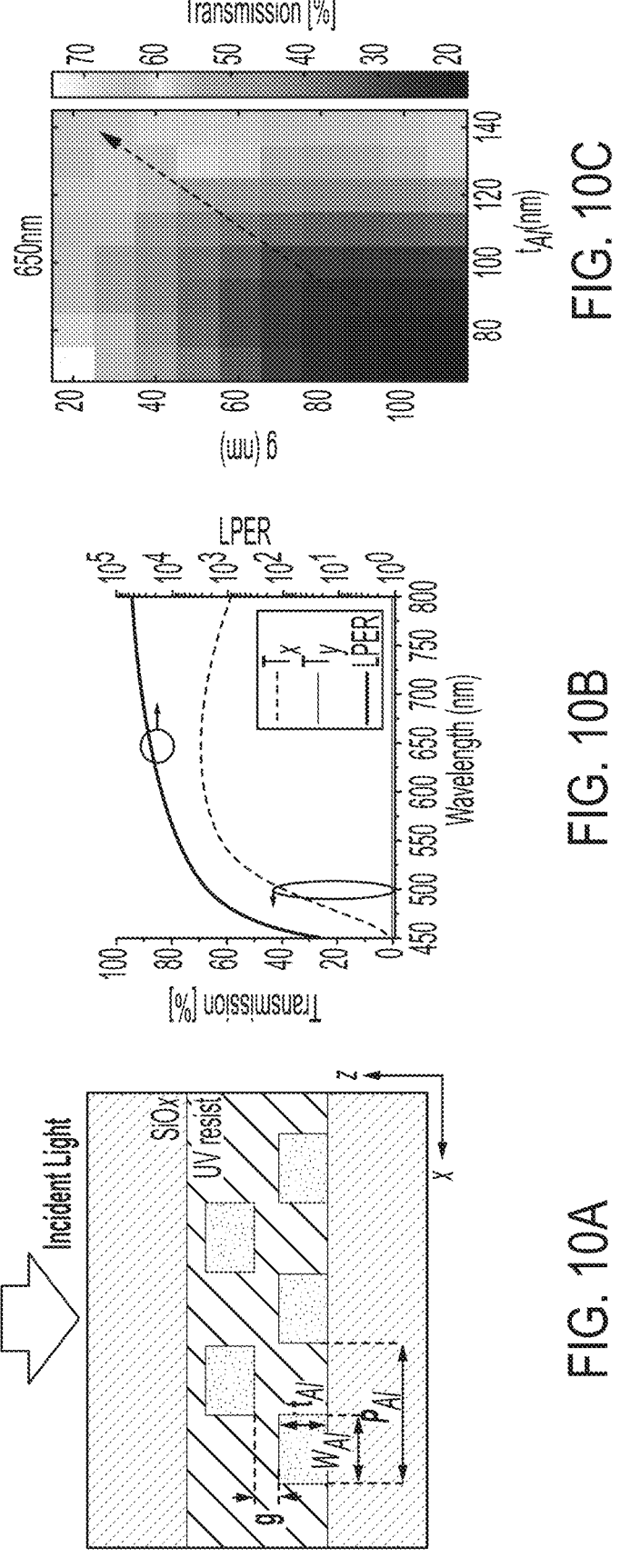
FIG. 10A, FIG. 10B, FIG. 10C, FIG. 10D, FIG. 10E, and FIG. 10F show FDTD-calculated LPER and transmission of VCDGs according to examples of the present disclosure.
Figure 10F:
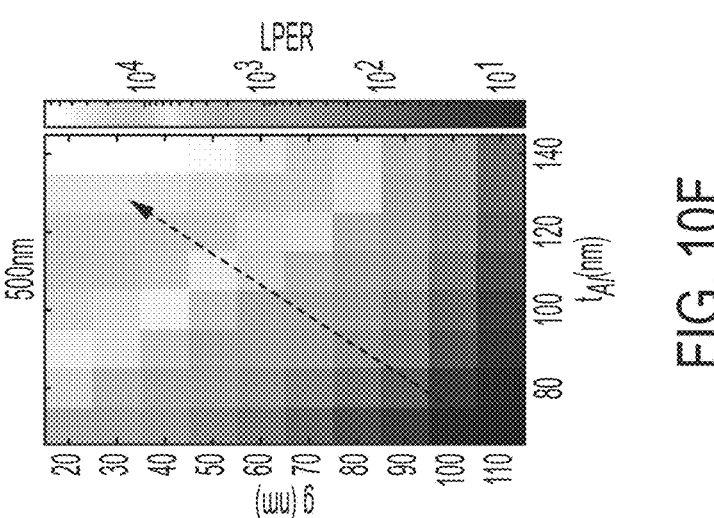
Figure 10E:
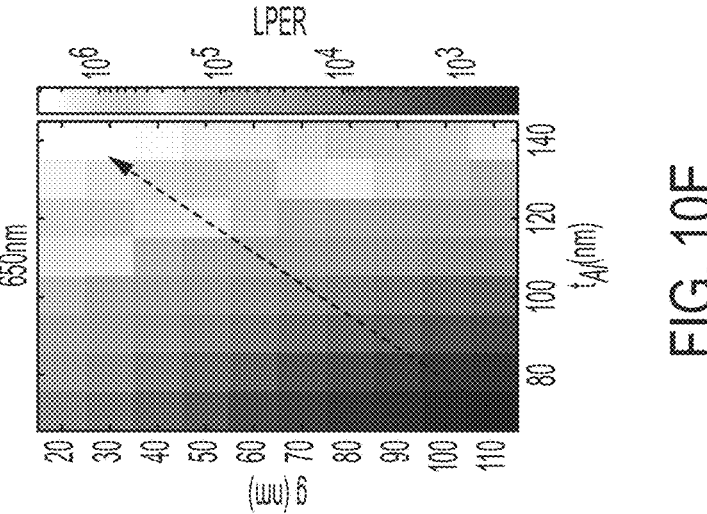
Figure 10D:
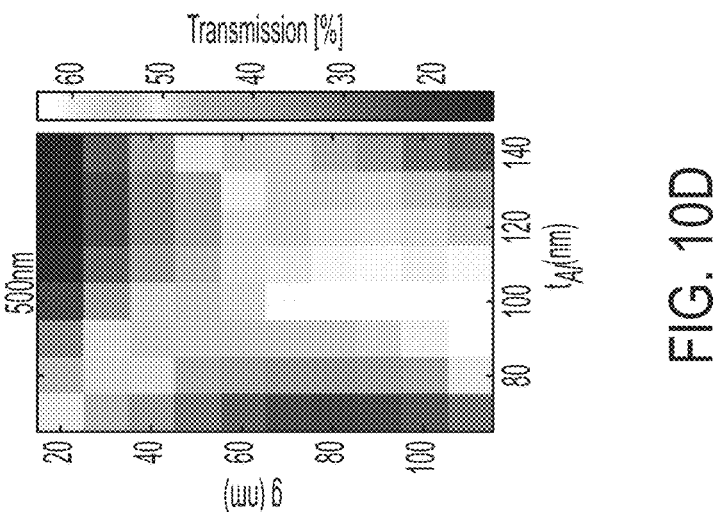

FIG. 10A, FIG. 10B, FIG. 10C, FIG. 10D, FIG. 10E, and FIG. 10F show FDTD-calculated LPER and transmission of VCDGs according to examples of the present disclosure. FIG. 10A shows a cross-sectional schematic of the VCDG structures. FIG. 10B shows exemplary simulation of optical transmission and LPER of VCDGs. The structure parameters are: VCDG period of $P_{Al}$=210 nm, Al thickness $t_{Al}$=80 nm, vertical gap g=30 nm, VCDG grating width $W_{Al}$=105 nm. FIG. 10C and FIG. 10D show simulated transmission at 650 nm and 500 nm wavelengths at different grating height g and Al thickness. The white arrow indicates the trend of increasing transmission efficiency. FIG. 10E and FIG. 10F show simulated transmission at 650 nm and 500 nm wavelengths at different grating height g and Al thickness. The white arrow indicates the trend of increasing LPER.

FIG. 11A, FIG. 11B, FIG. 11C, FIG. 11D, and FIG. 11E show FDTD-calculated CPER of CP polarization filter with different spacer layer thickness (d) according to examples of the present disclosure. FIG. 11A shows a schematic to show the definition of spacer layer thickness, here d is defined as the distance from the top of Si grating to the bottom of VCDGs. FIG. 11B shows simulated CPER dependence on spacer layer thickness for red color& blue color CP polarization filter. FIG. 11C shows simulated CPER dependence on spacer layer thickness for green color CP polarization filter. FIG. 11D and FIG. 11E show plots of CPER versus wavelength. It is found that the spacer thickness has a noticeable impact on the maximum CPER value and the peak wavelengths. For on-chip integration, practically the spacer layer thickness needed to be identical for all the filter designs and was designed as 520 nm. In practice, the thickness could vary across the chip during resist spinning in our NIL integration. The simulation results indicate that a decrease from 520 nm to 500 nm would change the bandwidth for the blue, red and green filter designs by −3% (from 66 nm to 64 nm), +2.5% (from 116 nm to 119 nm) and +14% (from 62 nm to 71 nm). A further thickness reduction to 480 nm would change the bandwidth for the blue, green and red filter designs by −59% (from 66 nm to 27 nm), +7.7% (from 116 nm to 125 nm) and +43% (from 62 nm to 89 nm). On the other hand, a thickness change by 20 nm or 40 nm would shift the peak CPER wavelength from 461 nm to 455 nm or to 450 nm for blue, from 626 nm to 620 nm or 610 nm for red, and from 543 nm to 532 nm or 522 nm for green colors, respectively.

Comparison of EBL and NIL-Based Manufacturing Methods

TABLE 5

Estimated fabrication processing time for multilayer metasurface structures over millimeter to centimeter area. (Unit: hour).

| EBL | a-Si & SiO$_2$ deposition | 1$^{st}$ EBL | Cr lift-off | Dry-etch & Cr strip | Spacer deposition | 2$^{nd}$ EBL | Cr lift-off | Dry-etch & Cr strip | Al deposition | Total time |
|---|---|---|---|---|---|---|---|---|---|---|
| Step time | 0.5 | ~16 | 2 | 1.5 | 4 | 16 | 2 | 1 | 6 | 49 |

| NIL | a-Si & SiO$_2$ deposition | 1$^{st}$ NIL | Dry-etch resist stack | Cr lift-off | Dry-etch & Cr strip | 2$^{nd}$ NIL | Al deposition | Total time |
|---|---|---|---|---|---|---|---|---|
| Step time | 0.5 | 1.5 | 1 | 2 | 1.5 | 0.05 | 6 | 12.55 |

Figure 13A:
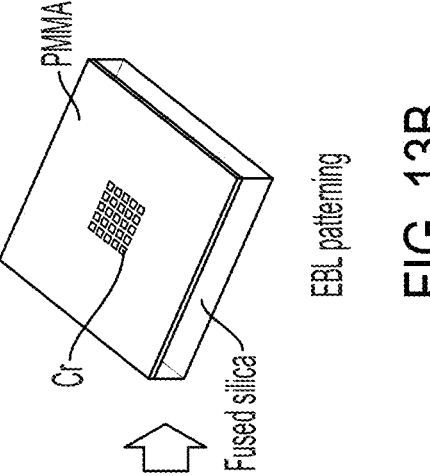
FIG. 13A, FIG. 13B, FIG. 13C, and FIG. 13D show VCDG metasurface mold fabrication process according to examples of the present disclosure.
Figure 13B:
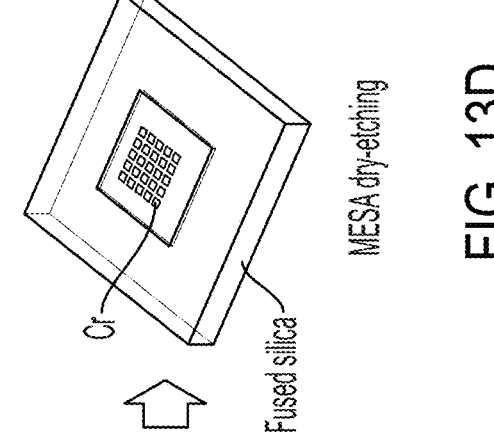
Figure 13C:
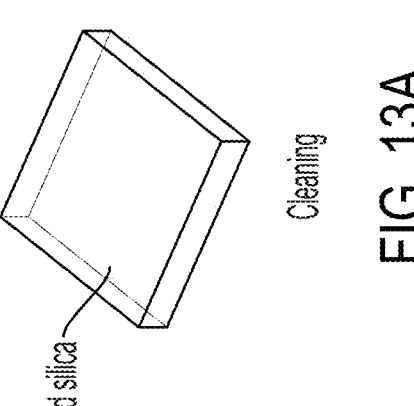
Figure 13D:
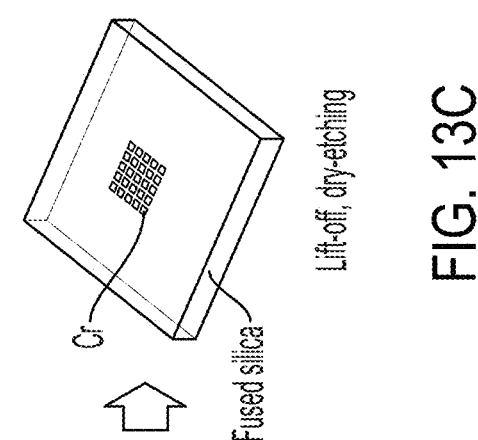

The hours are estimated based on the tools available to the authors (EBL system at University of Arizona, NIL tools and thermal evaporator in Wang and Yao labs, and film deposition and etchers at the NanoFab facility at ASU). For simplicity, sample cleaning, metrology, sample transfer, tool conditioning, etc. were not taken into account. Because EBL writing time scales linearly with the metasurface fabrication area, it becomes too slow and expensive, and therefore impractical, for many applications requiring fabrication over areas larger than centimeter squares.

according to examples of the present disclosure. FIG. 13A shows a fused silica wafer is cleaned by solvents and RCA1. Then PMMA is spin-coated, and a Cr layer was deposited on the PMMA as discharging layer for the EBL by thermal evaporator. FIG. 13B shows EBL is carried out, and then the Cr discharging layer was stripped and the metasurface patterns were developed. FIG. 13C shows a layer of Cr was evaporated and lifted off, creating a mask for subsequent RIE. FIG. 13D shows the $SiO_2$ film was etched by RIE, and then Cr mask was stripped.

TABLE 6

Comparison of different manufacturing methods for large-scale metasurface nanostructures.

| Manufacturing methods | EBL | DUV | NIL |
|---|---|---|---|
| Nano-scale structural resolution | High (~10 nm) | Moderate (diffraction limited, although adding spatial frequency multiplication can improve) | High (sub-10 nm) |
| 3D pattern transfer capability | Not feasible | Not feasible | Yes (demonstrated this work) |
| Manufacturing throughput | Slow (pixel-by-pixel writing; exposure area limited) | High (large-area projection; wafer-scale production) | High (large-area printing; wafer-scale production) |
| Multi-layer fabrication | Challenging (alignment marks need to be visible to e-beam) | Feasible (routinely used in semiconductor chip manufacturing) | Feasible (demonstrated by this work) |
| Cost of tool ownership and maintenance | Moderate to high (depends on scale and resolution) | Very high (typically available in facilities for production but not university user facilities) | Moderate to high (depends on scale and level of automation) |
| Cost of mask for each fabrication | Moderate (no physical masks required, but layout optimization and dose tests usually needed for given structures, substrates, etc.) | Moderate (physical masks needed, masks can be used many times; dose tests may be needed for different substrates) | Low (requires mold fabrication; mold can be used many times once made available; substrate impact is minimal) |
| Cost in scalable metasurface manufacturing | High | Moderate | Low |

DUV: Deep-UV lithography.

Fabrication of Chiral Metasurface and VCDG

TABLE 7

Grating linewidth of NIL-fabricated VCDGs overlaid on Si metasurface.

| | $W_{Al\_LCP\_RED}$ | $W_{Al\_RCP\_RED}$ | $W_{Al\_LCP\_green}$ | $W_{Al\_RCP\_green}$ | $W_{Al\_0°}$ | $W_{Al\_90°}$ | $W_{Al\_45°}$ | $W_{Al\_135°}$ |
|---|---|---|---|---|---|---|---|---|
| ① Center | 121.3 | 119.7 | 105.9 | 110.0 | 122.0 | 122.9 | 125.3 | 125.4 |
| ② Right | 121.7 | 122.0 | 105.1 | 105.2 | 121.0 | 121.9 | 127.0 | 124.7 |
| ③ Left | 121.9 | 122.5 | 103.9 | 103.3 | 120.3 | 118.1 | 121.9 | 123.4 |
| ④ Top | 119.4 | 122.6 | 100.6 | 102.5 | 119.0 | 122.1 | 121.3 | 119.3 |
| ⑤ Bottom | 123.8 | 125.4 | 100.1 | 102.9 | 117.4 | 118.7 | 117.7 | 119.8 |
| Total | 121.6 ± 1.6 | 122.4 ± 2.0 | 103.1 ± 2.6 | 104.8 ± 3.1 | 119.9 ± 1.8 | 120.7 ± 2.2 | 122.7 ± 3.6 | 122.5 ± 2.8 |

FIG. 12A, FIG. 12B, FIG. 12C, and FIG. 12D show Si metasurface mold fabrication process by EBL according to examples of the present disclosure. FIG. 12A shows a Si wafer with $SiO_2$ film is cleaned by solvents and RCA1. Then PMMA is spin-coated and a Cr layer was deposited on the PMMA as discharging layer for the EBL by thermal evaporator. FIG. 12B shows EBL is carried out, and then the Cr discharging layer was stripped and the metasurface patterns were developed. FIG. 12C shows a layer of Cr was evaporated and lifted off, creating a mask for subsequent RIE. FIG. 12D shows the $SiO_2$ film was etched by RIE, and then Cr mask was stripped.

Figure 14:
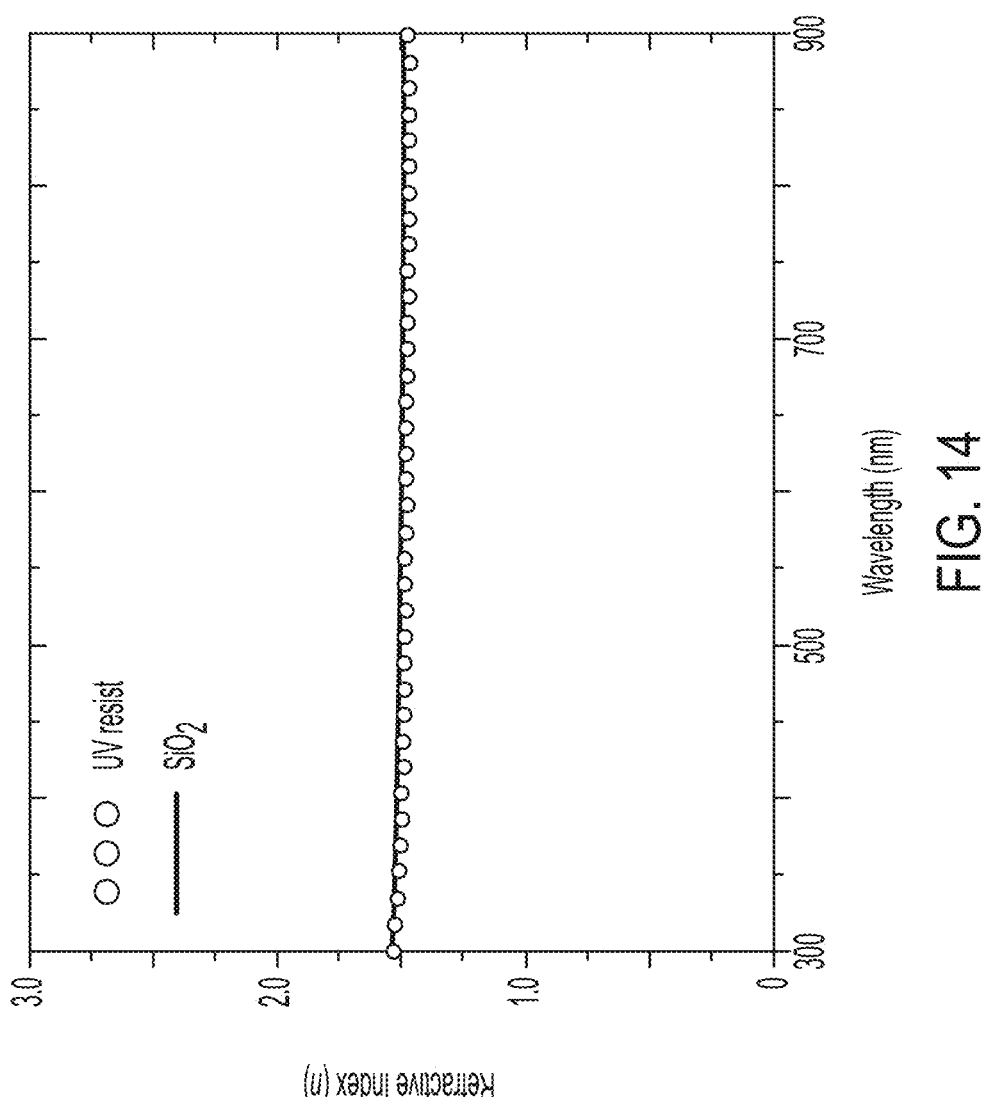
FIG. 14 shows a plot of measured refractive index of PECVD-deposited $SiO_2$ and UV resist using ellipsometry, showing consistent values across the whole wavelength range, according to examples of the present disclosure.

FIG. 13A, FIG. 13B, FIG. 13C, and FIG. 13D show VCDG metasurface mold fabrication process by EBL FIG. 14 shows a plot of measured refractive index of PECVD-deposited $SiO_2$ and UV resist using ellipsometry, showing consistent values across the whole wavelength range, according to examples of the present disclosure.

Figures 15A, 15B:
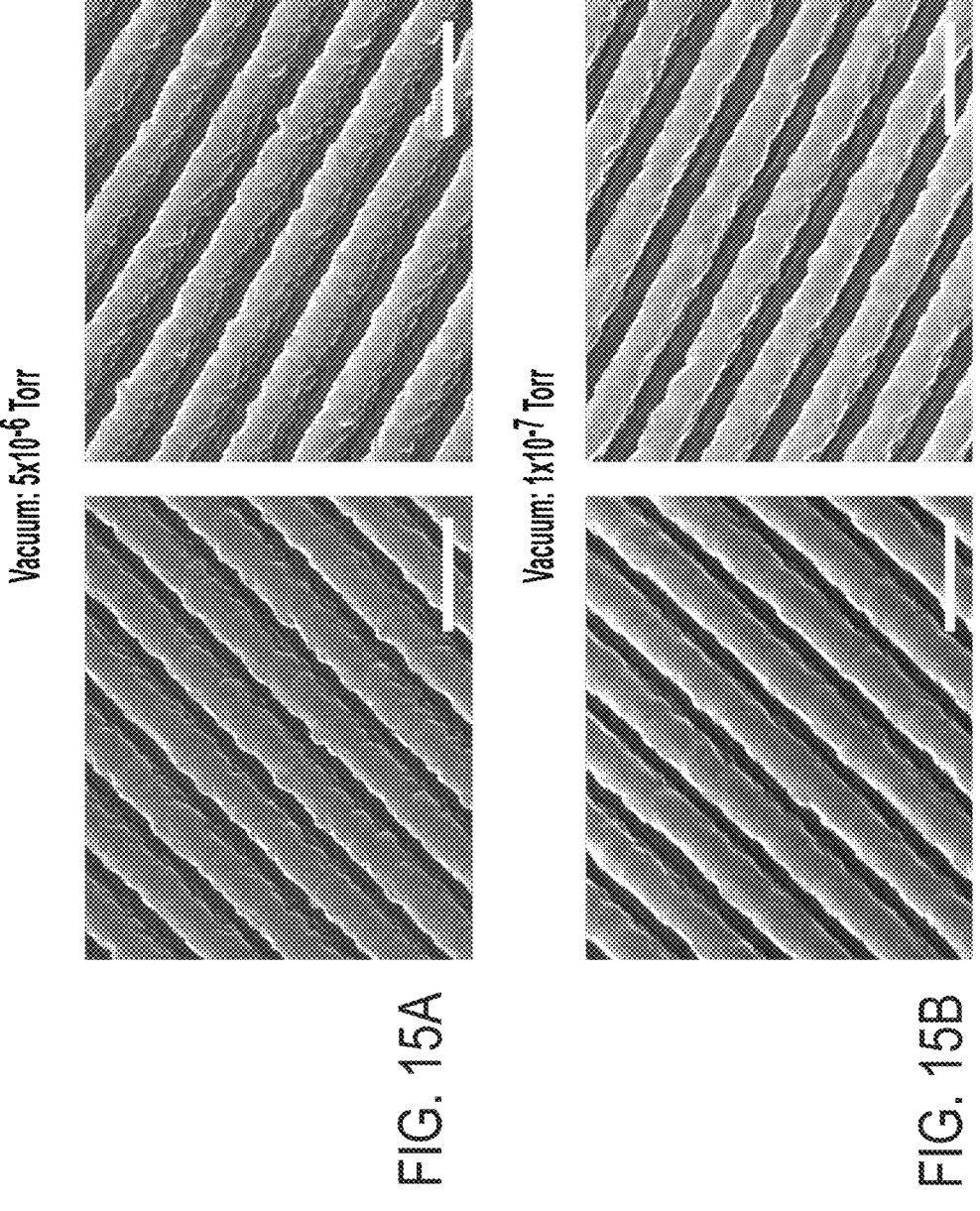
FIG. 15A and FIG. 15B show SEM images showing the effect of chamber base pressure on the surface morphology of VCDGs. Here 80 nm Al was deposited with the base pressure of $5 \times 10^{-6}$ Torr in FIG. 15A and $1 \times 10^{-7}$ Torr in FIG. 15B.

FIG. 15A and FIG. 15B show SEM images showing the effect of chamber base pressure on the surface morphology of VCDGs. Here 80 nm Al was deposited with the base pressure of $5\times10^{-6}$ Torr in FIG. 15A and $1\times10^{-7}$ Torr in FIG. 15B. Scale bar: 300 nm.

Figures 16A, 16B:
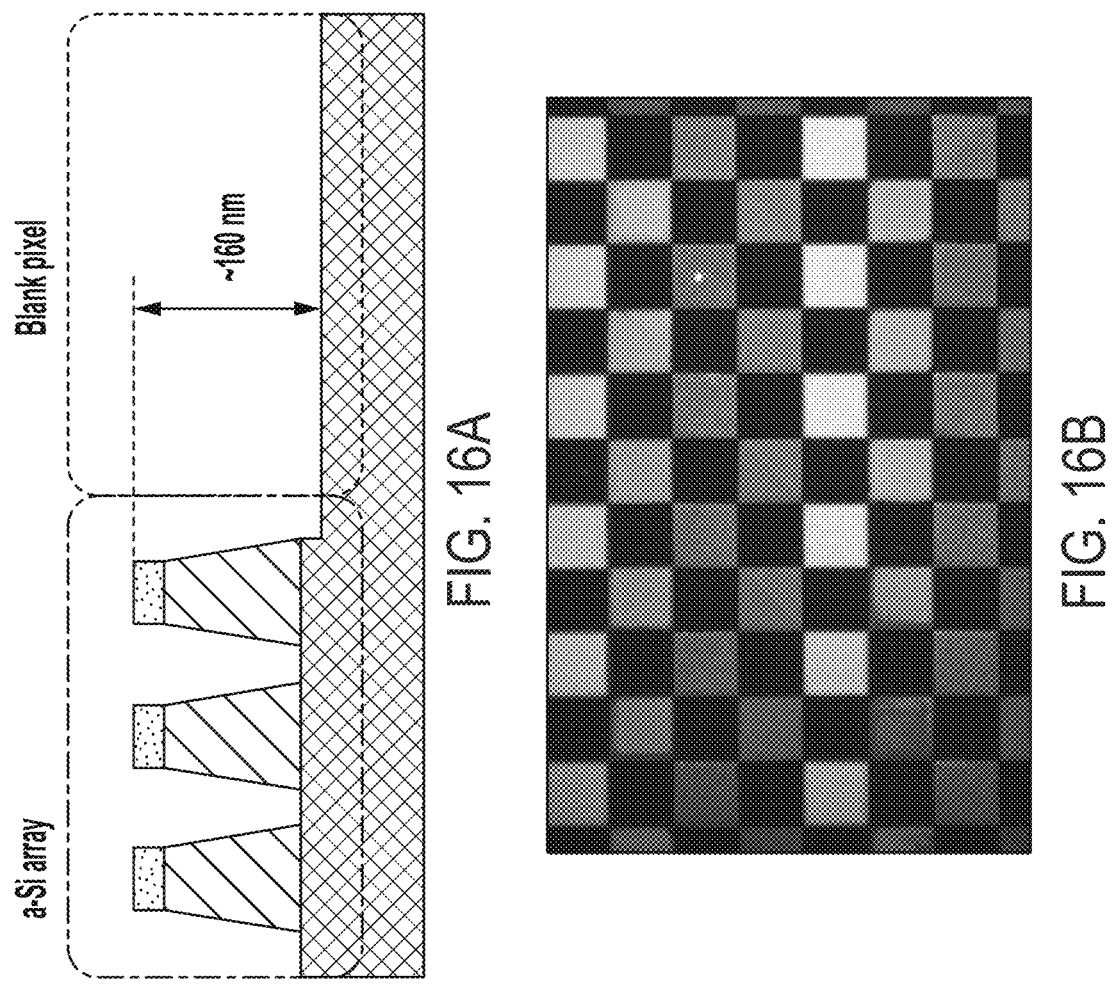
FIG. 16A and FIG. 16B show experimental results of fabricated Si metasurface according to examples of the present disclosure.

FIG. 16A and FIG. 16B show experimental results of fabricated Si metasurface according to examples of the present disclosure. FIG. 16A shows schematic of fabricated Si metasurfaces, showing a large height difference in patterned (QWP) and non-patterned (blank) areas. The step height was measured from profilometry. FIG. 16B shows an optical image of fabricated Si metasurface arrays. The dark area from optical picture indicate the blank pixels, whereas the colored areas are Si metasurface pixels.

Figures 17A, 17B, 17C, 17D, 17E, 17F:
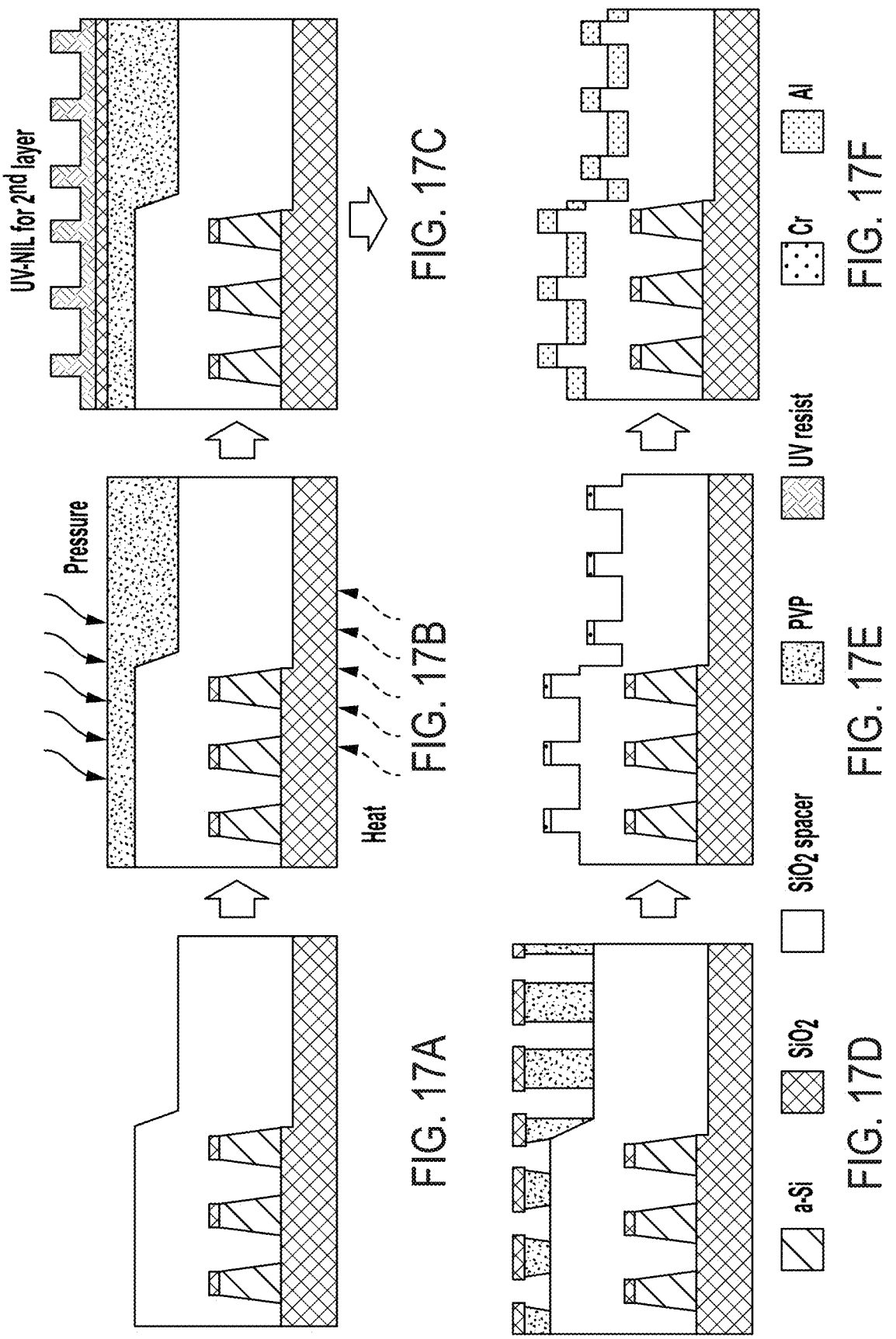
FIG. 17A, FIG. 17B, FIG. 17C, FIG. 17D, FIG. 17E, and FIG. 17F show experimental results of attempting Cr liftoff on SiO2-covered Si metasurface even with polymer planarization of the surface according to examples of the present disclosure.
Figures 17G, 17H, 17I, 17J:
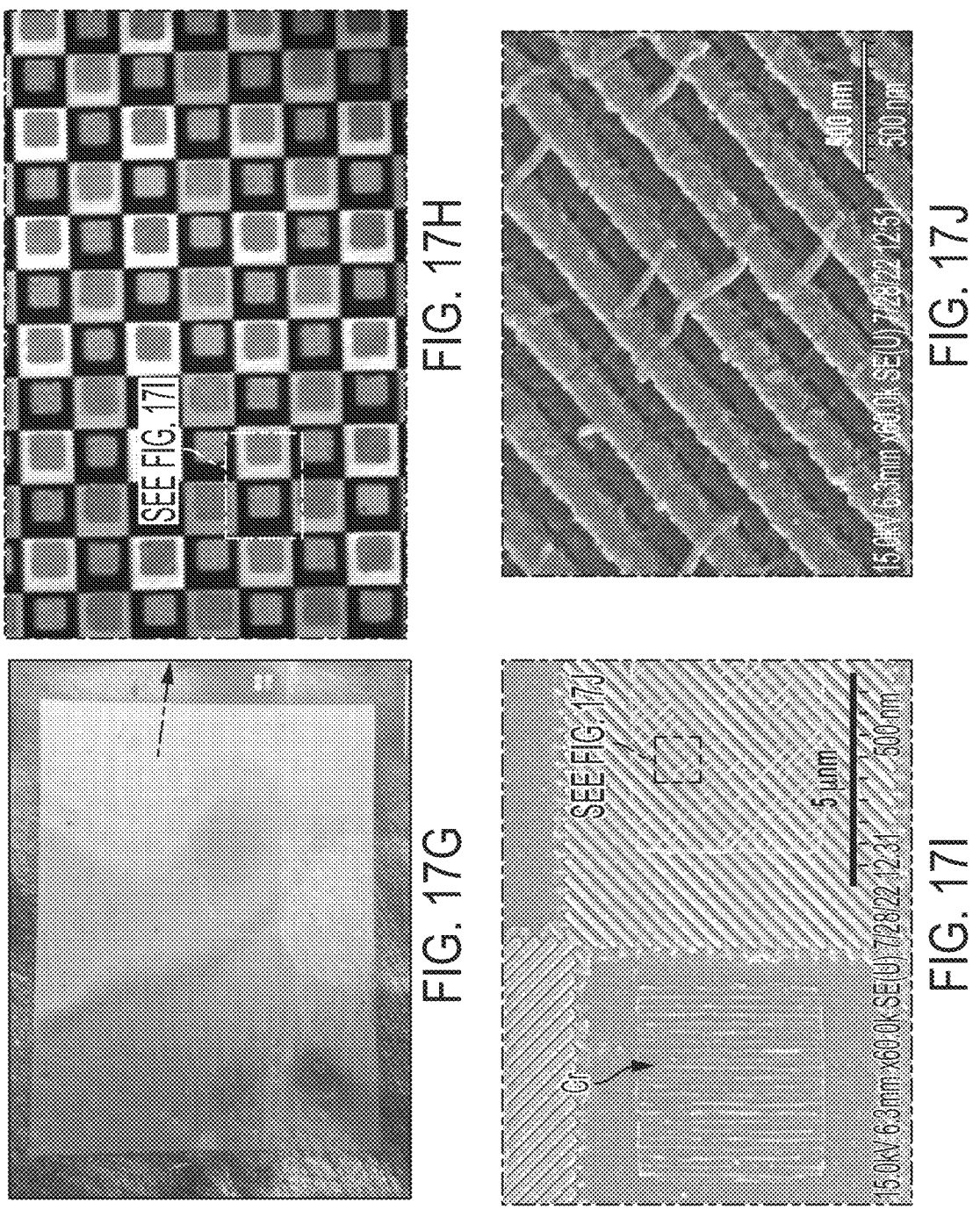
FIG. 17G, FIG. 17H, FIG. 17I, and FIG. 17J show optical and SEM images of the sample after Cr liftoff according to FIG. 17E.

FIG. 17A, FIG. 17B, FIG. 17C, FIG. 17D, FIG. 17E, and FIG. 17F show experimental results of a fabrication processes for Al VCDGs by attempting Cr liftoff on SiO2-covered Si metasurface even with polymer planarization of the surface according to examples of the present disclosure. FIG. 17A shows SiO$_2$ is sputtered-coated on Si metasurface. FIG. 17B shows coating polyvinylpyrrolidone (PVP) followed by planarization via thermal NIL with a flat Si mold. FIG. 17C shows evaporation of a SiO2 mid-layer, spin-coating UV resist, and tri-layer UV-NIL on the PVP-coated Si metasurface. FIG. 17D shows plasma RIE to etch the residual layer in UV resist, mid-layer SiO$_2$, and PVP bottom layer. FIG. 17E shows Cr evaporation, liftoff, and RIE into the SiO$_2$ layer; FIG. 17F shows Cr removal and Al evaporation. FIG. 17G, FIG. 17H, FIG. 17I, and FIG. 17J show optical and SEM images of the sample after Cr liftoff according to FIG. 17E. The Cr lines in the blank pixels are expanded, because excessive oxygen plasma etching needed to etch through the thick PVP layer has distorted the structural dimensions. In addition, polymer residues were also found in some regions after Cr liftoff.

Figures 18A, 18B, 18C, 18D, 18E:
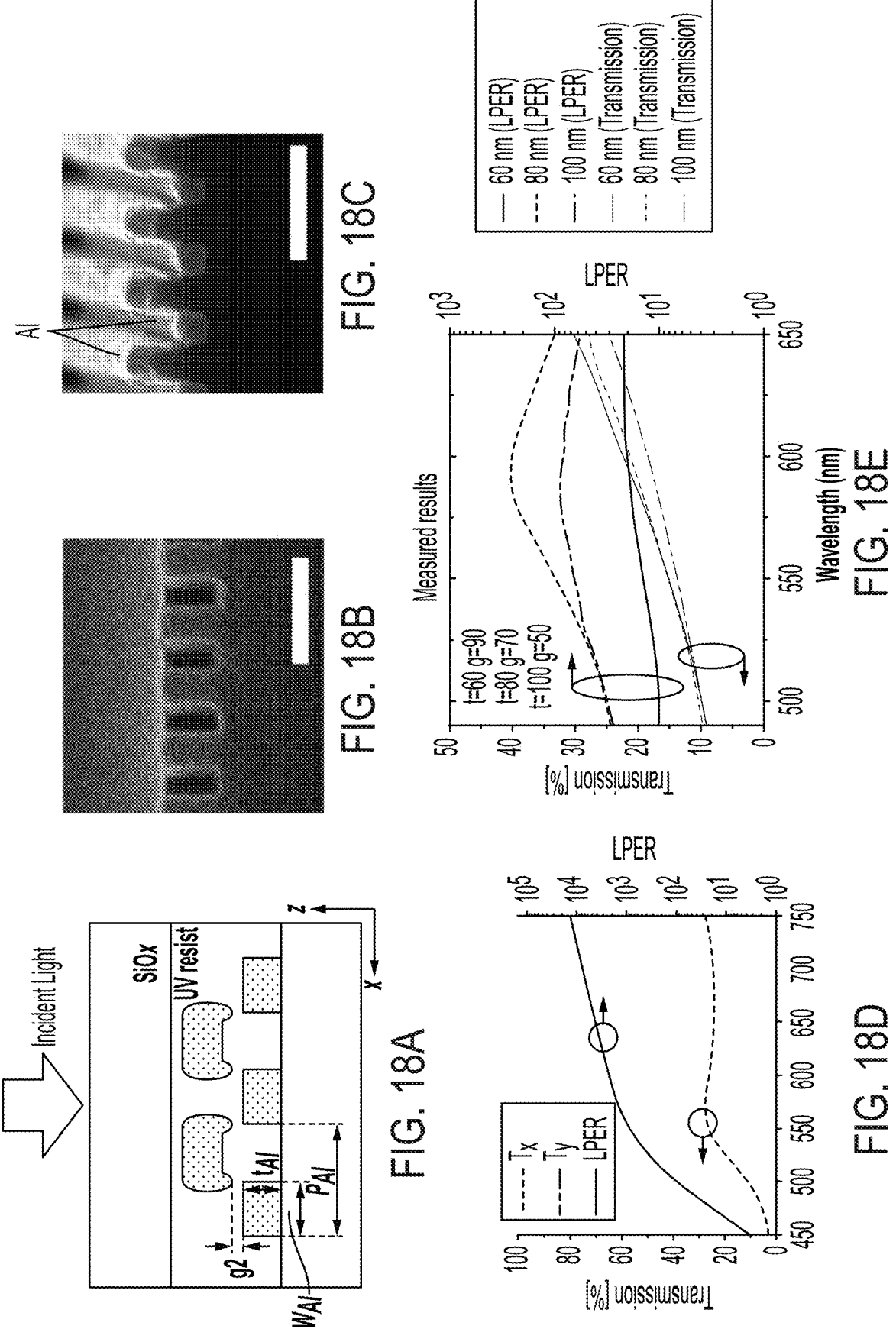
FIG. 18A, FIG. 18B, FIG. 18C, FIG. 18D, and FIG. 18E show impact of non-ideal VCDG grating geometries on the optical performance according to examples of the present disclosure.

FIG. 18A, FIG. 18B, FIG. 18C, FIG. 18D, and FIG. 18E show impact of non-ideal VCDG grating geometries on the optical performance according to examples of the present disclosure. FIG. 18A shows schematic showing the VCDG Al gratings with rounded edges and reduced gaps. FIG. 18B and FIG. 18C show SEM images showing NIL-fabricated VCDG gratings before and after Al deposition, respectively. FIG. 18D shows simulated VCDG efficiency and LPER with key structural parameters as: VCDG period of $P_{Al}$=210 nm, Al thickness $t_{Al}$=80 nm, vertical gap g2=30 nm, VCDG grating width $W_{Al}$=105 nm. FIG. 18E shows plots of experimentally measured transmission efficiency and LPER with respect to different Al thicknesses. 80 nm Al indicated the highest LPER (solid line).

Figure 19:
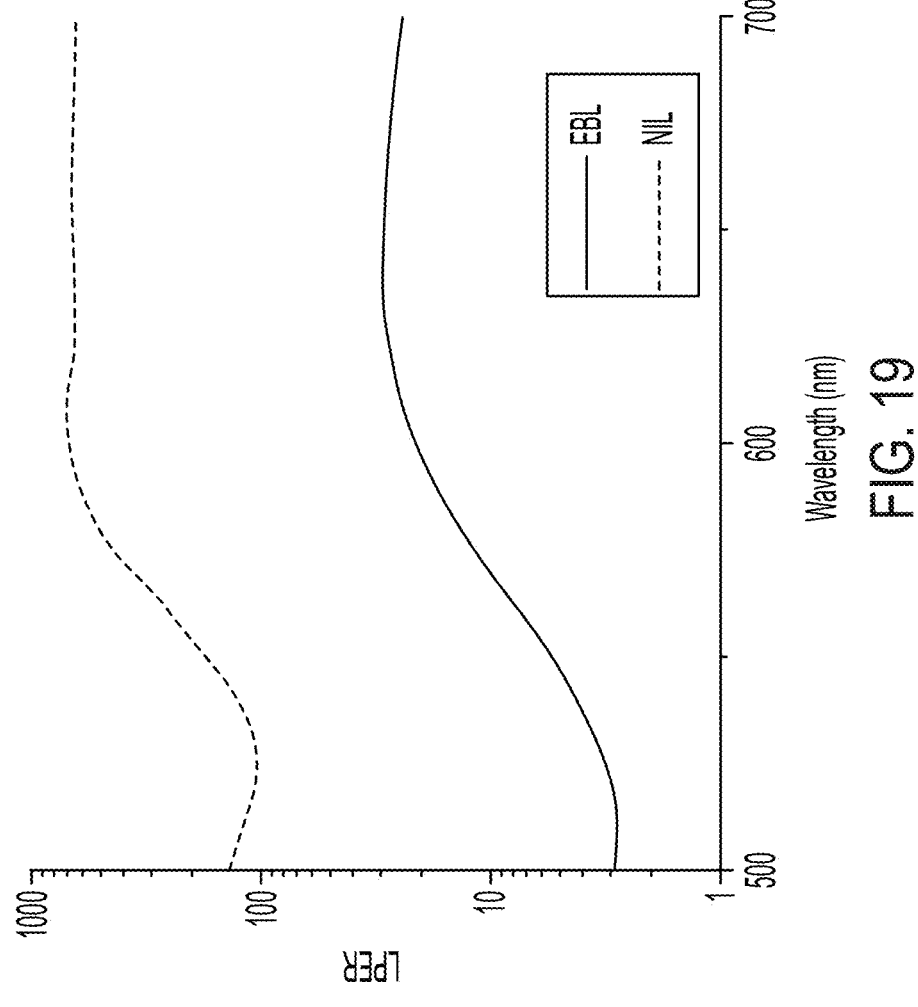
FIG. 19 shows a plot of measurement of LPER of VCDGs by EBL and NIL according to examples of the present disclosure.

FIG. 19 shows a plot of measurement of LPER of VCDGs by EBL and NIL according to examples of the present disclosure.

Full Stokes Polarization State Measurement at Red, Green, Blue (RGB) Colors

FIG. 20 shows a schematic of full Stokes polarization detection system 2000 according to examples of the present disclosure. The full Stokes polarization detection system 2000 can be used for generating arbitrary polarization states for full Stokes polarization detection. A parabolic mirror 2102, two iris 2104, 2106, and two lenses 2108, 2110 generate a collimated beam with divergence angle less than 0.5°, unit: mm produced from optical radiation source 2112, such as a halogen lamp fiber. A color-filtered, uniform, collimated beam is produced by color filter 2122 with sufficient spot size is incident onto an analyzer 2124 and then onto a full Stokes polarization imaging sensor 2114, which is mounted onto a rotational stage 2116 to control the light incidence angle φ. During the calibration, φ is kept at 0° (normal incidence) to obtain the instrument matrix for each microscale polarization filter. A polarization state generator (polarizer 2118 and quarter wave plate (QWP) 2120) is used to generate arbitrary polarization states. With each polarization state input, a snapshot of the transmitted light intensity through MPFA is taken to obtain the intensity vector The instrument matrix A of MPFA is obtained after sufficient polarization state input to form an intensity matrix. Besides, a spatially over-sampling approach (FIG. 1B) can be applied during the instrument matrix calculation to enhance the imaging resolution, where the super-pixel was moved over one filter pixel per step because of the periodic layout design of the MPFA.

TABLE 8

$S_1$ $S_2$ $S_3$ values of 8 selected polarization states input at blue color (480-520 nm).

| Polarization States | $S_1$ | $S_2$ | $S_3$ |
|---|---|---|---|
| A | 0.02106 | −0.00018 | −0.99977 |
| B | 0.02106 | −0.00018 | 0.99977 |
| C | 0.49332 | −0.47136 | 0.73107 |
| D | 0.48134 | −0.82034 | 0.30878 |
| E | 0.47001 | −0.82675 | −0.30912 |
| F | −0.35931 | −0.65080 | −0.66885 |
| G | 0.46977 | 0.82702 | −0.30878 |
| H | 0.45664 | 0.80704 | 0.37436 |

TABLE 9

$S_1$ $S_2$ $S_3$ values of 8 selected polarization states input at green color (530-570 nm).

| Polarization States | $S_1$ | $S_2$ | $S_3$ |
|---|---|---|---|
| A | 0.00558 | −0.01744 | −0.99981 |
| B | 0.00558 | −0.01744 | 0.99981 |
| C | 0.50240 | −0.47981 | 0.71927 |
| D | 0.49392 | −0.81888 | 0.29230 |
| E | 0.48555 | −0.81127 | −0.32562 |
| F | −0.36283 | −0.66182 | −0.65599 |
| G | 0.46221 | 0.83719 | −0.29230 |
| H | 0.45089 | 0.81749 | 0.35830 |

TABLE 10

$S_1$, $S_2$, $S_3$ values of 8 selected polarization states input at red color (580-620 nm).

| Polarization States | $S_1$ | $S_2$ | $S_3$ |
|---|---|---|---|
| A | −0.01208 | −0.03930 | −0.99914 |
| B | −0.01208 | −0.03930 | 0.99914 |
| C | 0.51452 | −0.48912 | 0.70428 |
| D | 0.51000 | −0.81606 | 0.27187 |
| E | 0.50432 | −0.79129 | −0.34563 |
| F | −0.36586 | −0.67592 | −0.63974 |
| G | 0.45173 | 0.84970 | −0.27187 |
| H | 0.44260 | 0.83043 | 0.33833 |

Figure 21B:
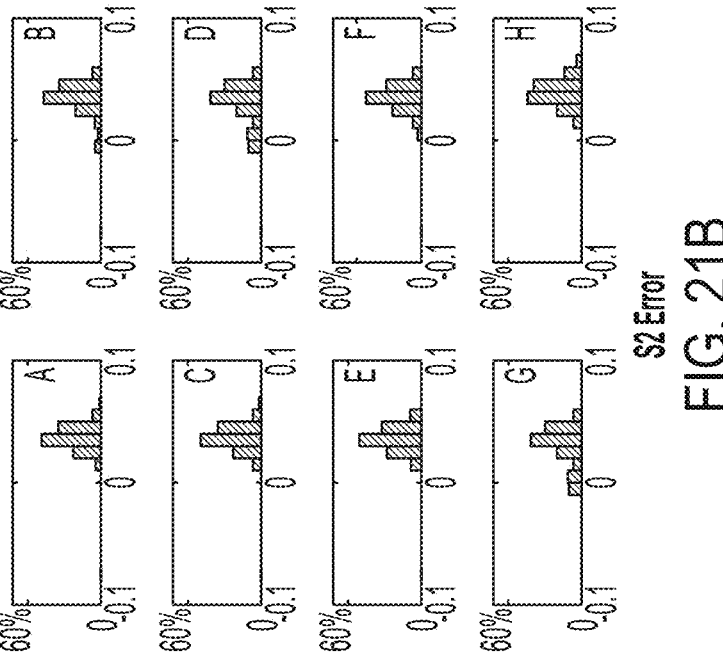
FIG. 21A, FIG. 21B, and FIG. 21C show Stokes parameter measurement error distribution of MPFA under bandpass filter 480 nm-520 nm (blue) input according to examples of the present disclosure.
Figure 21A:
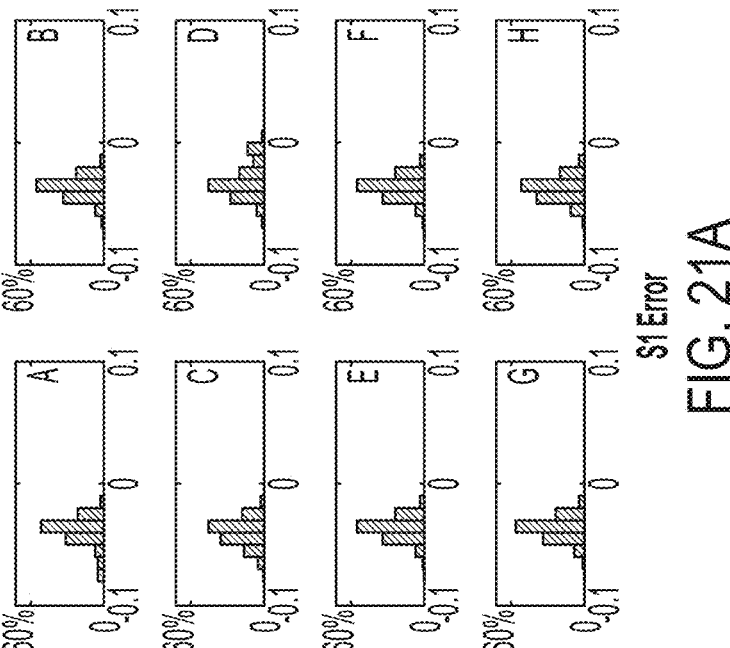
Figure 21C:
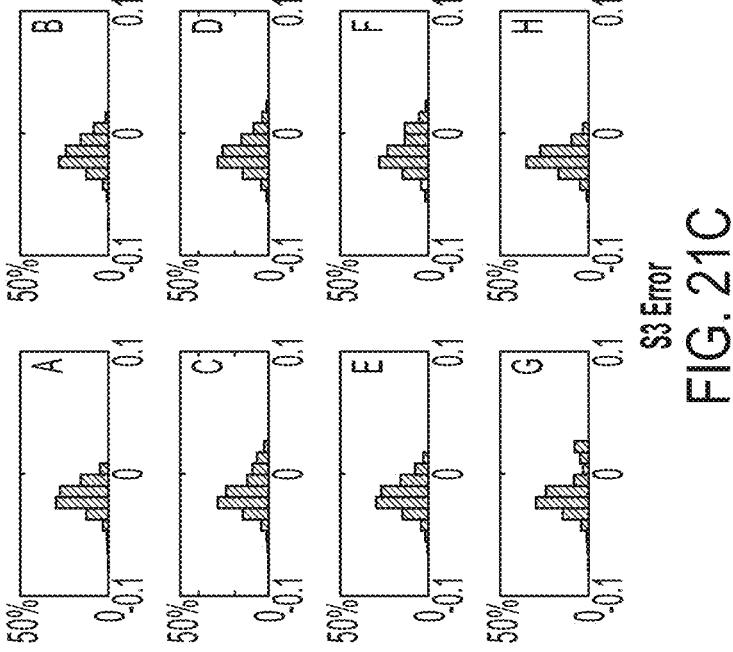

FIG. 21A, FIG. 21B, and FIG. 21C show Stokes parameter measurement error distribution of MPFA under bandpass filter 480 nm-520 nm (blue) input according to examples of the present disclosure. A to F indicates polarization states as listed in Table 5.

Figure 22B:
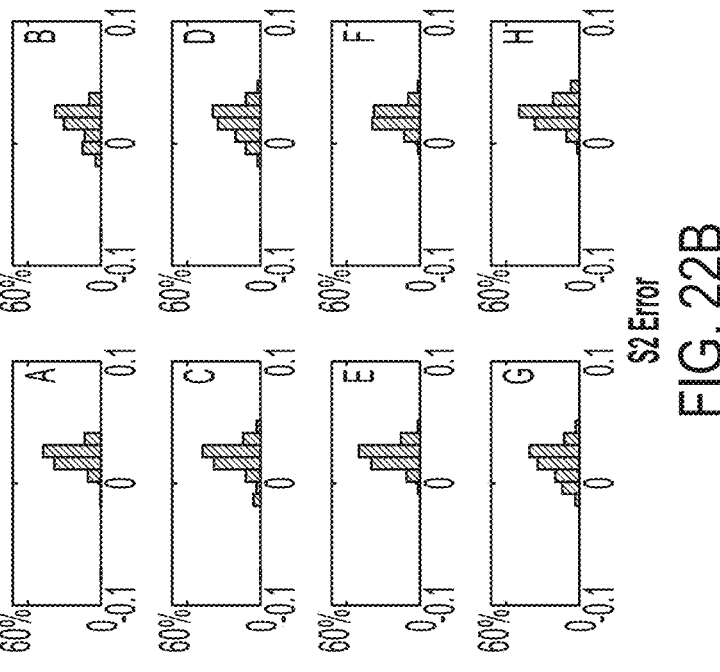
FIG. 22A, FIG. 22B, and FIG. 22C show Stokes parameter measurement error distribution of MPFA under bandpass filter 530 nm-570 nm (green) input according to examples of the present disclosure.
Figure 22A:
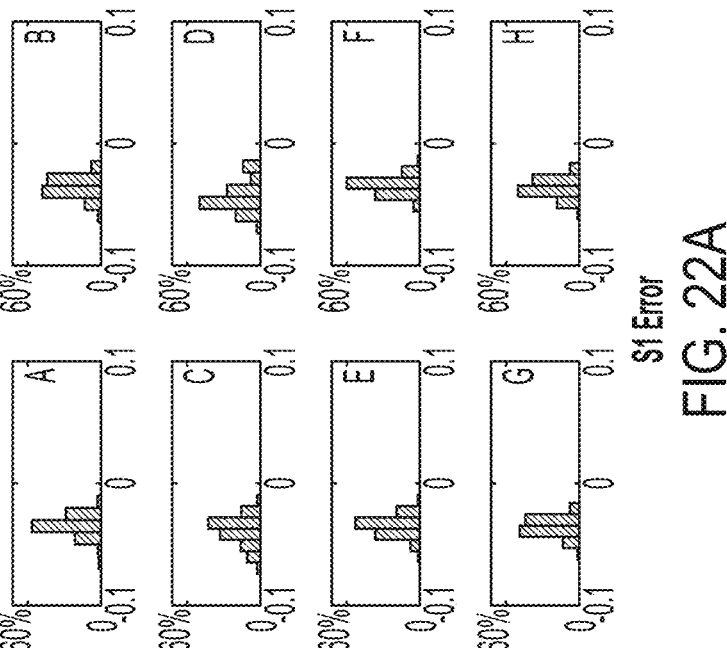
Figure 22C:
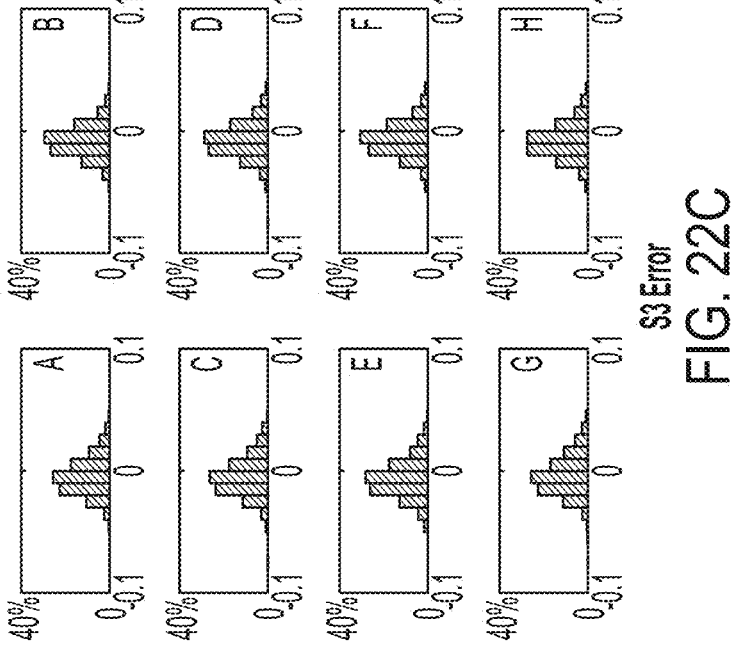

FIG. 22A, FIG. 22B, and FIG. 22C show Stokes parameter measurement error distribution of MPFA under bandpass filter 530 nm-570 nm (green) input according to examples of the present disclosure. A to F in each figure indicates polarization states listed in Table 6.

Figure 23B:
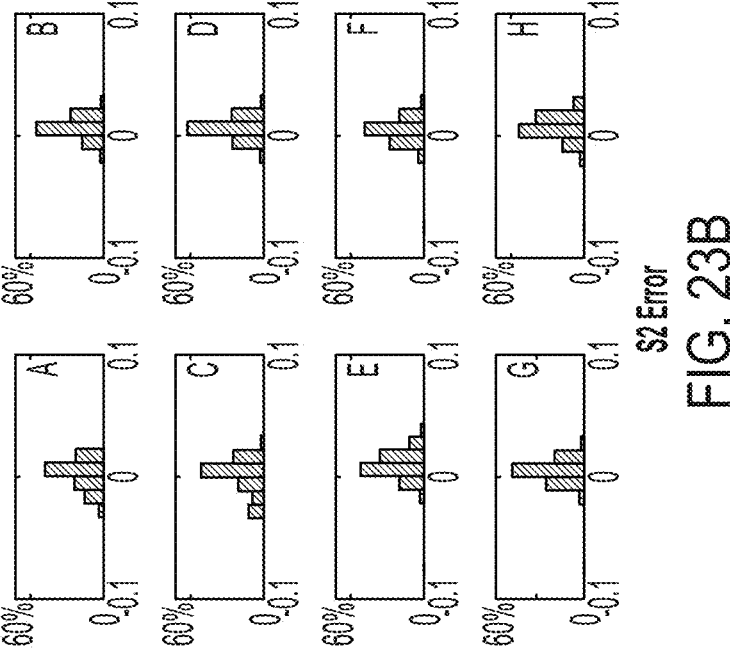
FIG. 23A, FIG. 23B, and FIG. 23C show Stokes parameter measurement error distribution of MPFA under bandpass filter 580 nm-620 nm (red) light input according to examples of the present disclosure.
Figure 23A:
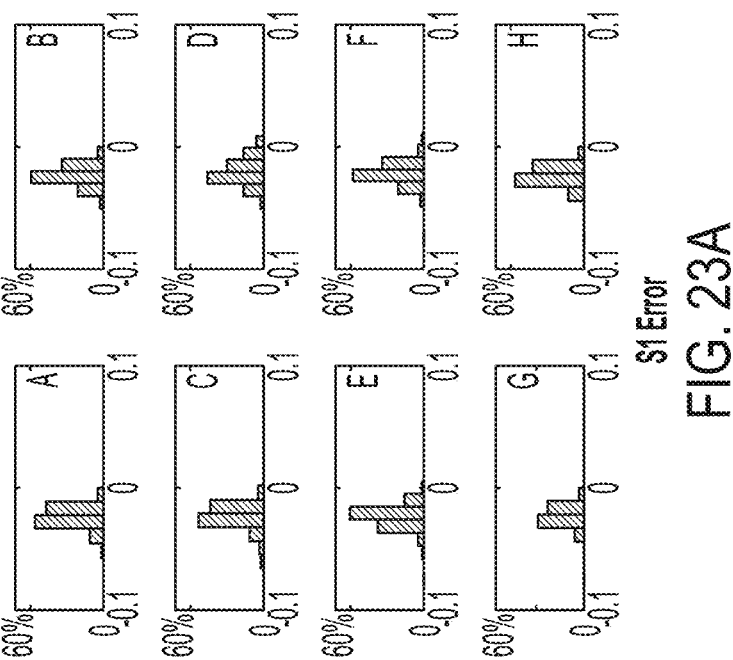
Figure 23C:
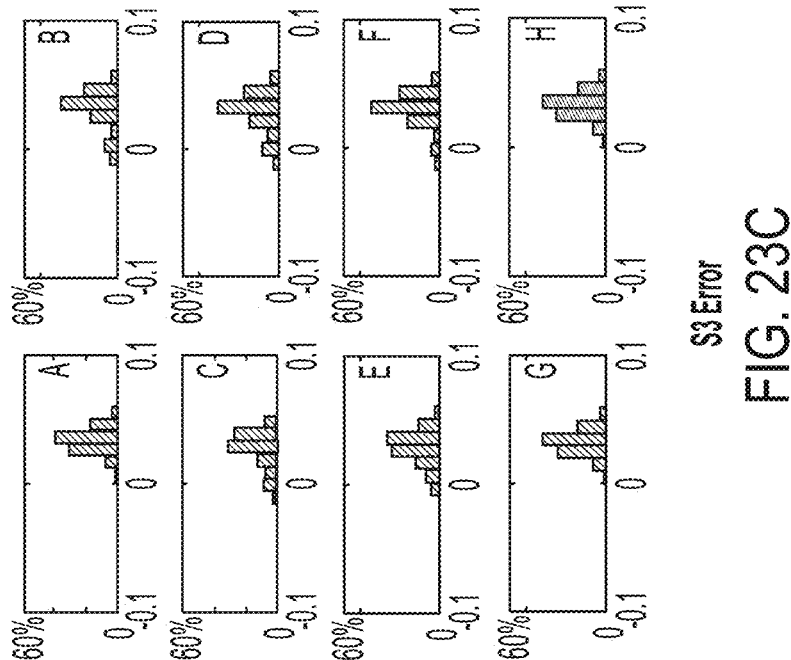

FIG. 23A, FIG. 23B, and FIG. 23C show Stokes parameter measurement error distribution of MPFA under bandpass filter 580 nm-620 nm (red) light input according to examples of the present disclosure. A to F indicates polarization states as listed in Table 7.

Figure 24B:
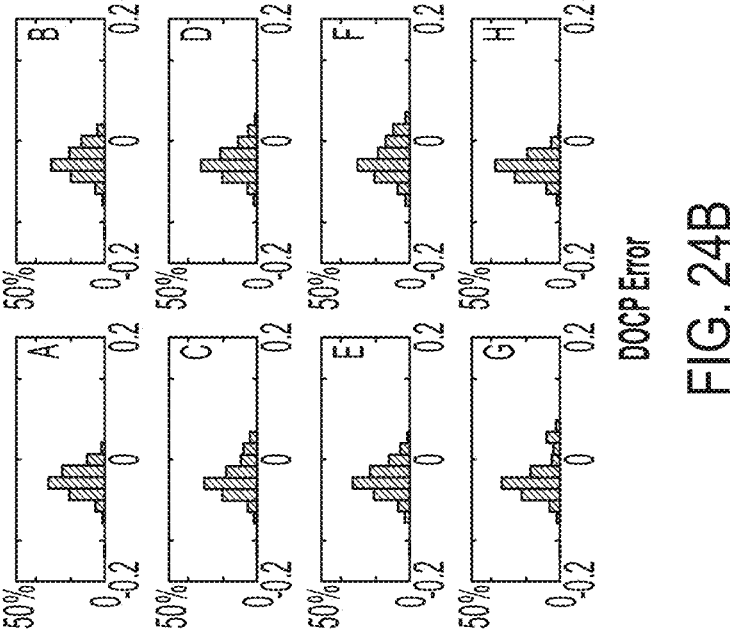
FIG. 24A, FIG. 24B, and FIG. 24C show AOP, DOCP, DOLP measurement error distribution of MPFA under bandpass filter 480 nm-520 nm (blue) input according to examples of the present disclosure.
Figure 24A:
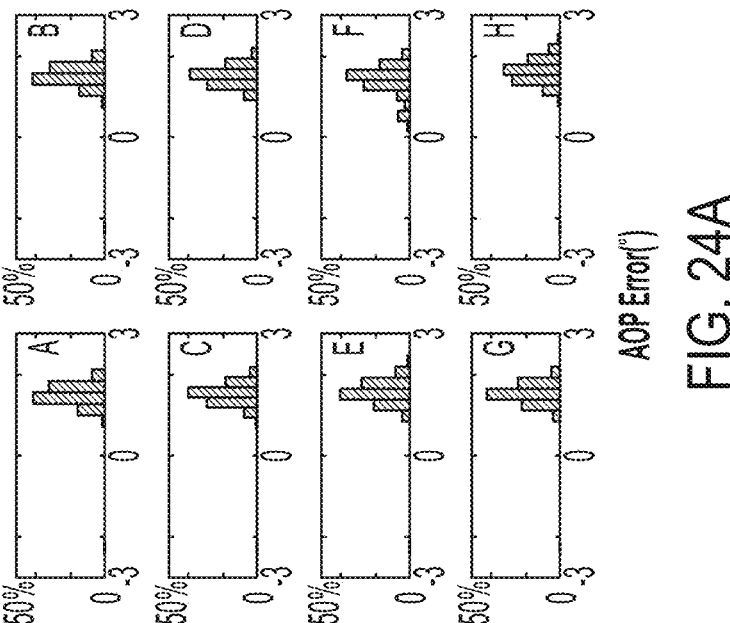
Figure 24C:
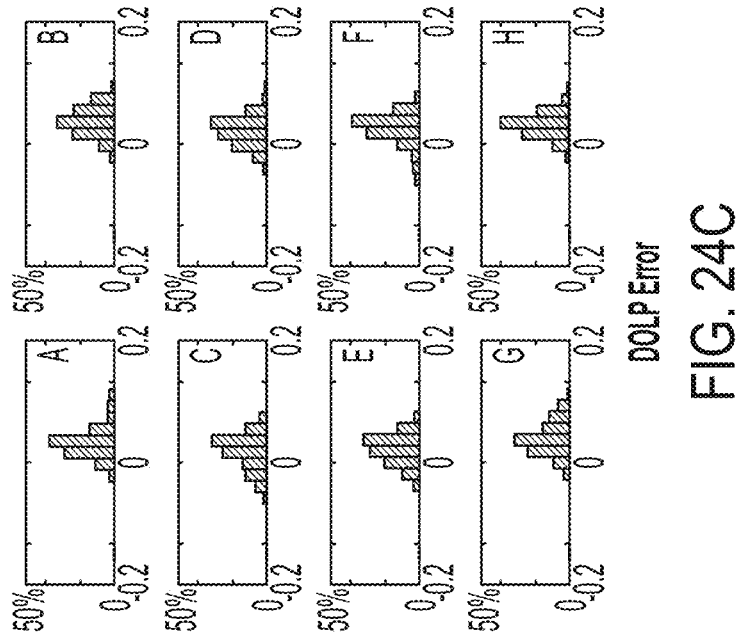

FIG. 24A, FIG. 24B, and FIG. 24C show AOP, DOCP, DOLP measurement error distribution of MPFA under bandpass filter 480 nm-520 nm (blue) input according to examples of the present disclosure. A to F indicates polarization states as listed in Table 8.

Figure 25B:
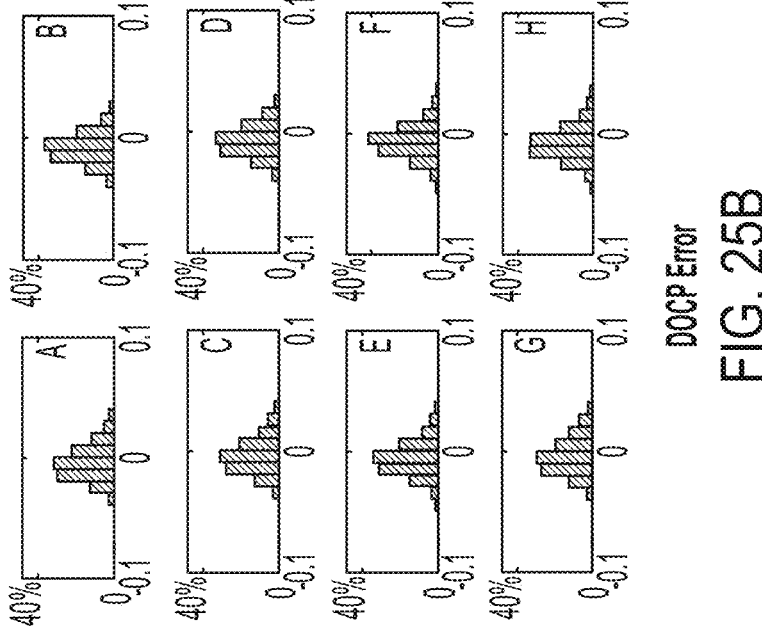
FIG. 25A, FIG. 25B, and FIG. 25C show AOP, DOCP, DOLP measurement error distribution of MPFA under bandpass filter 530 nm-570 nm (green) input according to examples of the present disclosure.
Figure 25A:
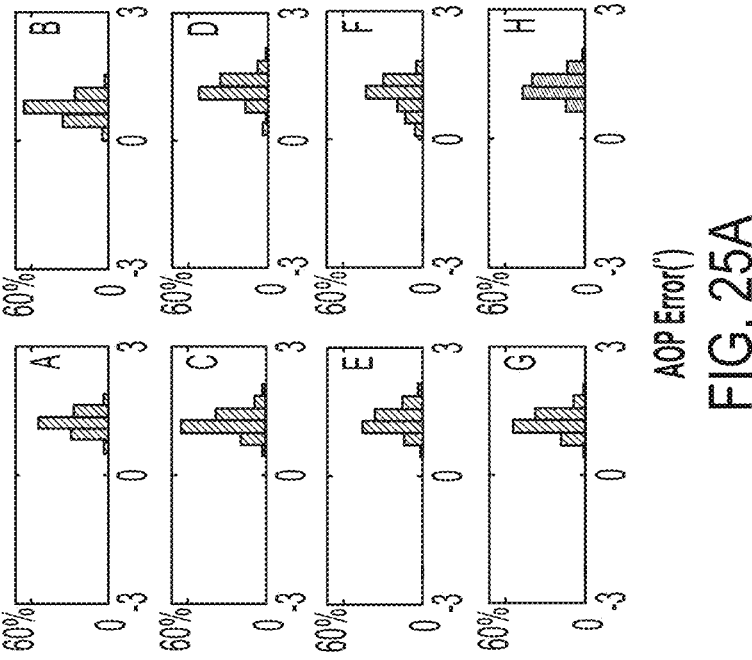
Figure 25C:
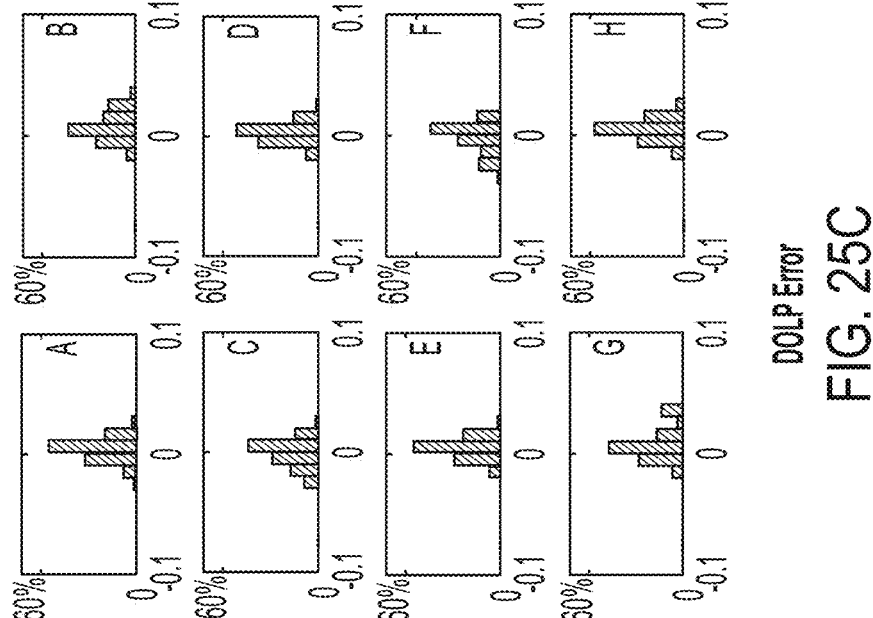

FIG. 25A, FIG. 25B, and FIG. 25C show AOP, DOCP, DOLP measurement error distribution of MPFA under band-pass filter 530 nm-570 nm (green) input according to examples of the present disclosure. A to F indicates polarization states as listed in Table 9.

Figure 26B:
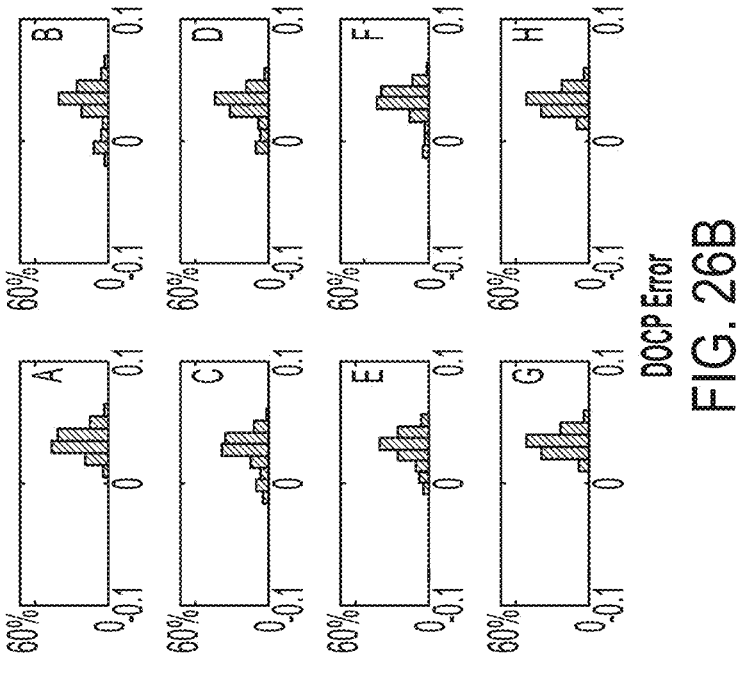
FIG. 26A, FIG. 26B, and FIG. 26C show AOP, DOCP, DOLP measurement error distribution of MPFA under bandpass filter 580 nm-620 nm (red light) input according to examples of the present disclosure.
Figure 26A:
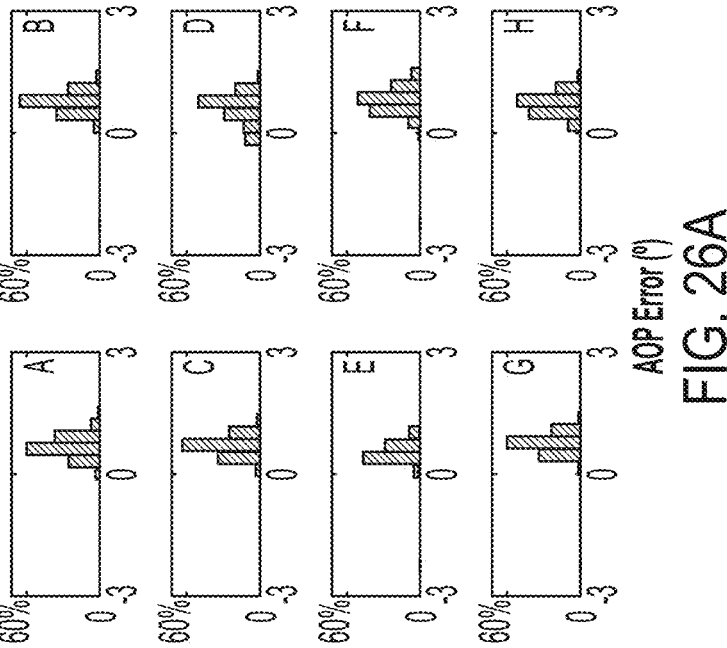
Figure 26C:
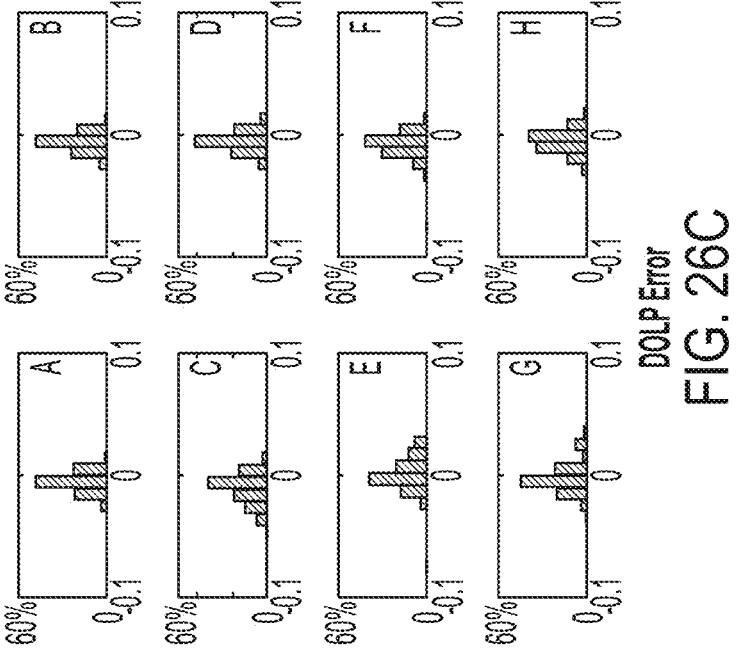

FIG. 26A, FIG. 26B, and FIG. 26C show AOP, DOCP, DOLP measurement error distribution of MPFA under band-pass filter 580 nm-620 nm (red light) input according to examples of the present disclosure. A to F indicates polarization states as listed in Table 10.

S5. Full Stokes Polarimetric Imaging at Red, Green, Blue

Figure 27A:
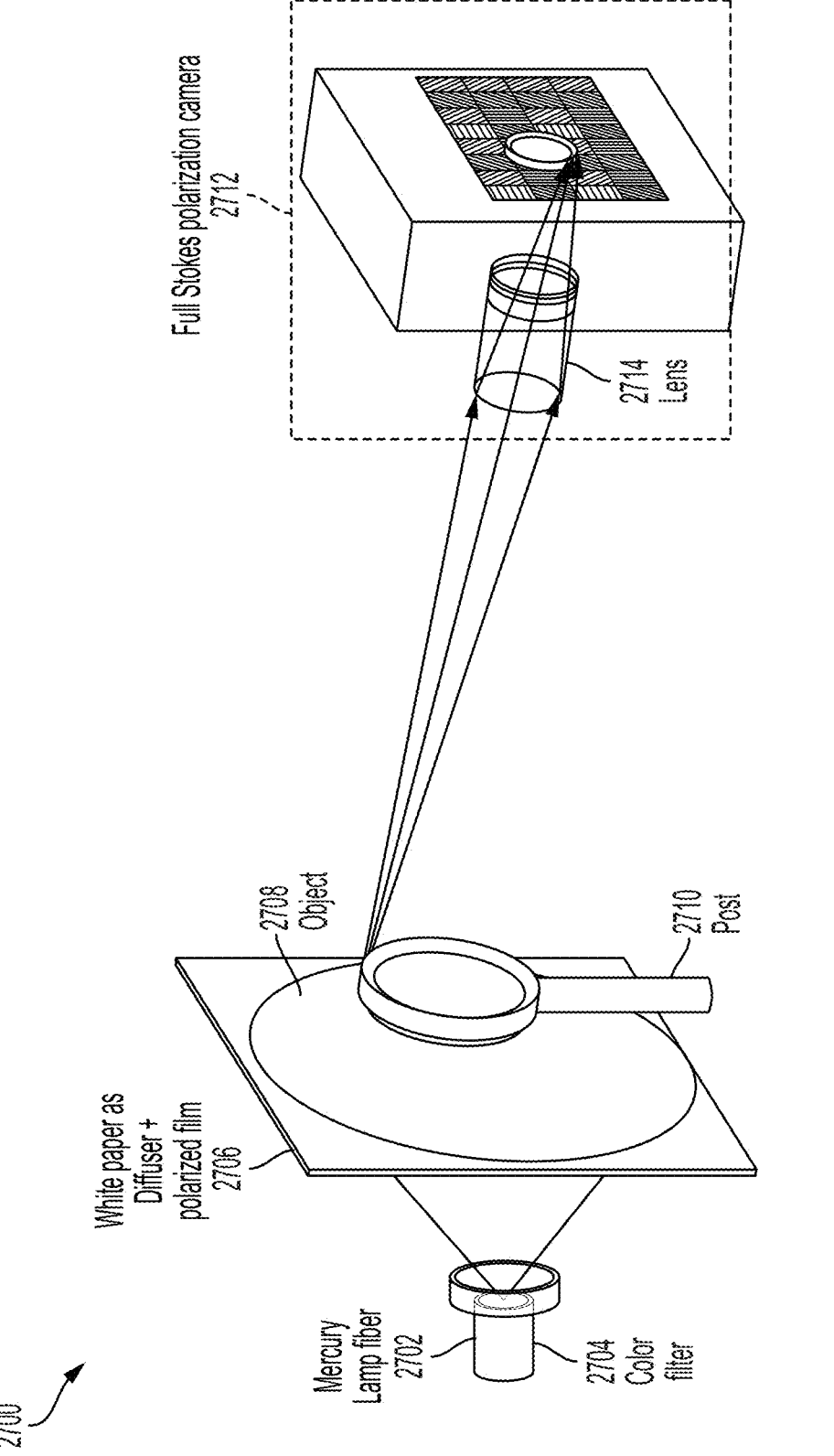
FIG. 27A and FIG. 27B show illustration of optical setup for full Stokes polarization imaging according to examples of the present disclosure, where
Figure 27B:
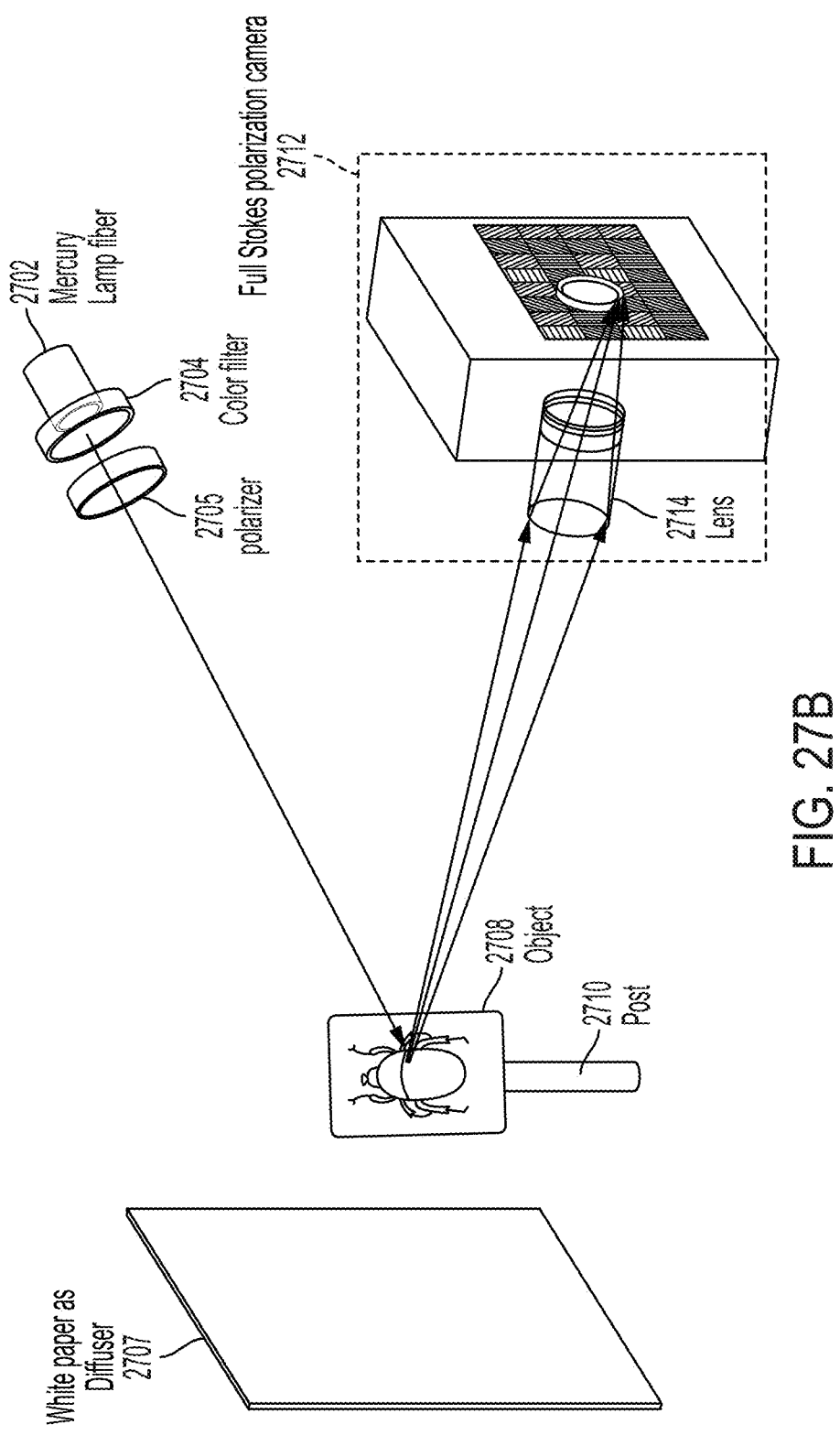

FIG. 27A and FIG. 27B show illustration of optical setup 2700, 2750 for full Stokes polarization imaging according to examples of the present disclosure, where FIG. 27A shows a transmission mode optical setup 2700 and FIG. 27B shows reflection mode optical setup 2700. As shown in FIG. 27A, a light source 2702, such as a mercury lamp fiber, produces optical radiation that is directed through a color filter 2704, which is then directed onto a first side of a diffuser/polarizer film 2706, such as a white paper that functions as a diffuser and polarizer. An object 2708 is mounted on a post 2710, such that the object 2708 is positioned about the center of a second side that is opposite the first side of the diffuser/polarizer film 2706. A full Stokes polarization camera 2712 captures the optical radiation that is transmitted through the diffuser/polarizer film 2706 that is scattered, reflected, and/or refracted by the object 2708 and focused by lens 2714.

As shown in FIG. 27B, the light source 2702, such as a mercury lamp fiber, produces optical radiation that is directed through the color filter 2704 and a polarizer 2705. The object 2708 is mounted on a post 2710. The object 2708 is positioned in front of and about the center of a diffuser 2707, such as a white paper. A full Stokes polarization camera 2712 captures the optical radiation that is scattered and/or reflected by the object 2708 and focused by lens 2714.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

What is claimed is:

1. A method of fabricating polarimetric metastructures, the method comprising:

performing a first nanoimprint lithography step to produce metasurface structures;

determining structural parameters of vertically coupled double-layer metallic gratings, wherein the structural parameters comprise a grating period (p), a grating height (h), a metal thickness (t), and a gap (g) for targeted polarimetric performance;

determining a dielectric spacer thickness (d);

performing a second nanoimprint lithography step to create a scaffold of the vertically coupled double-layer metallic gratings on top of a fabricated metasurface structure; and depositing metal on vertically coupled double-layer metallic gratings resist polymer with a designed thickness (t).

2. The method of claim 1, further comprising depositing a resist layer onto a top layer of a substrate; applying a mold with grating morphology on at least a portion of the resist layer; applying pressure on the mold; applying heat or light radiation while the mold is held onto the resist layer.

* * * * *